(12) United States Patent
Jeong et al.

(10) Patent No.: US 10,629,582 B2
(45) Date of Patent: Apr. 21, 2020

(54) SEMICONDUCTOR DEVICE AND METHOD FOR MANUFACTURING THE SAME

(71) Applicant: SAMSUNG ELECTRONICS CO., LTD., Suwon-si, Gyeonggi-do (KR)

(72) Inventors: Lakgyo Jeong, Ansan-si (KR); Seolun Yang, Hwaseong-si (KR); Yongrae Cho, Anyang-si (KR); Hee Bum Hong, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/935,549

(22) Filed: Mar. 26, 2018

(65) Prior Publication Data
US 2019/0067265 A1 Feb. 28, 2019

(30) Foreign Application Priority Data
Aug. 22, 2017 (KR) .................. 10-2017-0106194

(51) Int. Cl.
| | |
|---|---|
| *H01L 23/367* | (2006.01) |
| *H01L 27/02* | (2006.01) |
| *H01L 27/11* | (2006.01) |
| *H01L 23/528* | (2006.01) |
| *H01L 21/768* | (2006.01) |
| *H01L 23/522* | (2006.01) |
| *H01L 21/8238* | (2006.01) |

(Continued)

(52) U.S. Cl.
CPC ...... *H01L 27/0207* (2013.01); *H01L 21/0274* (2013.01); *H01L 21/76816* (2013.01); *H01L 21/76877* (2013.01); *H01L 21/823871* (2013.01); *H01L 23/5226* (2013.01); *H01L 23/5283* (2013.01); *H01L 27/1104* (2013.01); *H01L 27/1116* (2013.01); *H01L 21/823807* (2013.01); *H01L 23/5286* (2013.01); *H01L 27/092* (2013.01)

(58) Field of Classification Search
CPC ............. H01L 23/5283; H01L 27/0207; H01L 23/5226
See application file for complete search history.

(56) References Cited

U.S. PATENT DOCUMENTS

| | | |
|---|---|---|
| 9,105,643 B2 | 8/2015 | Kim et al. |
| 9,183,341 B2 | 11/2015 | Chen et al. |

(Continued)

*Primary Examiner* — Walter H Swanson
(74) *Attorney, Agent, or Firm* — Lee IP Law, P.C.

(57) ABSTRACT

A semiconductor device includes a substrate including a first region and a second region, memory transistors on the first region, a first interconnection layer on the memory transistors and including first interconnection lines, and a second interconnection layer on the first interconnection layer and including second interconnection lines. The second interconnection lines on the first region include a first line extending along a first direction and spaced from the second region by a first distance along the first direction, and a second line extending along the first direction, spaced from the first line along a second direction intersecting the first direction, and having a width smaller than that of the first line. The first line includes a protrusion extending along a third direction toward the substrate. The protrusion is spaced from the second region by a second distance along the first direction greater than the first distance.

18 Claims, 52 Drawing Sheets

(51) Int. Cl.
*H01L 21/027* (2006.01)
*H01L 27/092* (2006.01)

(56) References Cited

U.S. PATENT DOCUMENTS

| | | |
|---|---|---|
| 9,530,727 B2 | 12/2016 | Xiao et al. |
| 9,536,778 B2 | 1/2017 | Yuan et al. |
| 9,582,629 B2 | 2/2017 | Yuan et al. |
| 2004/0238892 A1* | 12/2004 | Jung ........................ H01L 21/84 257/350 |
| 2006/0138463 A1* | 6/2006 | Kim ........................ H01L 27/105 257/202 |
| 2008/0093653 A1* | 4/2008 | Park ........................ H01L 27/115 257/316 |
| 2009/0014796 A1* | 1/2009 | Liaw ........................ H01L 27/11 257/347 |
| 2013/0241027 A1* | 9/2013 | Kwak ................... H01L 29/0649 257/506 |
| 2014/0145342 A1 | 5/2014 | Schultz et al. |
| 2015/0340366 A1* | 11/2015 | Lim ........................ G11C 5/025 257/401 |
| 2016/0306914 A1 | 10/2016 | Kang et al. |
| 2017/0154817 A1* | 6/2017 | Moon ............... H01L 21/76816 |

\* cited by examiner

SEMICONDUCTOR DEVICE AND METHOD FOR MANUFACTURING THE SAME

CROSS-REFERENCE TO RELATED APPLICATION

Korean Patent Application No. 10-2017-0106194, filed on Aug. 22, 2017, in the Korean Intellectual Property Office, and entitled: "Semiconductor Device and Method for Manufacturing the Same," is incorporated by reference herein in its entirety.

BACKGROUND

1. Field

Embodiments relate to a semiconductor device and a method for manufacturing the same and, more particularly, to a semiconductor device including interconnection lines disposed on memory transistors of a substrate and a method for manufacturing the same.

2. Description of the Related Art

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices with excellent characteristics have been increasingly demanded with the development of the electronic industry. For example, high-reliable, high-speed, and/or multi-functional semiconductor devices have been increasingly demanded. To satisfy these demands, semiconductor devices have been highly integrated and structures of semiconductor devices have been more and more complicated.

SUMMARY

In an aspect, a semiconductor device may include a substrate including a first region and a second region, memory transistors on the first region, a first interconnection layer on the memory transistors and including first interconnection lines, and a second interconnection layer on the first interconnection layer and including second interconnection lines. The second interconnection lines on the first region include a first line extending along a first direction and spaced from the second region by a first distance along the first direction, and a second line extending along the first direction, spaced from the first line along a second direction intersecting the first direction, and having a width smaller along the second direction than a width of the first line. The first line may include a protrusion extending along a third direction, intersecting the first and second directions, toward the substrate. The protrusion may be spaced from the second region by a second distance along the first direction, the second distance being greater than the first distance.

In an aspect, a semiconductor device may include a substrate including a memory cell region and a logic cell region, memory transistors on the memory cell region, logic transistors on the logic cell region, and an interconnection layer including interconnection lines on the memory transistors and the logic transistors. The interconnection lines may include a word line on the memory transistors and extending in a first direction, and a conductive line on the logic transistors and extending in a second direction intersecting the first direction. The word line may include a protrusion extending toward the substrate, and a distance in the first direction between the conductive line and the word line may be smaller than a distance in the first direction between the conductive line and the protrusion.

In an aspect, a semiconductor device may include a memory cell on a substrate, an interlayer insulating layer on the memory cell, and an interconnection layer including interconnection lines provided in an upper portion of the interlayer insulating layer. The memory cell may include first and second access transistors, first and second pull-up transistors, and first and second pull-down transistors. The interconnection lines may include a first line, and a second line having a width smaller than a width of the first line. The first line may include a protrusion extending toward the substrate. A level of a bottom surface of the protrusion may be lower than a level of a bottom surface of the second line, and the level of the bottom surface of the protrusion may be higher than a level of a bottom surface of the interlayer insulating layer.

In an aspect, a method for manufacturing a semiconductor device may include forming memory transistors on a substrate, sequentially forming an interlayer insulating layer and a hard mask layer on the memory transistors, performing a first patterning process on the hard mask layer to form a first opening, performing a second patterning process on the hard mask layer to form a second opening, and performing a third patterning process on the hard mask layer to form a recess region in an upper portion of the interlayer insulating layer exposed by the second opening. The performing of the third patterning process may include forming a photoresist pattern having a third opening on the hard mask layer. The third opening of the photoresist pattern vertically may overlap with the second opening of the hard mask layer.

In an aspect, a method for manufacturing a semiconductor device, may include forming a first layout pattern on a substrate, the first layout pattern including, in a first region of the substrate, a first layout portion extending in a first direction, and, in a second region of the substrate a first layout portion extending in a second direction intersecting the first direction, forming a second layout pattern on the substrate, the second layout pattern including, in the first region of the substrate, a second layout portion extending in the first direction and spaced apart from the first layout portion in the first region along the second direction, and, in the second region of the substrate, a second layout portion extending in the second direction, forming a third layout pattern on the substrate, the third layout pattern including, in the first region of the substrate, a third layout portion extending in a third direction intersecting the first and second direction from the first layout portions in the first region, and, in the second region of the substrate, a third layout portion extending in the second direction and spaced from the first and second layout portions in the second region along the first direction. The third layout portion in the second region may be closer along the first direction to the first and second layout portions in the first region than to the third layout portion in the second region.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
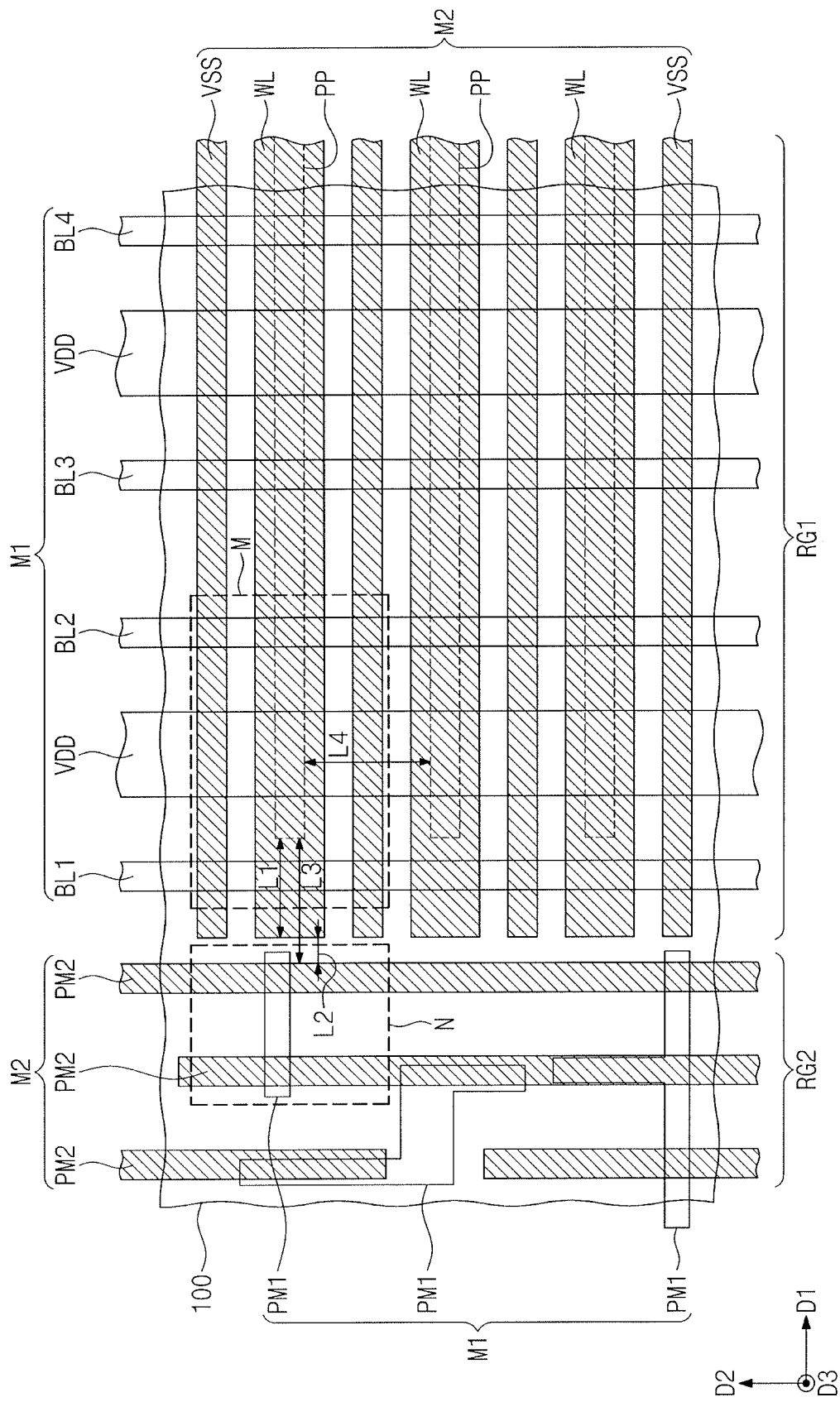
FIG. 1 illustrates a plan view of a semiconductor device according to some embodiments.
Figure 2:
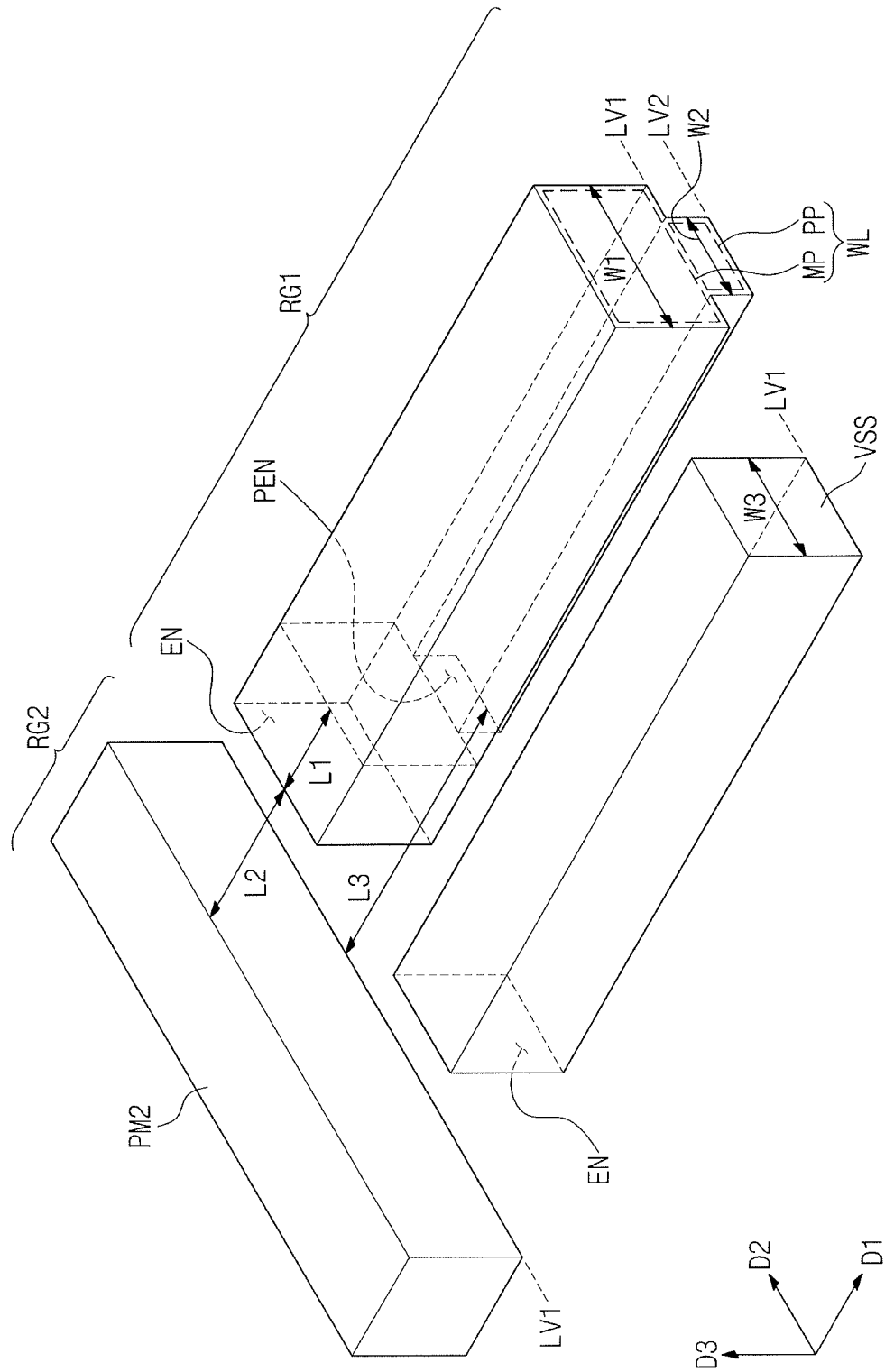
FIG. 2 illustrates a schematic perspective view of second interconnection lines of FIG. 1.

FIG. 1 is a plan view illustrating a semiconductor device according to some embodiments. FIG. 2 is a perspective view schematically illustrating second interconnection lines of FIG. 1.

Referring to FIGS. 1 and 2, a substrate 100 including a first region RG1 and a second region RG2 may be provided. The first and second regions RG1 and RG2 may be adjacent to each other. The first region RG1 may be a memory cell region. For example, memory transistors constituting a static random access memory (SRAM) cell may be disposed on the first region RG1 of the substrate 100. The memory transistors and the SRAM cell including them will be described later in more detail.

The second region RG2 may be a logic cell region on which logic transistors constituting a logic circuit of a semiconductor device are disposed. For example, the logic transistors constituting a processor core or an input/output (I/O) terminal may be disposed on the second region RG2 of the substrate 100. The logic transistors and a logic cell including them will be described later in more detail.

First interconnection lines M1 may be disposed on the transistors of the first and second regions RG1 and RG2. The first interconnection lines M1 may constitute a first interconnection layer. The first interconnection lines M1 on the first region RG1 may include bit lines BL1 to BL4 and power lines VDD. The bit lines BL1 to BL4 and the power lines VDD may extend in a second direction D2 in parallel to each other. A width of each of the power lines VDD may be greater than a width of each of the bit lines BL1 to BL4. For example, the bit lines BL1 to BL4 may include first to fourth bit lines BL1 to BL4.

The first interconnection lines M1 on the second region RG2 may include first conductive lines PM1. In some embodiments, at least one of the first conductive lines PM1 may extend in a first direction D1 intersecting the second direction D2. In certain embodiments, at least one of the first conductive lines PM1 may include a portion extending in the first direction D1 and a portion extending in the second direction D2. The first conductive line PM1 may have various shapes in accordance with a design for the second region RG2.

Second interconnection lines M2 may be disposed on the first interconnection layer including the first interconnection lines M1. The second interconnection lines M2 may constitute a second interconnection layer. The second interconnection lines M2 on the first region RG1 may include word lines WL and ground lines VSS. The word lines WL and the ground lines VSS may extend in the first direction D1 in parallel to each other. A width of each of the word lines WL may be greater than a width of each of the ground lines VSS.

The second interconnection lines M2 on the second region RG2 may include second conductive lines PM2. The second conductive lines PM2 may extend in the second direction D2 parallel to each other and spaced apart from each other along the first direction D1. The second conductive lines may have different lengths along the second direction D2 in accordance with a design for the second region RG2.

At least one of the second conductive lines PM2 may be adjacent to the word lines WL and the ground lines VSS of the first region RG1 in the first direction D1. In other words, the at least one of the second conductive lines PM2 may be adjacent to an end EN of at least one of the word lines WL. The at least one of the second conductive lines PM2 may be adjacent to an end EN of at least one of the ground lines VSS. For example, the first and second interconnection lines M1 and M2 may include at least one of a conductive metal nitride (e.g., titanium nitride or tantalum nitride) or a metal material (e.g., titanium, tantalum, tungsten, copper, or aluminum).

The word lines WL and the ground lines VSS on the first region RG1 may be alternately arranged in the second direction D2. The word lines WL and the ground lines VSS may be arranged at equal distances in the second direction D2. In other words, spacing between adjacent word lines WL and ground lines VSS along the second direction D2 may be the same.

FIG. 2 illustrates the second conductive line PM2, and the word line WL and the ground line VSS adjacent to the second conductive line PM2 in the first direction D1. A bottom surface of the second conductive line PM2 and a bottom surface of the ground line VSS may be disposed at a first level LV1 along a third direction D3. In the present specification, the term 'level' may mean a height along the third direction D3 from a top surface of the substrate 100. In other words, a height of the bottom surface of the second conductive line PM2 may be substantially the same as a height of the bottom surface of the ground line VSS.

The word line WL may include a body portion MP and a protrusion PP under the body portion MP. The protrusion PP may vertically extend from the body portion MP toward the substrate 100 along the third direction D3. The body portion MP may extend in the first direction D1, and the protrusion PP may also extend along the body portion MP in the first direction D1. The body portion MP may have a first width W1 in the second direction D2, and the protrusion PP may have a second width W2 in the second direction D2. The first width W1 may be greater than the second width W2. The ground line VSS may have a third width W3 in the second direction D2. The third width W3 may be substantially equal to the second width W2.

A sidewall of the word line WL may have a stepped profile at a boundary between the body portion MP and the protrusion PP. In other words, a width of the word line WL in the second direction D2 may be changed rapidly (discontinuously) at the boundary between the body portion MP and the protrusion PP.

A bottom surface of the protrusion PP of the word line WL may be disposed at a second level LV2. The second level LV2 may be lower than the first level LV1. A bottom surface of the body portion MP of the word line WL may be disposed at the first level LV1. In other words, a bottom surface of the word line WL may be lower along the third direction D3 than the bottom surface of the ground line VSS and the bottom surface of the second conductive line PM2, e.g., may be closer to the substrate 100.

An end PEN of the protrusion PP may be adjacent to the end EN of the word line WL. The end PEN of the protrusion PP may be spaced apart from the end EN of the word line WL by a first distance L1 in the first direction D1. In other words, a portion of the word line WL, which is adjacent to the end EN, may include only the body portion MP, but not the protrusion PP.

A distance in the first direction D1 between the second conductive line PM2 and the end EN of the word line WL may be defined as a second distance L2. A distance in the first direction D1 between the second conductive line PM2 and the end PEN of the protrusion PP may be defined as a third distance L3. The third distance L3 may be greater than the second distance L2.

Referring again to FIG. 1, a distance between the protrusions PP of the word lines WL adjacent to each other may be defined as a fourth distance L4. In some embodiments, the third distance L3 may be substantially equal to the fourth distance L4. In certain embodiments, the third distance L3 may be greater than the fourth distance L4.

Additional interconnection layers may be disposed on the second interconnection layer including the second interconnection lines M2 in the semiconductor device according to some embodiments.

Figure 3:
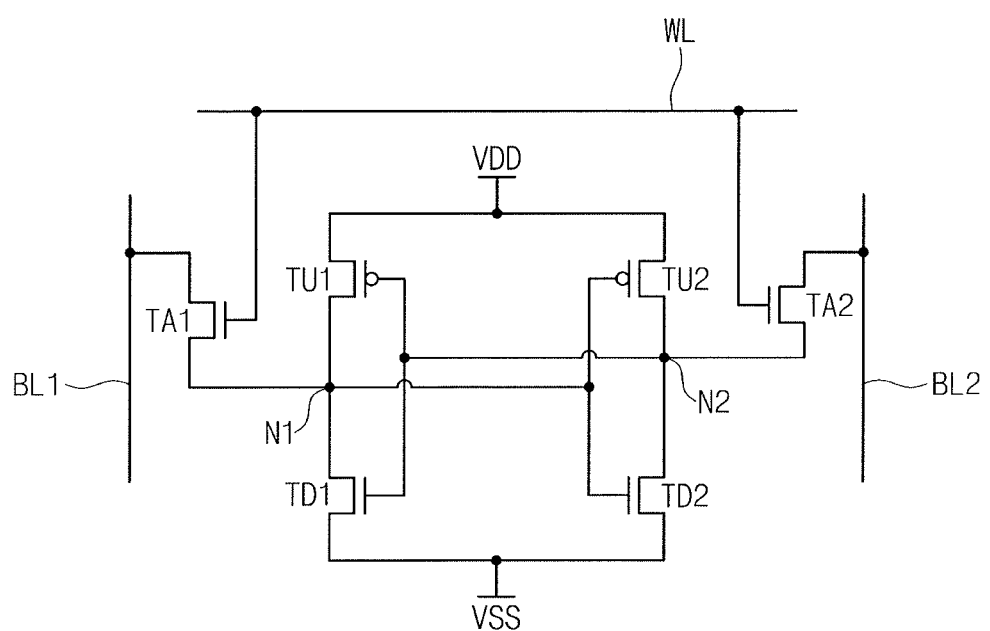
FIG. 3 illustrates an equivalent circuit diagram of a static random access memory (SRAM) cell according to some embodiments.

FIG. 3 is an equivalent circuit diagram of a static random access memory (SRAM) cell according to some embodiments. Referring to FIG. 3, the SRAM cell of the first region according to some embodiments may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line VDD. A second source/drain of the first pull-down transistor TD1 may be connected to a ground line VSS. A gate of the first pull-up transistor TU1 may be electrically connected to a gate of the first pull-down transistor TD1. The first pull-up transistor TU1 and the first pull-down transistor TD1 may constitute a first inverter. The gates, connected to each other, of the first pull-up and first pull-down transistors TU1 and TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD. A second source/drain of the second pull-down transistor TD2 may be connected to the ground line VSS. A gate of the second pull-up transistor TU2 may be electrically connected to a gate of the second pull-down transistor TD2. Thus, the second pull-up transistor TU2 and the second pull-down transistor TD2 may constitute a second inverter. The gates, connected to each other, of the second pull-up and second pull-down transistors TU2 and TD2 may correspond to an input terminal of the second inverter, and the second node N2 may correspond to an output terminal of the second inverter.

The first and second inverters may be connected to each other to constitute a latch structure. In other words, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically connected to a word line WL. Thus, the SRAM cell according to some embodiments may be realized.

Figure 4:
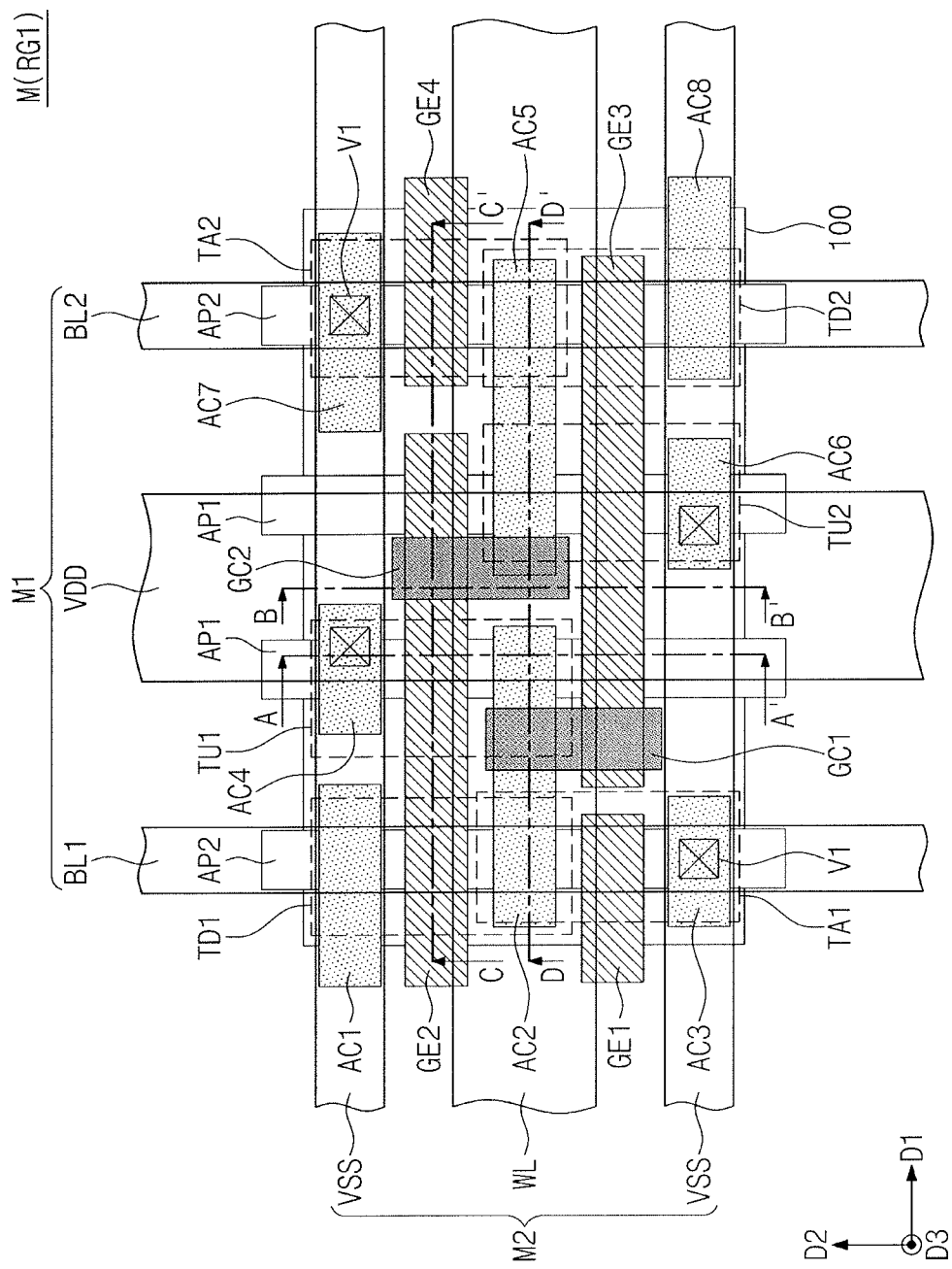
FIG. 4 illustrates an enlarged plan view of a region 'M' of FIG. 1 of a SRAM cell corresponding to the equivalent circuit diagram of FIG. 3.

FIG. 4 is an enlarged plan view of a region 'M' of FIG. 1 to illustrate a SRAM cell corresponding to the equivalent circuit diagram of FIG. 3. FIGS. 5A to 5D are cross-sectional views taken along lines A-A', B-B', C-C' and D-D' of FIG. 4, respectively.

Referring to FIGS. 1, 4, and 5A to 5D, at least one SRAM cell may be provided on the first region RG1 of the substrate 100. A device isolation layer ST may be provided on the substrate 100. The device isolation layer ST may define first and second active patterns AP1 and AP2. The substrate 100 may be a semiconductor substrate, e.g., a silicon, germanium, or silicon-germanium substrate, or a compound semiconductor substrate. The device isolation layer ST may include an insulating material, e.g., silicon oxide.

The first and second active patterns AP1 and AP2 may be portions of the substrate 100. A trench TR may be defined between the active patterns AP1 and AP2. The device isolation layer ST may fill the trench TR. Upper portions of the first and second active patterns AP1 and AP2 may vertically protrude from the device isolation layer ST. The upper portions of the first and second active patterns AP1 and AP2 may have fin-shapes vertically protruding from the device isolation layer ST.

First channels CH1 and first source/drain patterns SD1 may be provided in the upper portions of the first active patterns AP1. Second channels CH2 and second source/drain patterns SD2 may be provided in the upper portions of the second active patterns AP2. The first source/drain patterns SD1 may be P-type dopant regions. The second source/drain patterns SD2 may be N-type dopant regions. Each of the first channels CH1 may be disposed between a pair of the first source/drain patterns SD1. Each of the second channels CH2 may be disposed between a pair of the second source/drain patterns SD2.

The first and second source/drain patterns SD1 and SD2 may include epitaxial patterns formed by a selective epitaxial growth (SEG) process. Top surfaces of the first and second source/drain patterns SD1 and SD2 may be disposed at a higher level than top surfaces of the first and second channels CH1 and CH2 along the third direction D3. In other words, top surfaces of the first and second source/drain patterns SD1 and SD2 may be further from the substrate 100 along the third direction D3 than top surfaces of the first and second channels CH1 and CH2 along the third direction D3.

Each of the first and second source/drain patterns SD1 and SD2 may include a semiconductor element that is the same as or different from that of the substrate 100. In some embodiments, the first source/drain patterns SD1 may include a semiconductor element having a lattice constant greater than that of the substrate 100. Thus, the first source/drain patterns SD1 may provide compressive stress to the first channels CH1. In some embodiments, the second source/drain patterns SD2 may include the same semiconductor element as the substrate 100.

First to fourth gate electrodes GE1 to GE4 extending in the first direction D1 may be provided to intersect the first and second active patterns AP1 and AP2. The first to fourth gate electrodes GE1 to GE4 may vertically overlap the first and second channels CH1 and CH2. The first to fourth gate electrodes GE1 to GE4 may include at least one of a conductive metal nitride (e.g., titanium nitride or tantalum nitride) or a metal material (e.g., titanium, tantalum, tungsten, copper, or aluminum).

The second gate electrode GE2 and the fourth gate electrode GE4 may be aligned with each other in a line in the first direction D1. In other words, the second gate electrode GE2 and the fourth gate electrode GE4 may be spaced apart along the first direction D1 and may have a same width along the second direction D2 and a same height along the third direction D3. An insulating pattern SP (FIG. 5C) may be disposed between the second gate electrode GE2 and the fourth gate electrode GE4 to isolate the second and fourth gate electrodes GE2 and GE4 from each other.

Similarly, the first gate electrode GE1 and the third gate electrode GE3 may be aligned with each other in a line in the first direction D1. The insulating pattern SP may be disposed between the first gate electrode GE1 and the third gate electrode GE3 to isolate the first and third gate electrodes GE1 and GE3 from each other.

A pair of gate spacers GS may be disposed on both sidewalls of each of the first to fourth gate electrodes GE1 to GE4. The gate spacers GS may extend along the gate electrodes GE1 to GE4 in the third direction D3. Top surfaces of the gate spacers GS may be higher than top surfaces of the first to fourth gate electrodes GE1 to GE4, e.g., may be further from the substrate 100 along the third direction D3. The top surfaces of the gate spacers GS may be coplanar with a top surface of a first interlayer insulating layer 110 to be described later.

The gate spacers GS may include at least one of $SiO_2$, SiCN, SiCON, or SiN. In certain embodiments, each of the gate spacers GS may have a multi-layered structure formed of at least two of $SiO_2$, SiCN, SiCON, or SiN.

Figure 5A:
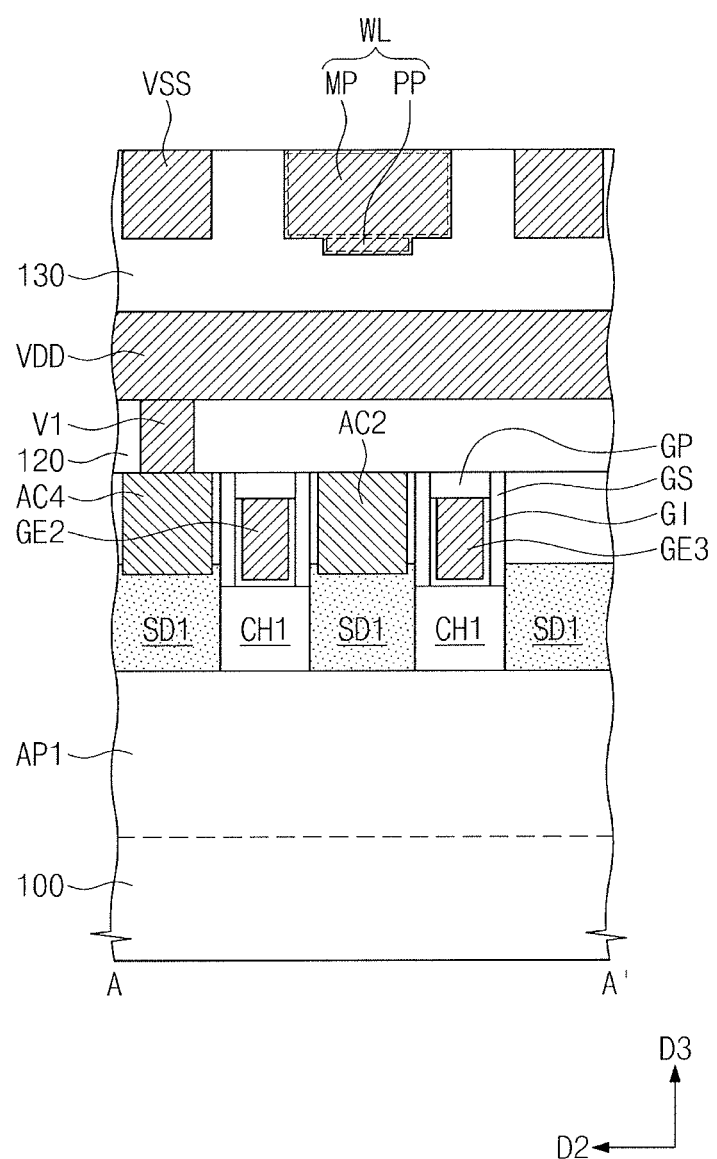
FIGS. 5A to 5D illustrate cross-sectional views taken along lines A-A', B-B', C-C' and D-D' of FIG. 4, respectively.
Figure 5B:
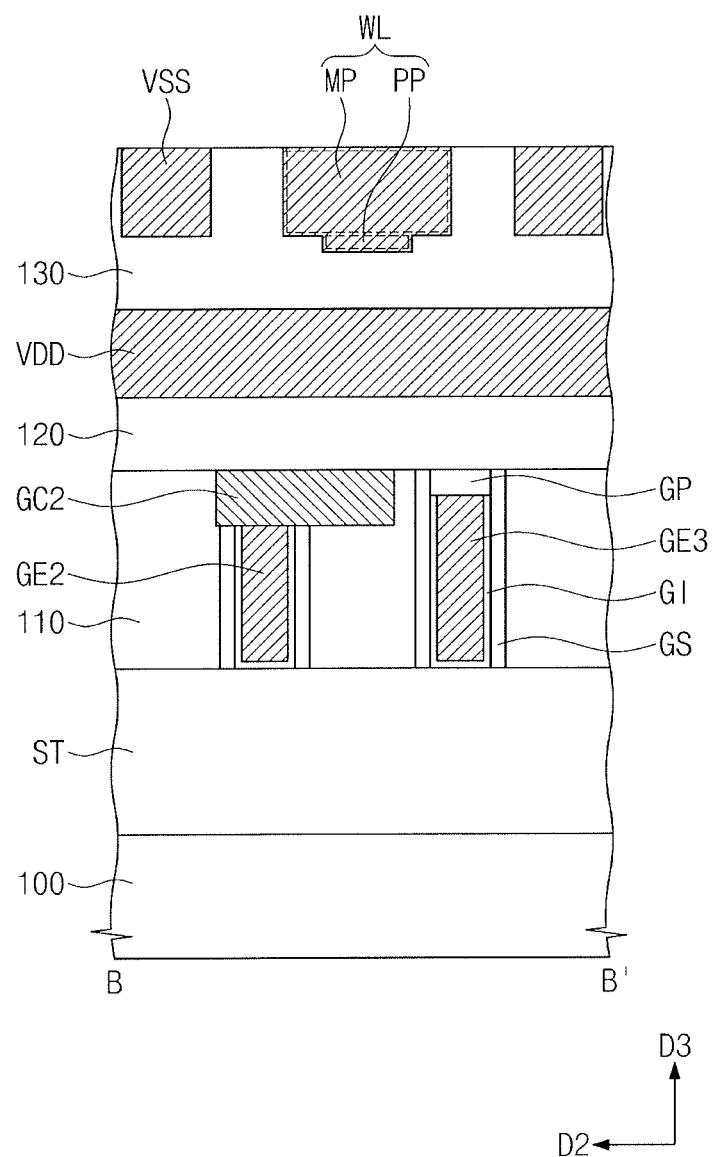
Figure 5C:
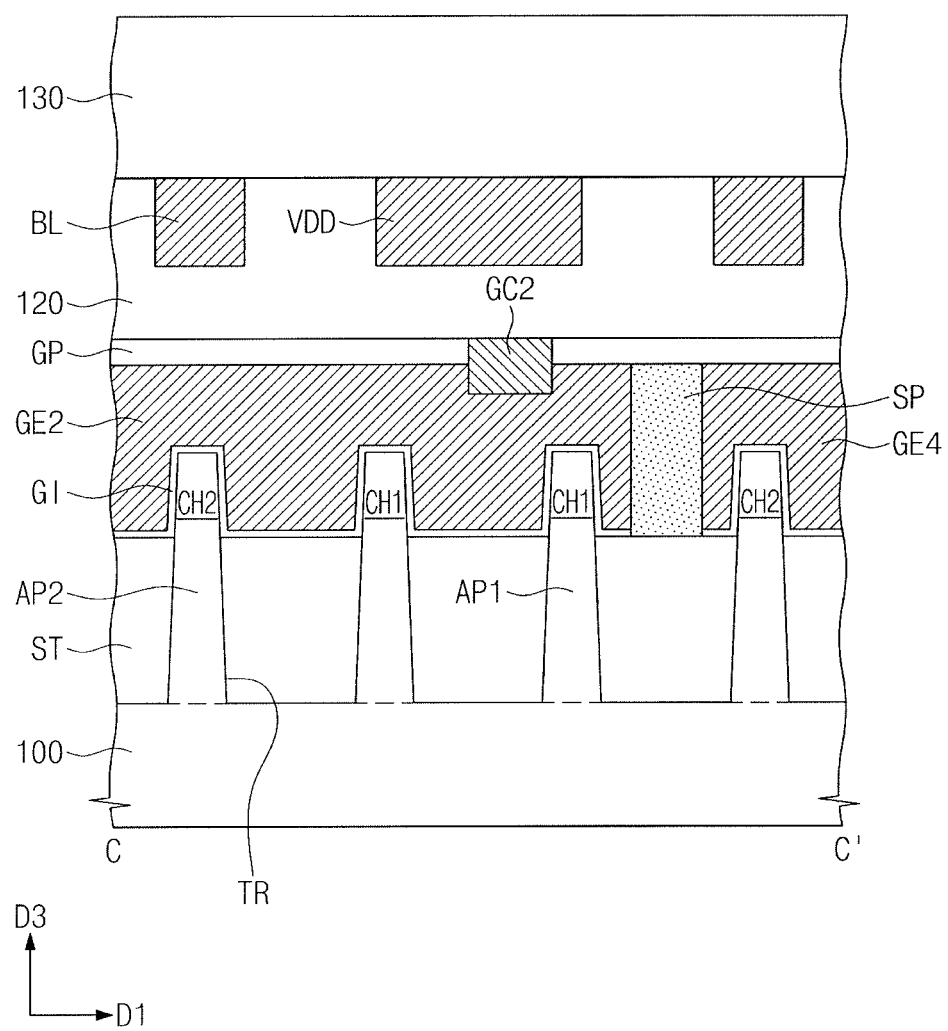
Figure 5D:
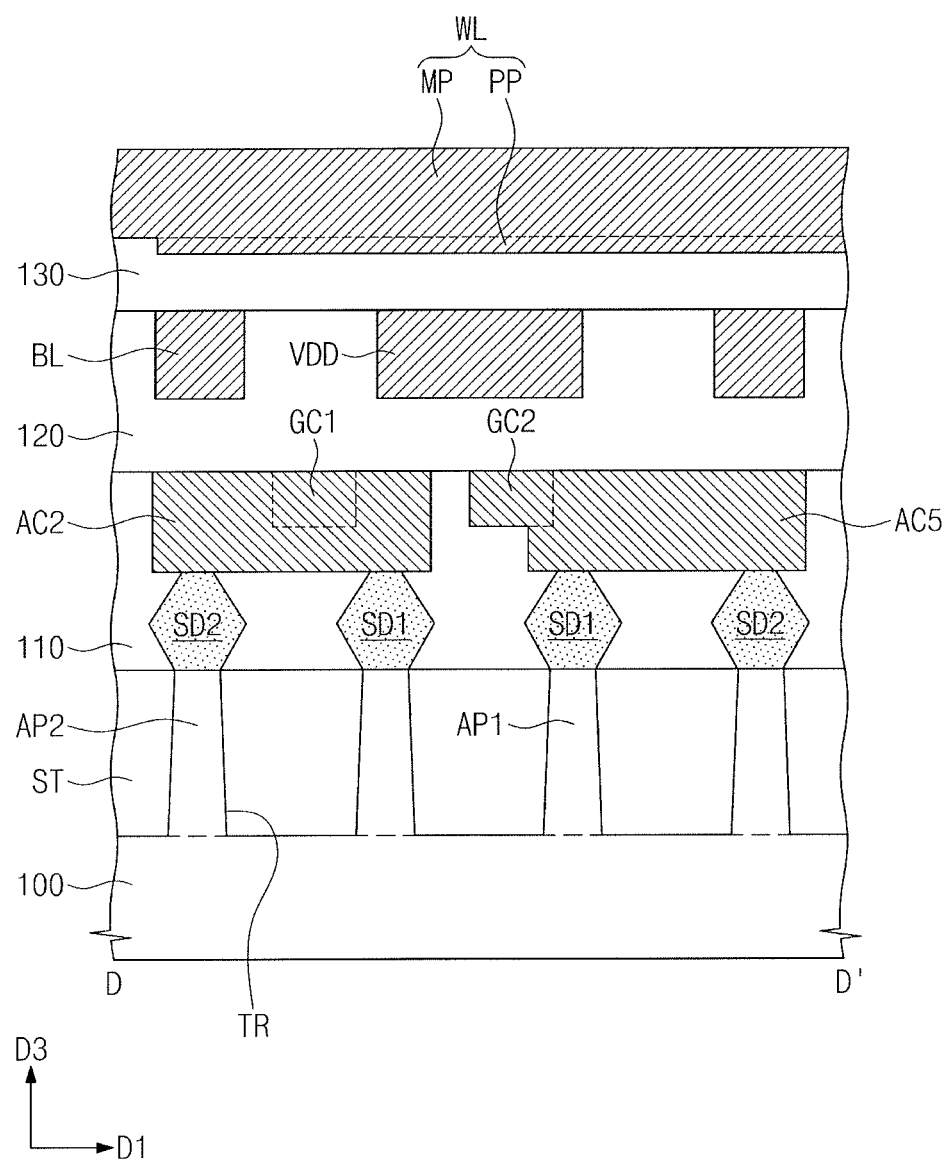

Gate dielectric patterns GI may be disposed between the gate electrodes GE1 to GE4 and the active patterns AP1 and AP2. Each of the gate dielectric patterns GI may extend along a bottom surface of each of the first to fourth gate electrodes GE1 to GE4. Each of the gate dielectric patterns GI may cover a top surface and cover both sidewalls of each of the first and second channels CH1 and CH2, e.g., partially cover both sidewalls of the first and second active patterns AP1 and AP2. In particular the gate dielectric patterns GI may separate the gate electrodes GE1 to GE4 from the first and second channels CH1 and CH2 and the device isolation layer ST (FIG. 5C).

The gate dielectric patterns GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate capping pattern GP may be provided on each of the first to fourth gate electrodes GE1 to GE4. The gate capping patterns GP may extend along the first to fourth gate electrodes GE1 to GE4 in the first direction D1 and may cover the insulating pattern SP (FIG. 5C). The gate capping pattern GP may be disposed between the pair of gate spacers GS associated with each of the of the first to fourth gate electrodes GE1 to GE4. In particular, the gate capping pattern GP may extend along the second direction D2 between the pair of gate spacers GS associated with each of the of the first to fourth gate electrodes GE1 to GE4, such that a bottom surface of the gate capping pattern GP covers a top surface of the gate electrodes GE1 to GE4 and the gate dielectric pattern between the gate spacers GS along the second direction. The gate capping pattern GP may extend along the third direction D3 such that a top surface thereof is level or coplanar with a top surface of the first insulating layer 110 and the top surfaces of the gate spacers GS.

The gate capping patterns GP may include a material having an etch selectivity with respect to first to third interlayer insulating layers 110, 120 and 130 to be described later. For example, the gate capping patterns GP may include at least one of SiON, SiCN, SiCON, or SiN.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS.

In addition, first to eighth active contacts AC1 to AC8 may be provided at sides of the first to fourth gate electrodes GE1 to GE4. The first to eighth active contacts AC1 to AC8 may penetrate an upper portion of the first interlayer insulating layer 110 so as to be connected to the first and second source/drain patterns SD1 and SD2, e.g., may extend along the third direction into the first interlayer insulating layer 110 towards the substrate 100. Top surfaces of the first to eighth active contacts AC1 to AC8 may be coplanar with the top surface of the first interlayer insulating layer 110. The first to eighth active contacts AC1 to AC8 may include at least one of a conductive metal nitride (e.g., titanium nitride or tantalum nitride) or a metal material (e.g., titanium, tantalum, tungsten, copper, or aluminum).

A first gate contact GC1 may be provided on the third gate electrode GE3 and a second gate contact GC2 may be provided on the second gate electrode GE2. The first and second gate contacts GC1 and GC2 may penetrate the upper portion of the first interlayer insulating layer 110, the gate spacers GS and the gate capping patterns GP, e.g., along the third direction D3 towards the substrate 100, so as to be connected to the third and second gate electrodes GE3 and GE2, respectively. Top surfaces of the first and second gate contacts GC1 and GC2 may be coplanar with the top surface of the first interlayer insulating layer 110. Bottom surfaces of the first and second gate contacts GC1 and GC2 may be higher than bottom surfaces of the first to eighth active contacts AC1 to AC8, e.g., bottom surfaces of the first to eighth active contacts AC1 to AC8 may be at a same level and may be closer to the substrate 100 than bottom surfaces of the first and second gate contacts GC1 and GC2.

The first and second gate contacts GC1 and GC2 may include at least one of a conductive metal nitride (e.g., titanium nitride or tantalum nitride) or a metal material (e.g., titanium, tantalum, tungsten, copper, or aluminum). The first and second gate contacts GC1 and GC2 may include the same material as the first to eighth active contacts AC1 to AC8. In other words, the first gate contact GC1 may be integrally connected to the second active contact AC2 to constitute a single conductive structure. The second gate contact GC2 may be integrally connected to the fifth active contact AC5 to constitute a single conductive structure.

A second interlayer insulating layer 120 may be provided on the first interlayer insulating layer 110. A third interlayer insulating layer 130 may be provided on the second interlayer insulating layer 120. For example, each of the first to third interlayer insulating layers 110, 120 and 130 may include a silicon oxide layer.

The first interconnection lines M1 constituting the first interconnection layer may be disposed in the second interlayer insulating layer 120. The first interconnection lines M1 may include the first and second bit lines BL1 and BL2 and the power line VDD, which extend in the second direction D2. First vias V1 may be disposed in a lower portion of the second interlayer insulating layer 120. The first vias V1 may electrically connect the first and second bit lines BL1 and BL2 and the power line VDD to the third, fourth, sixth and seventh active contacts AC3, AC4, AC6 and AC7. In some embodiments, each of the first vias V1 may be integrally connected to a corresponding one of the first and second bit lines BL1 and BL2 and the power line VDD as a single unitary body.

The second interconnection lines M2 constituting the second interconnection layer may be disposed in the third interlayer insulating layer 130. The second interconnection lines M2 may include the word line WL and the ground lines, which extend in the first direction D1. Second vias may be disposed in a lower portion of the third interlayer insulating layer 130.

The word line WL may include the body portion MP and the protrusion PP, as described with reference to FIG. 2. The bottom surface of the protrusion PP may be lower than the bottom surfaces of the ground lines VSS, e.g., may be closer to the substrate 100 along the third direction D3. The protrusion PP may be vertically spaced apart from the first interconnection lines M1 with the third interlayer insulating layer 130 interposed therebetween along the third direction D3. In other words, the bottom surface of the protrusion PP may be higher than top surfaces of the first interconnection lines M1 along the third direction D3.

The second vias may electrically connect the second interconnection lines M2 to the first interconnection lines M1. In some embodiments, each of the second vias may be integrally connected to a corresponding one of the word line WL and the ground lines VSS to constitute a single conductive structure.

The first and second active patterns AP1 and AP2 and the first to fourth gate electrodes GE1 to GE4 may constitute the memory transistors. The memory transistors of FIG. 4 may include the first pull-up transistor TU1, the first pull-down transistor TD1, the second pull-up transistor TU2, the second pull-down transistor TD2, the first access transistor TA1, and the second access transistor TA2, described above with reference to FIG. 3.

The first gate electrode GE1 may correspond to the gate of the first access transistor TA1. The first gate electrode GE1 may be electrically connected to the word line WL. The second gate electrode GE2 may correspond to a common gate of the first pull-up and first pull-down transistors TU1 and TD1. The third gate electrode GE3 may correspond to a common gate of the second pull-up and second pull-down transistors TU2 and TD2. The fourth gate electrode GE4 may correspond to the gate of the second access transistor TA2. The fourth gate electrode GE4 may be electrically connected to the word line WL.

The first active contact AC1 may be electrically connected to the second source/drain of the first pull-down transistor TD1. The first active contact AC1 may be electrically connected to one of the ground lines VSS.

The second active contact AC2 may be electrically connected to a common source/drain (i.e., the first source/drains) of the first pull-down transistor TD1 and the first access transistor TA1. The second active contact AC2 may extend in the first direction D1 so as to be electrically connected to the first source/drain of the first pull-up transistor TU1. The second active contact AC2 may correspond to the first node N1 of FIG. 3.

The third active contact AC3 may be electrically connected to the second source/drain of the first access transistor TA1. The third active contact AC3 may be electrically connected to the first bit line BL1 through one of the first vias V1.

The fourth active contact AC4 may be electrically connected to the second source/drain of the first pull-up transistor TU1. The fourth active contact AC4 may be electrically connected to the power line VDD through another of the first vias V1.

The fifth active contact AC5 may be electrically connected to the first source/drain of the second pull-up transistor TU2. The fifth active contact AC5 may extend in the first direction D1 so as to be electrically connected to a common source/drain (i.e., the first source/drains) of the second pull-down transistor TD2 and the second access transistor TA2. The fifth active contact AC5 may correspond to the second node N2 of FIG. 3.

The sixth active contact AC6 may be electrically connected to the second source/drain of the second pull-up transistor TU2. The sixth active contact AC6 may be electrically connected to the power line VDD through still another of the first vias V1.

The seventh active contact AC7 may be electrically connected to the second source/drain of the second access transistor TA2. The seventh active contact AC7 may be electrically connected to the second bit line BL2 through yet another of the first vias V1.

The eighth active contact AC8 may be electrically connected to the second source/drain of the second pull-down transistor TD2. The eighth active contact AC8 may be electrically connected to another of the ground lines VSS.

The first gate contact GC1 may electrically connect the second active contact AC2 to the third gate electrode GE3. In other words, the first gate contact GC1 may electrically connect the first node N1 of FIG. 3 to the common gate of the second pull-up and second pull-down transistors TU2 and TD2.

The second gate contact GC2 may electrically connect the fifth active contact AC5 to the second gate electrode GE2. In other words, the second gate contact GC2 may electrically connect the second node N2 of FIG. 3 to the common gate of the first pull-up and first pull-down transistors TU1 and TD1.

Figure 6:
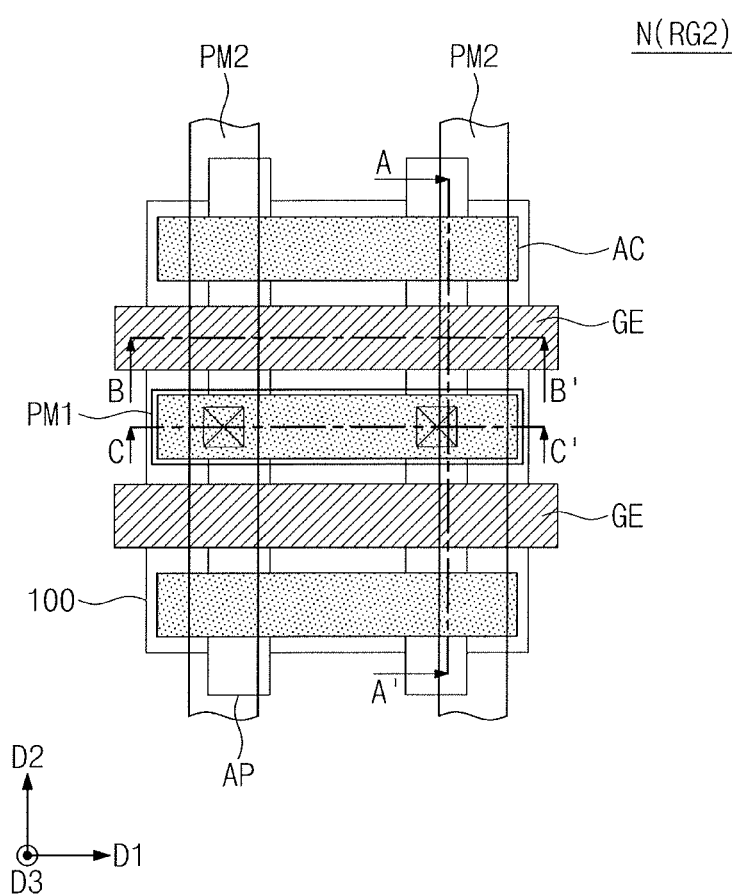
FIG. 6 illustrates an enlarged plan view of a region 'N' of FIG. 1 of a logic cell.
Figure 7A:
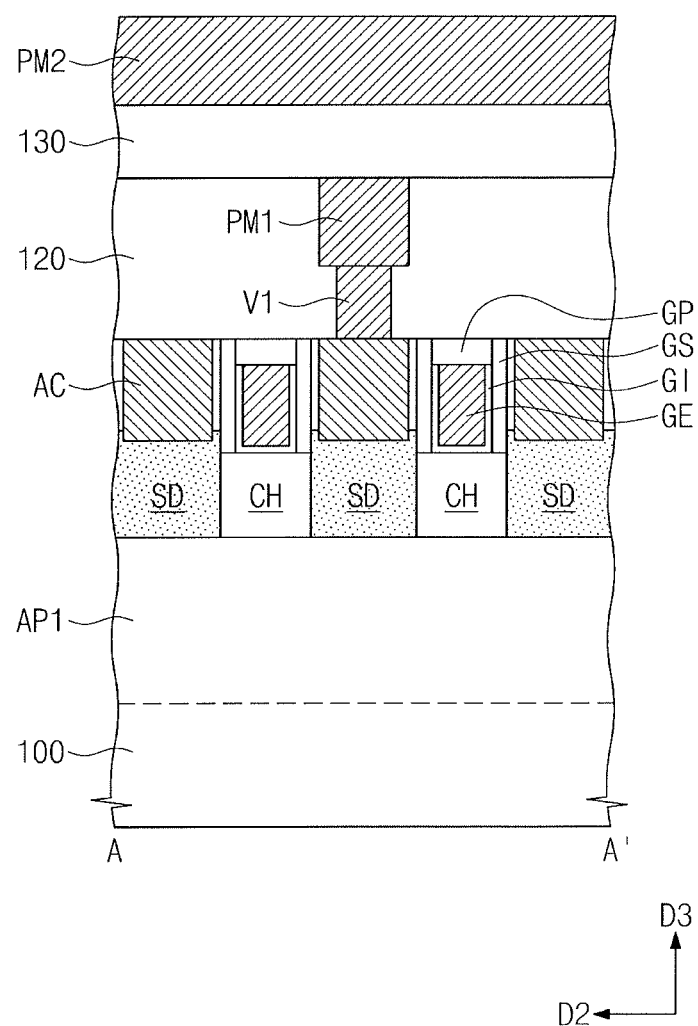
FIGS. 7A to 7C illustrate cross-sectional views taken along lines A-A', B-B' and C-C' of FIG. 6, respectively.
Figure 7B:
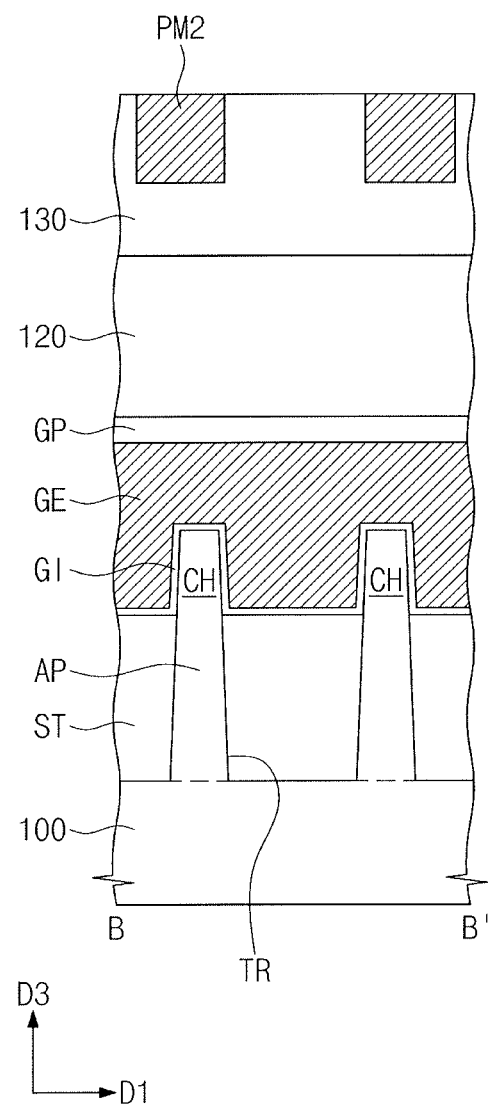
Figure 7C:
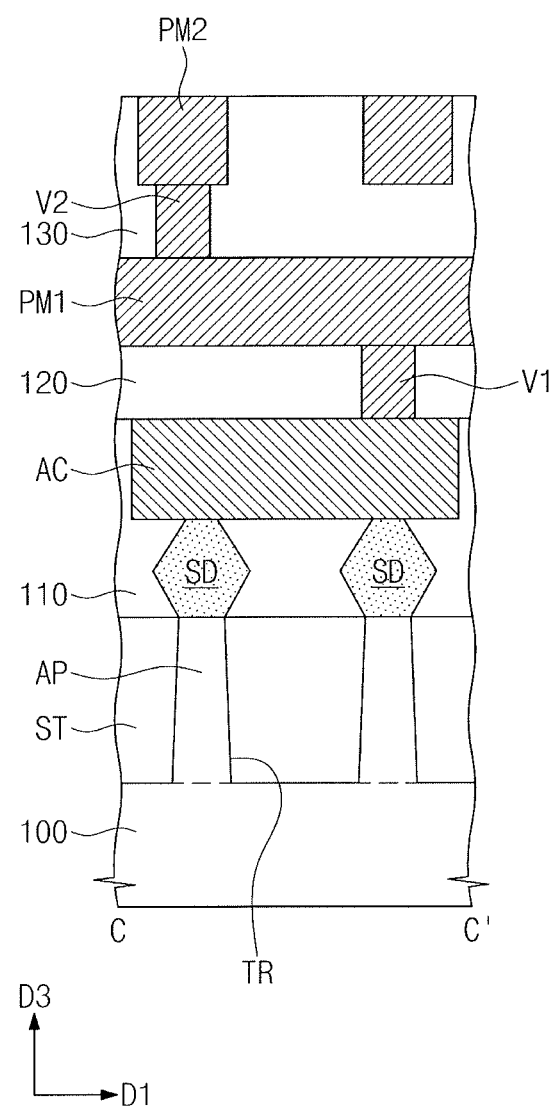

FIG. 6 is an enlarged plan view of a region 'N' of FIG. 1 to illustrate a logic cell. FIGS. 7A to 7C are cross-sectional views taken along lines A-A', B-B' and C-C' of FIG. 6, respectively. In the present embodiments, the descriptions to the same technical features as in the embodiments of FIGS. 1, 4 and 5A to 5D will be omitted for the purpose of ease and convenience in explanation. In other words, differences between the present embodiments and the embodiments of FIGS. 1, 4 and 5A to 5D will be mainly described hereinafter.

Referring to FIGS. 1, 6, and 7A to 7C, at least one logic cell may be provided on the second region RG2 of the substrate 100. The device isolation layer ST may also be provided on the substrate 100 of the second region RG2 to define active patterns AP. A trench TR may be defined between the active patterns AP, and the device isolation layer ST may fill the trench TR. Channels CH and source/drain patterns SD may be provided in an upper portion of each of the active patterns AP. Each of the channels CH may be disposed between a pair of the source/drain patterns SD.

Gate electrodes GE may be provided on the active patterns AP. The gate electrodes GE may extend in the first direction D1 to intersect the active patterns AP. The pair of gate spacers GS may be disposed on both sidewalls of each of the gate electrodes GE, respectively. Gate dielectric patterns GI may be disposed between the gate electrodes GE and the active patterns AP. A gate capping pattern GP may be provided on each of the gate electrodes GE. The details of the configuration of the gate spacers GS, the gate dielectric patterns GI, and the gate capping pattern GP may be the same as described above in connection with the region 'M.'

In some embodiments, the active patterns AP and the gate electrodes GE may constitute PMOS transistors or NMOS transistors. In certain embodiments, one of the active patterns AP and the gate electrodes GE provided thereon may constitute PMOS transistors, and another of the active patterns AP and the gate electrodes GE provided thereon may constitute NMOS transistors.

Active contacts AC may be provided at both sides of and spaced apart from each of the gate electrodes GE along the second direction D2. The active contacts AC may penetrate the first interlayer insulating layer 110 covering the second region RG2 and may be connected to the source/drain patterns SD.

The first interconnection lines M1 constituting the first interconnection layer may be disposed in the second interlayer insulating layer 120. The first interconnection lines M1 may include the first conductive line PM1. In some embodiments, the first conductive line PM1 may be electrically connected to one of the active contacts AC through a first via V1 that extends from a bottom surface of the first conductive line PM1 through the second interlayer insulating layer 120 towards the substrate 100 to a top surface of the active contact AC.

The second interconnection lines M2 constituting the second interconnection layer may be disposed in the third interlayer insulating layer 130. The second interconnection lines M2 may include the second conductive lines PM2 extending in the second direction D2. In some embodiments, the second conductive line PM2 may be electrically connected to the first conductive line PM1 through a second via V2 that extends from a bottom surface of the second conductive line PM2 along the third direction D3 through the third interlayer insulating layer 130 towards the substrate 100 to a top surface of the first conductive line PM1.

Referring again to FIG. 1, at least one of the second conductive lines PM2 on the second region RG2 may be adjacent to the word lines WL and the ground lines VSS on the first region RG1 along the first direction D1.

Figure 8:
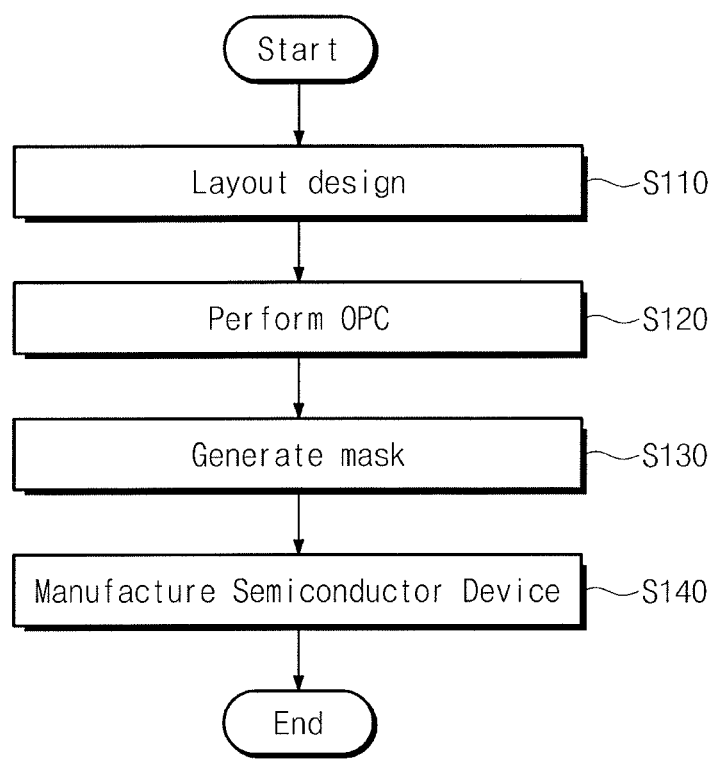
FIG. 8 illustrates a flowchart of a method for designing and manufacturing a semiconductor device, according to some embodiments.

FIG. 8 is a flowchart illustrating a method for designing and manufacturing a semiconductor device, according to some embodiments.

Referring to FIG. 8, a layout design process for realizing a semiconductor integrated circuit on a silicon substrate may be performed (S110, a first operation). The layout design process may include processes of placing and routing (e.g., connecting) various standard cells that are provided from a cell library based on a predetermined design rule.

The cell library for the layout design process may also include information on operations, speeds and power consumption of the standard cells. In certain embodiments, the cell library for representing a layout of a circuit having a specific gate level may be defined in most of layout design tools. The layout design process may define or describe shapes and/or sizes of patterns for constituting transistors and metal interconnection lines which will be actually formed on a silicon substrate. For example, layout patterns (e.g., PMOS, NMOS, N-WELL, gate electrodes, and metal interconnection lines to be disposed thereon) may be suitably placed to actually form an inverter circuit on a silicon substrate. For this, first, suitable ones of inverters defined in advance in the cell library may be searched and selected.

The routing process may be performed on the placed standard cells. In detail, the routing process may be performed on the placed standard cells to connect them to upper interconnection lines. By the routing process, the standard cells may be electrically connected to each other to meet a design. These processes may be automatically or manually performed by the layout design tool. In certain embodiments, the process of placing and routing the standard cells may be automatically performed by an additional place and routing tool.

After the routing process, a verification process may be performed on the layout to verify whether there is a portion violating the design rule. In some embodiments, the verification process may include various verification items, such as a design rule check (DRC) item, an electrical rule check (ERC) item, and a layout versus schematic (LVS) item. The DRC item may be performed to check whether the layout suitably meets the design rule. The ERC item may be performed to check whether there is an issue of electrical disconnection in the layout. The LVS item may be performed to check whether the layout is prepared to coincide with the gate-level netlist.

An optical proximity correction (OPC) process may be performed (S120, a second operation). The layout patterns obtained by the layout design process may be realized on a silicon substrate by using a photolithography process. The OPC process may be performed to correct an optical proximity effect which may occur in the photolithography process. The optical proximity effect may be an unintended optical effect (such as refraction or diffraction) which may occur in the photolithography process. In other words, a distortion phenomenon of layout patterns, which may be caused by the optical proximity effect, may be corrected by the OPC process. The shapes and positions of the designed layout patterns may be slightly modified or biased by the OPC process.

A photomask may be generated based on the layout modified or biased by the OPC process (S130, a third operation). In general, the photomask may be generated by patterning a chromium layer, deposited on a glass substrate, by using data of the modified or biased layout.

A semiconductor device may be manufactured using the generated photomask (S140, a fourth operation). The shapes of the patterns obtained by the layout design process may be sequentially formed on a silicon substrate by photolithography processes using the generated photomasks.

In some embodiments, the first interconnection lines M1 and the second interconnection lines M2 described with reference to FIGS. 1 and 2 may be formed through the first to fourth operations S110 to S140.

Figure 9:
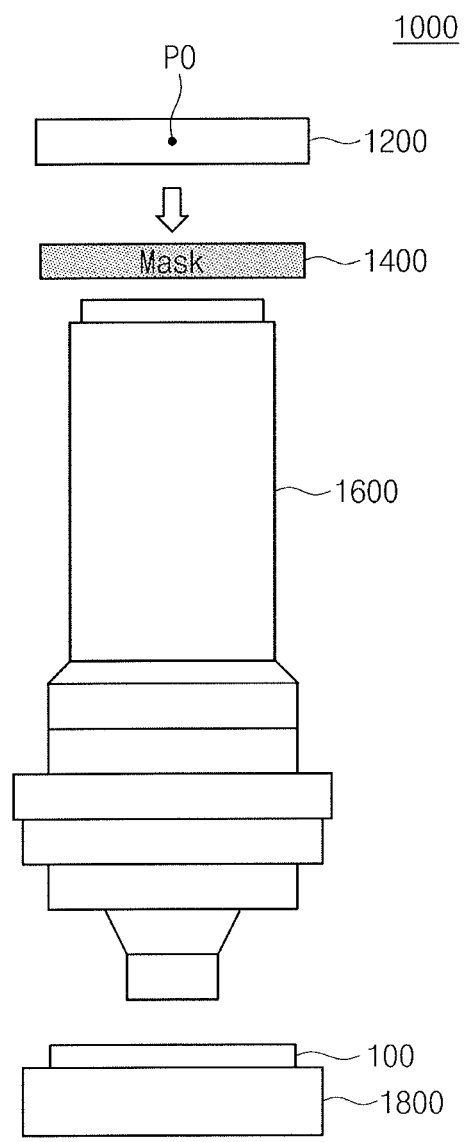
FIG. 9 illustrates a conceptual view of a photolithography system using a photomask manufactured according to some embodiments.

FIG. 9 is a conceptual view illustrating a photolithography system using a photomask manufactured according to some embodiments. Referring to FIG. 9, a photolithography system 1000 may include a light source 1200, a photomask 1400, a reduction projection unit 1600, and a substrate stage 1800.

The photomask 1400 may be generated or manufactured through the first to third operations S110, S120 and S130 described above with reference to FIG. 8. In more detail, a chromium layer deposited on a glass substrate may be patterned to form patterns corresponding to the layout patterns on the glass substrate, and thus the photomask 1400 may be generated. In addition, the photolithography system 1000 may further include additional components, e.g., a sensor used to measure a height and a gradient of a surface of a substrate 100 loaded on the substrate stage, and so forth.

The light source 1200 may emit light. The light emitted from the light source 1200 may be irradiated or provided to the photomask 1400. In some embodiments, a lens may be provided between the light source 1200 and the photomask 1400 to adjust a focus of the light. The light source 1200 may include an ultraviolet light source (e.g., a krypton fluoride (KrF) light source having a wavelength of 234 nm or an argon fluoride (ArF) light source having a wavelength of 193 nm). The light source 1200 may include a single point light source PO. However, embodiments are not limited thereto. In certain embodiments, the light source 1200 may include a plurality of point light sources.

To print (realize) the designed layout onto the substrate 100, the photomask 1400 may include image patterns. The image patterns may include a transparent region and an opaque region. The transparent region may be formed by etching a metal layer (e.g., the chromium layer) on the photomask 1400. The transparent region may transmit the light emitted from the light source 1200. On the other hand, the opaque region may not transmit the light but may block the light.

The reduction projection unit 1600 may receive the light transmitted through the transparent region of the photomask 1400. The reduction projection unit 1600 may match the layout patterns, to be printed onto the substrate 100, with the image patterns of the photomask 1400. The substrate stage 1800 may support the substrate 100. For example, the substrate 100 may be a silicon wafer.

The reduction projection unit 1600 may include an aperture. The aperture may be used to increase a depth of a focus of ultraviolet light emitted from the light source 1200. For example, the aperture may include a dipole aperture or a quadruple aperture. The reduction projection unit 1600 may further include a lens for adjusting a focus of light.

The transparent region included in the image patterns of the photomask 1400 may transmit the light emitted from the light source 1200. The light transmitted through the photomask 1400 may be irradiated to the substrate 100 through the reduction projection unit 1600. Thus, patterns corresponding to the image patterns of the photomask 1400 may be printed onto the substrate 100.

Figure 10:
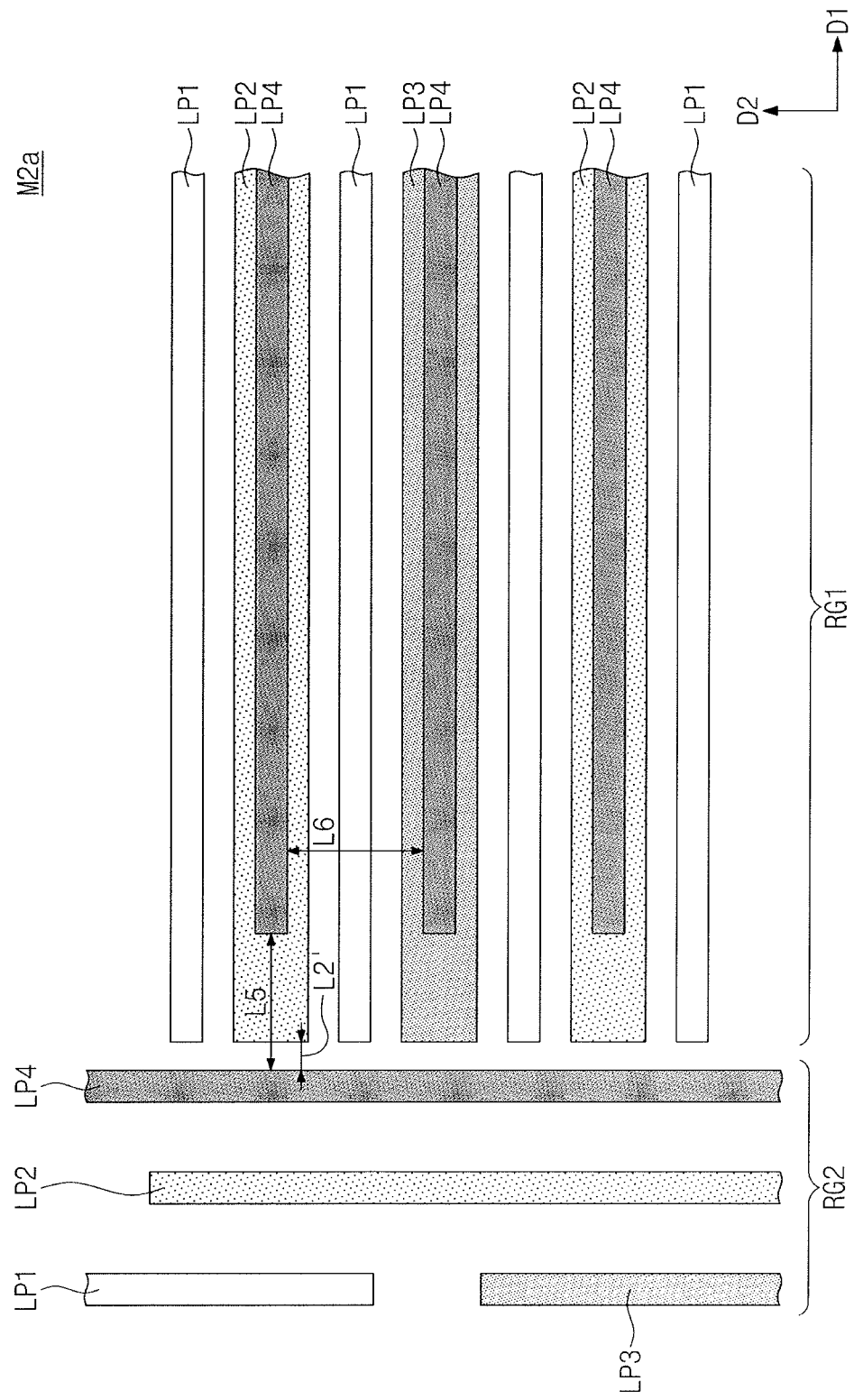
FIG. 10 illustrates a plan view of a layout defining second interconnection lines of a semiconductor device according to some embodiments.

FIG. 10 is a plan view illustrating a layout defining second interconnection lines (i.e., a second interconnection layer) of a semiconductor device according to some embodiments.

Referring to FIG. 10, a second interconnection layout M2a defining the second interconnection lines M2 of FIGS. 1 and 2 may be designed. The second interconnection layout M2a may include layout patterns LP1, LP2, LP3 and LP4. The layout patterns LP1, LP2, LP3 and LP4 may include first layout patterns LP1, second layout patterns LP2, third layout patterns LP3, and fourth layout patterns LP4.

A first photomask may be generated or manufactured based on the first layout patterns LP1; a second photomask may be generated or manufactured based on the second layout patterns LP2; a third photomask may be generated or manufactured based on the third layout patterns LP3; and a fourth photomask may be generated or manufactured based on the fourth layout patterns LP4. In other words, four photomasks may be generated separately from each other on the basis of the second interconnection layout M2a illustrated in FIG. 10. As described above with reference to FIG. 9, patterns may be defined or realized independently of each other on the substrate 100 by using the first to fourth photomasks.

On the first region RG1, the first layout patterns LP1 may be spaced apart from each other along the second direction D2 with the second or third layout pattern LP2 or LP3 interposed therebetween along the second direction D1, with the first to third layout patterns LP1, LP2 and LP3 extending along the first direction and parallel to one another. At least one fourth layout pattern LP4 of the second region RG2 may be adjacent to the first to third layout patterns LP1, LP2, and LP3 of the first region RG1. In particular, the fourth layout pattern LP4 in the second region RG2 may be closer along the first direction to the layout patterns in the first region RG1 than the first to third layout patterns LP1, LP2, and LP3 of the second region RG2. On the second region RG2, the first layout pattern LP1, the second layout pattern LP2, the third layout pattern LP3 and the fourth layout pattern LP4 may be disposed adjacent to each other. In particular, the first and third layout patterns LP1 and LP3 may extend along the second direction D2 and be spaced apart from each other along the second direction D2, but not spaced apart along the first direction D1, while the second layout pattern LP2 and the fourth layout pattern LP4 may extend along the second direction D2 and be spaced apart from each other and from the first and third layout patterns LP1 and LP3 along the first direction D1.

On the first region RG1, the fourth layout patterns LP4 may overlap with the second and third layout patterns LP2 and LP3. For example, along the first and second direction D1 and D2, one of the fourth layout patterns LP4 may partially overlap the second layout pattern LP2, while the second layout pattern LP2 may completely overlap the fourth layout pattern LP4. In other words, a width of the second layout pattern LP2 along the second direction D2 may be greater than a width of the fourth layout pattern LP4 and a length of the second layout pattern LP2 along the first direction D1 may be longer than a length of the fourth layout pattern LP4. Similarly, along the first and second direction D1 and D2, another of the fourth layout patterns LP4 may partially overlap the third layout pattern LP3, while the third layout pattern LP3 may completely overlap the another fourth layout pattern LP4. In other words, a width of the third layout pattern LP3 along the second direction D2 may be greater than a width of the another fourth layout pattern LP4 and a length of the third layout pattern LP3 along the first direction D1 may be longer than a length of the another fourth layout pattern LP4. The fourth layout patterns LP4 may be spaced apart from the first layout patterns LP1.

The fourth layout patterns LP4 may be spaced apart from each other with the first layout pattern LP1 interposed therebetween along the second direction D2. In some embodiments, a distance between the fourth layout patterns LP4 adjacent to each other with the first layout pattern LP1 interposed therebetween may be defined as a sixth distance L6. The fourth layout patterns LP4 of the first region RG1 may be spaced apart from the fourth layout pattern LP4 of the second region RG2. In some embodiments, a distance between the fourth layout pattern LP4 of the first region RG1 and the fourth layout pattern LP4 of the second region RG2 may be defined as a fifth distance L5. In some embodiments, the fifth distance L5 may be substantially equal to the sixth distance L6. In certain embodiments, the fifth distance L5 may be greater than the sixth distance L6. However, as only the fifth distance L5 needs to comply with design rule for this fourth layout pattern LP4, the separation between the first region RG1 and the second region RG2 along the first direction may be a distance L2', which may be less than the design rule for an individual pattern, which will result in the second distance L2 in the final semiconductor device shown in FIG. 1.

As an integration density of a semiconductor device increases, the second interconnection lines M2 of FIG. 1 become very close to each other. Due to this proximity, distorted patterns different from desired layout patterns may be printed or defined on a substrate if the second interconnection lines M2 are realized using one photomask. However, when the second interconnection lines M2 are realized using a plurality of the photomasks as described in the embodiments, a distance between image patterns disposed on each of the photomasks can be increased. Thus, it is possible to prevent a distorted pattern from being printed or defined on a substrate.

Figure 11:
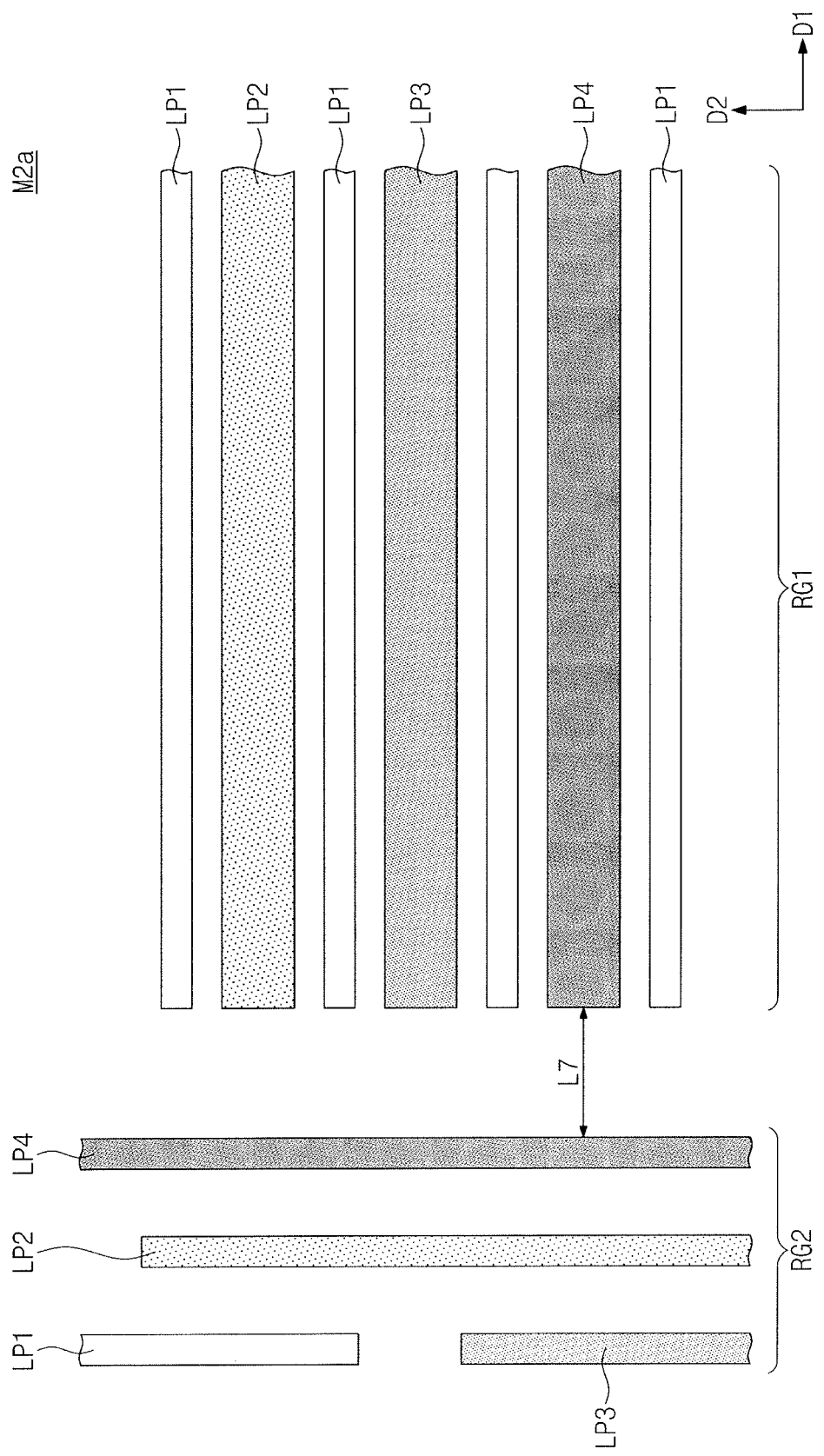
FIG. 11 illustrates a plan view of a layout according to a comparative example.

FIG. 11 is a plan view illustrating a layout according to a comparative example. Referring to FIG. 11, on the first region RG1, the fourth layout pattern LP4 may not overlap with the second and third layout patterns LP2 and LP3. The first to fourth layout patterns LP1, LP2, LP3 and LP4 may be alternately arranged in the second direction D2.

The fourth layout pattern LP4 of the second region RG2 may be spaced apart from the fourth layout pattern LP4 of the first region RG1 by a predetermined distance (e.g., a seventh distance L7). The seventh distance L7 may be equal to or greater than the minimum distance between the same layout patterns defined by a design rule. If a distance between the fourth layout pattern LP4 of the second region RG2 and the fourth layout pattern LP4 of the first region RG1 is smaller than the seventh distance L7, a distorted pattern may be realized on a substrate by proximity.

In the present comparative example, an end of the fourth layout pattern LP4 of the first region RG1 may be disposed at a boundary between the first region RG1 and the second region RG2. Here, since the fourth layout pattern LP4 includes a fourth layout pattern LP4 in the first region RG1 that extends along the first direction D1 as far as the far as the first to third layout patterns LP1 to LP3, a distance (i.e., the seventh distance L7) between the first and second regions RG1 and RG2 may be greater than the distance L2' between the first and second regions RG1 and RG2 illustrated in FIG. 10.

Referring again to FIG. 10, according to some embodiments, since the distance between the first and second regions RG1 and RG2 can be the relatively small distance L2', e.g., smaller than the design rule, as the fifth distance L5 for the fourth layout pattern LP4 pattern is set only for the fourth layout pattern LP4 in the first region RG1, which is spaced further along the first direction D1 from the second region RG2 than the first to third layout patterns LP1 to LP3 in the first region RG1, an area of the semiconductor device may be reduced and an integration density of the semiconductor device may be improved.

Figure 12:
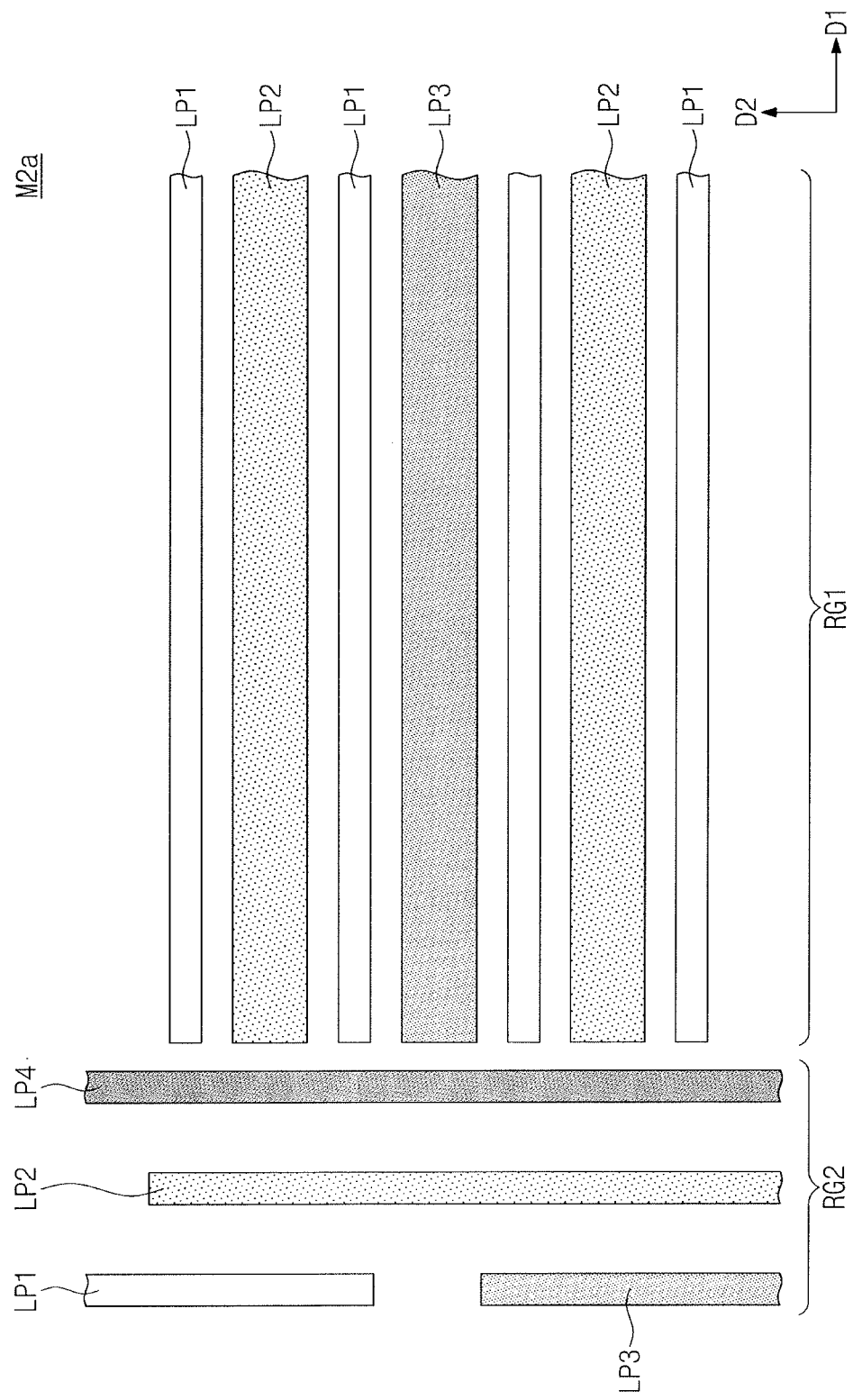
FIG. 12 illustrates a plan view of a layout according to another comparative example.
Figure 13:
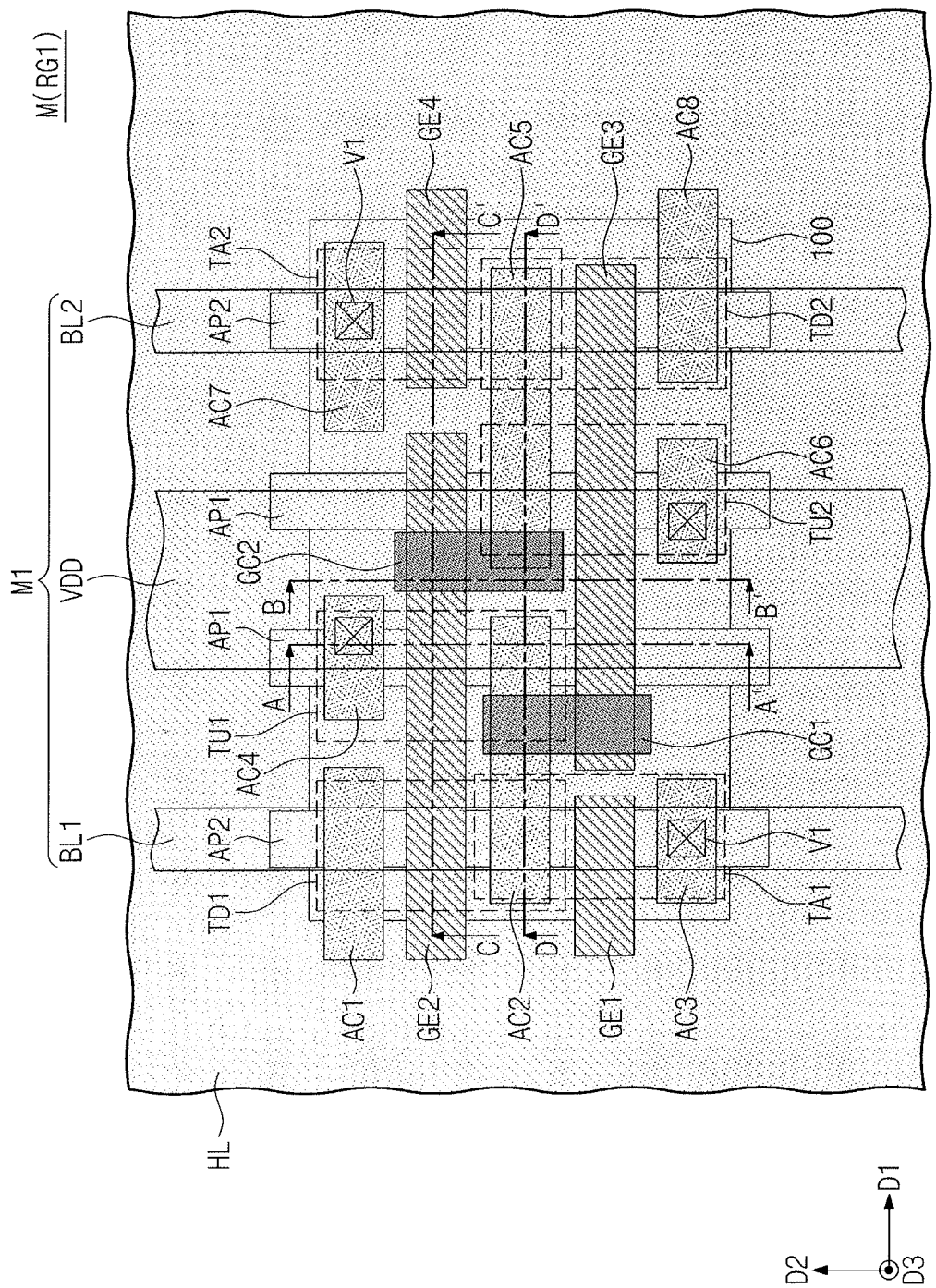
FIGS. 13, 15, 17, 19, 21, 23 and 25 illustrate plan views of a method for manufacturing a semiconductor device, according to some embodiments.
Figure 14A:
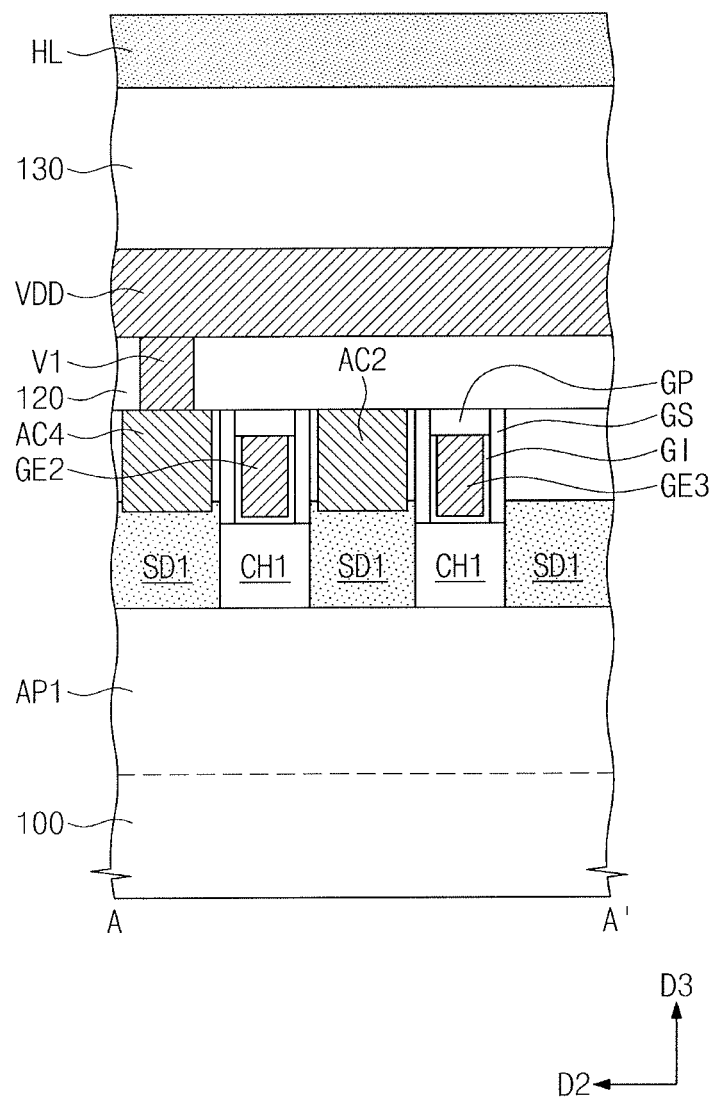
FIGS. 14A, 16A, 18A, 20A, 22A, 24A and 26A illustrate cross-sectional views taken along lines A-A' of FIGS. 13, 15, 17, 19, 21, 23 and 25, respectively.
Figure 14B:
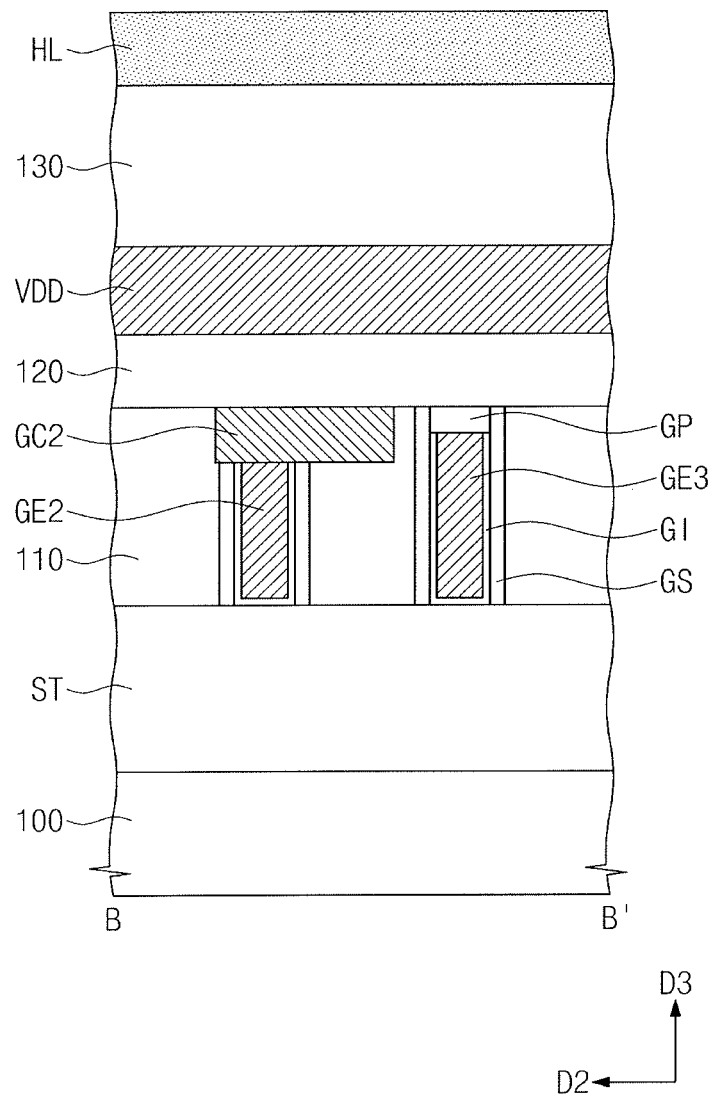
FIGS. 14B, 16B, 18B, 20B, 22B, 24B and 26B illustrate cross-sectional views taken along lines B-B' of FIGS. 13, 15, 17, 19, 21, 23 and 25, respectively.
Figure 14C:
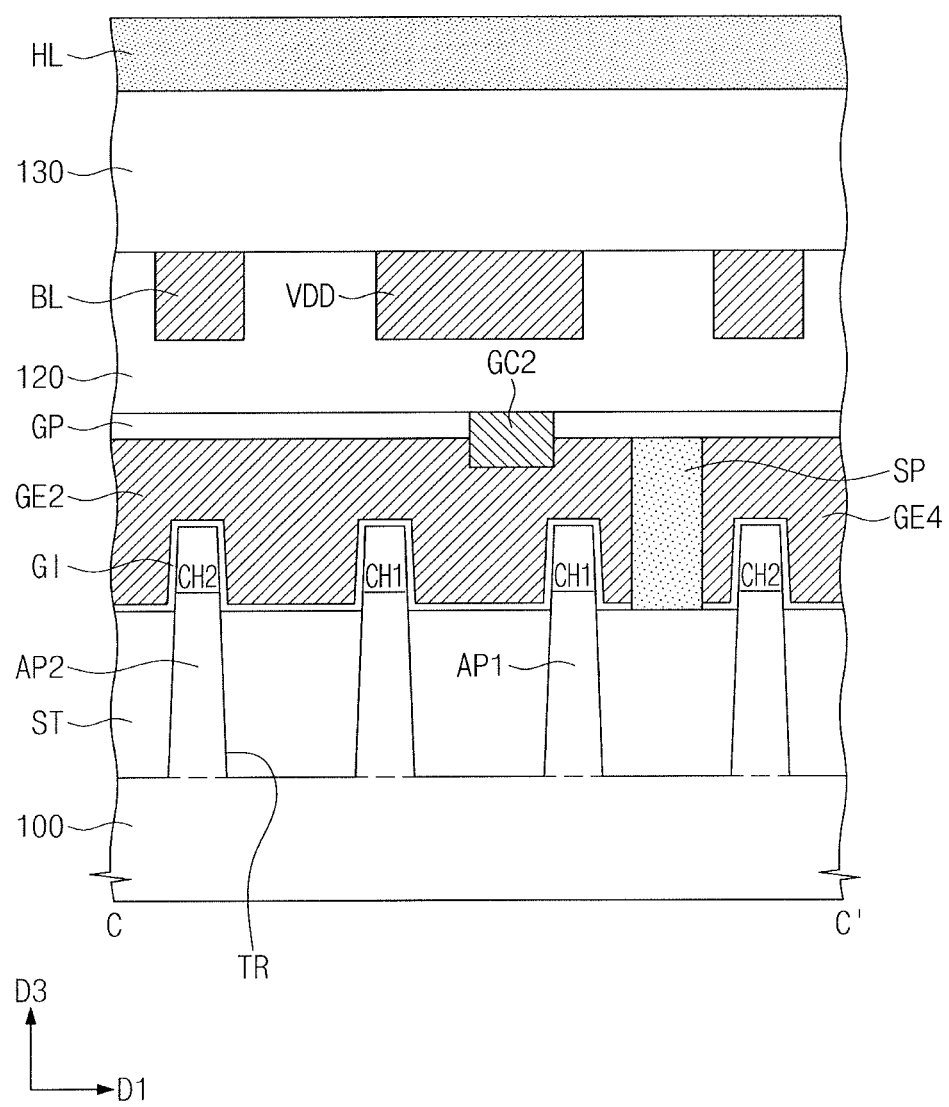
FIGS. 14C, 16C, 18C, 20C, 22C, 24C and 26C illustrate cross-sectional views taken along lines C-C' of FIGS. 13, 15, 17, 19, 21, 23 and 25, respectively.
Figure 14D:
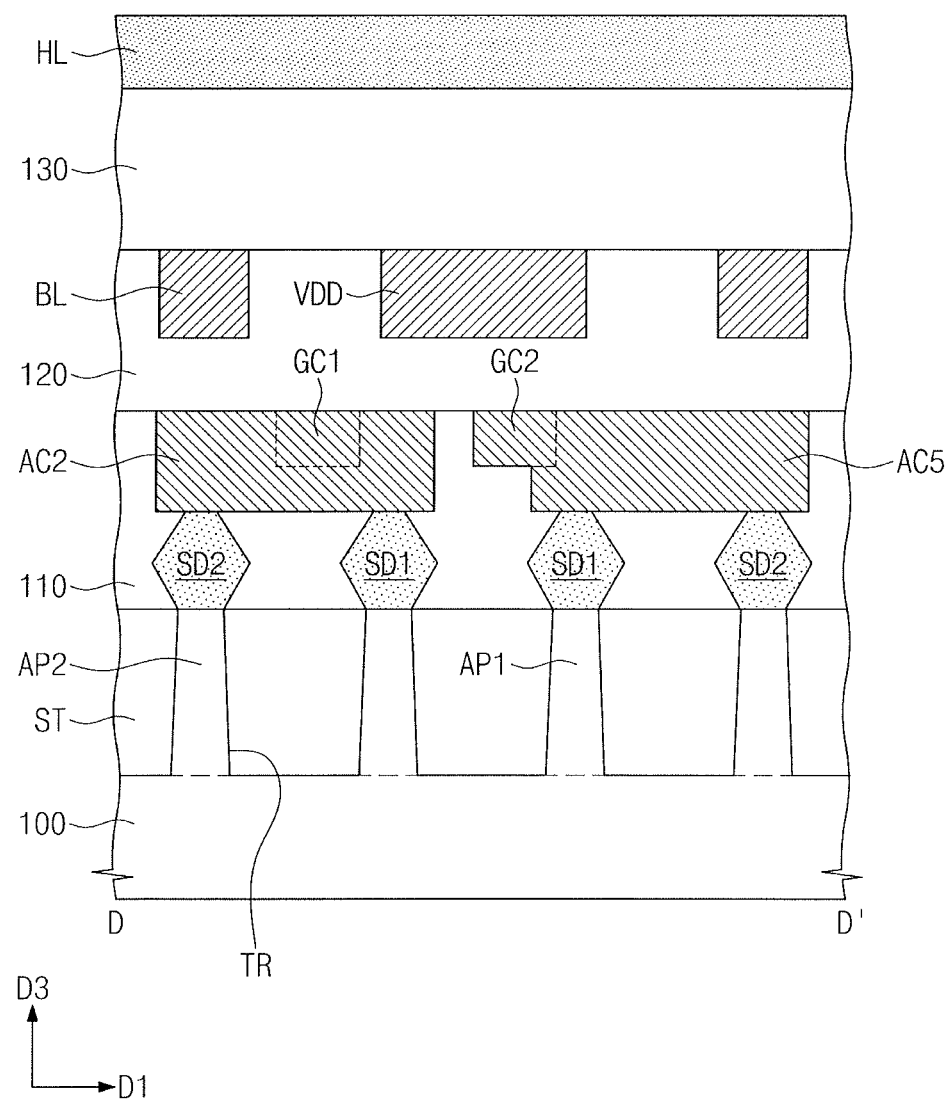
FIGS. 14D, 16D, 18D, 20D, 22D, 24D and 26D illustrate cross-sectional views taken along lines D-D' of FIGS. 13, 15, 17, 19, 21, 23 and 25, respectively.
Figure 15:
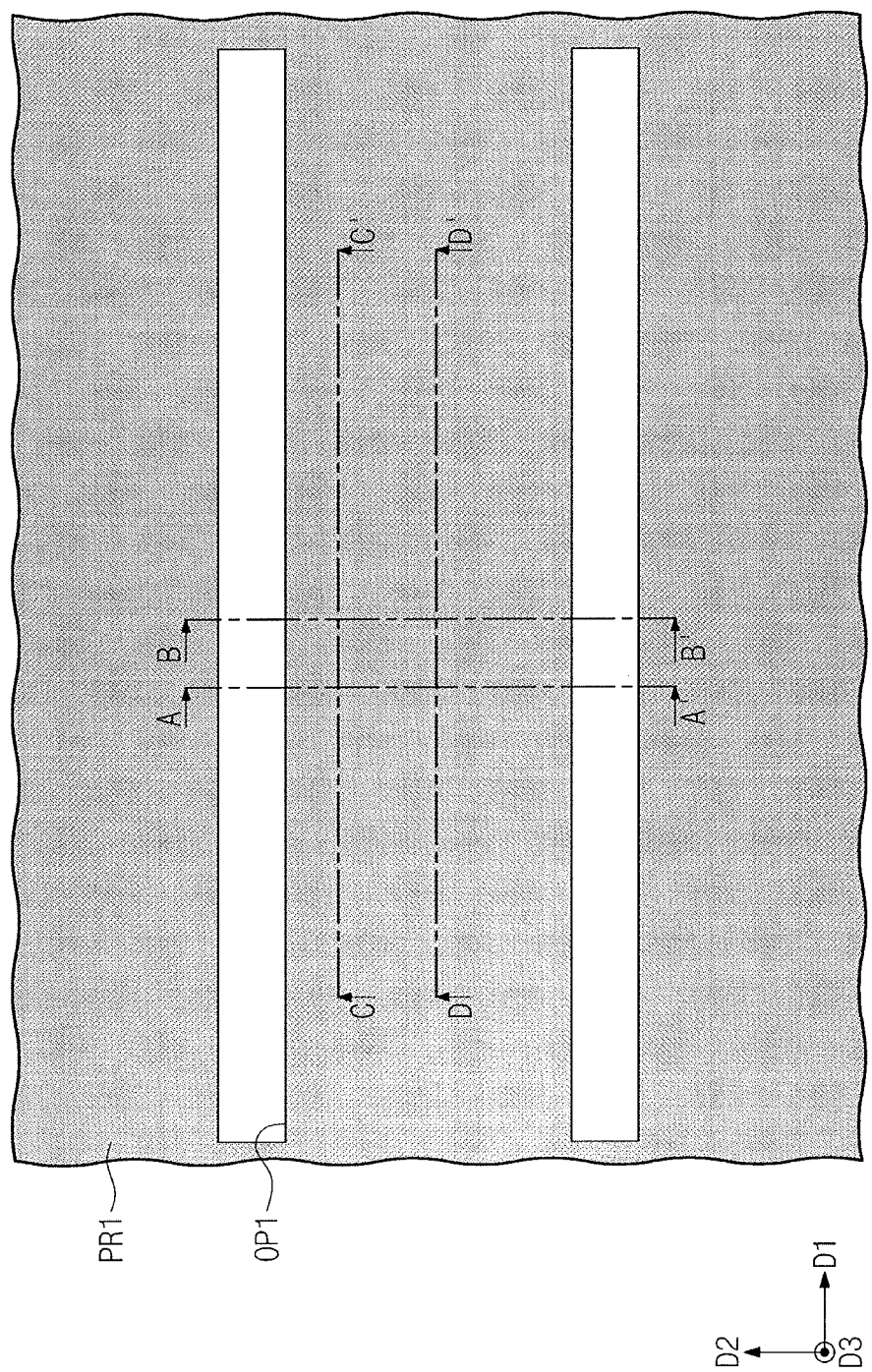
Figure 16A:
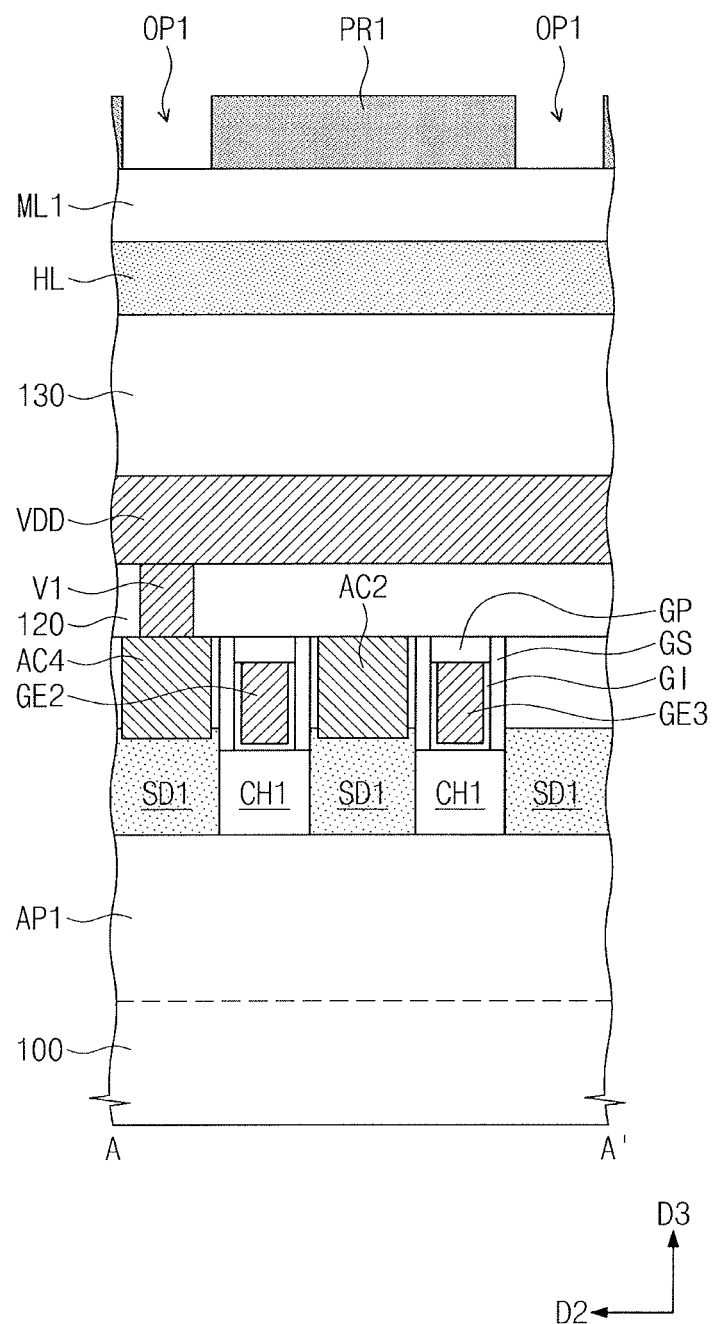
Figure 16B:
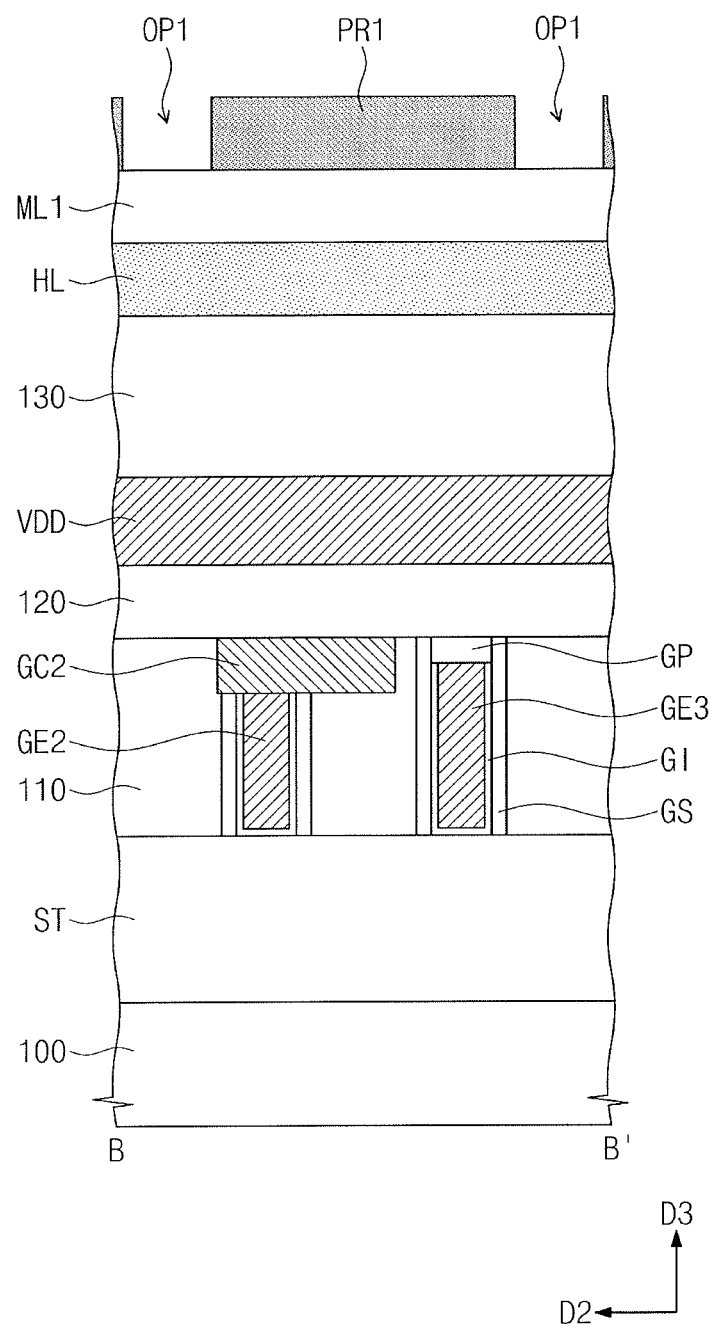
Figure 16C:
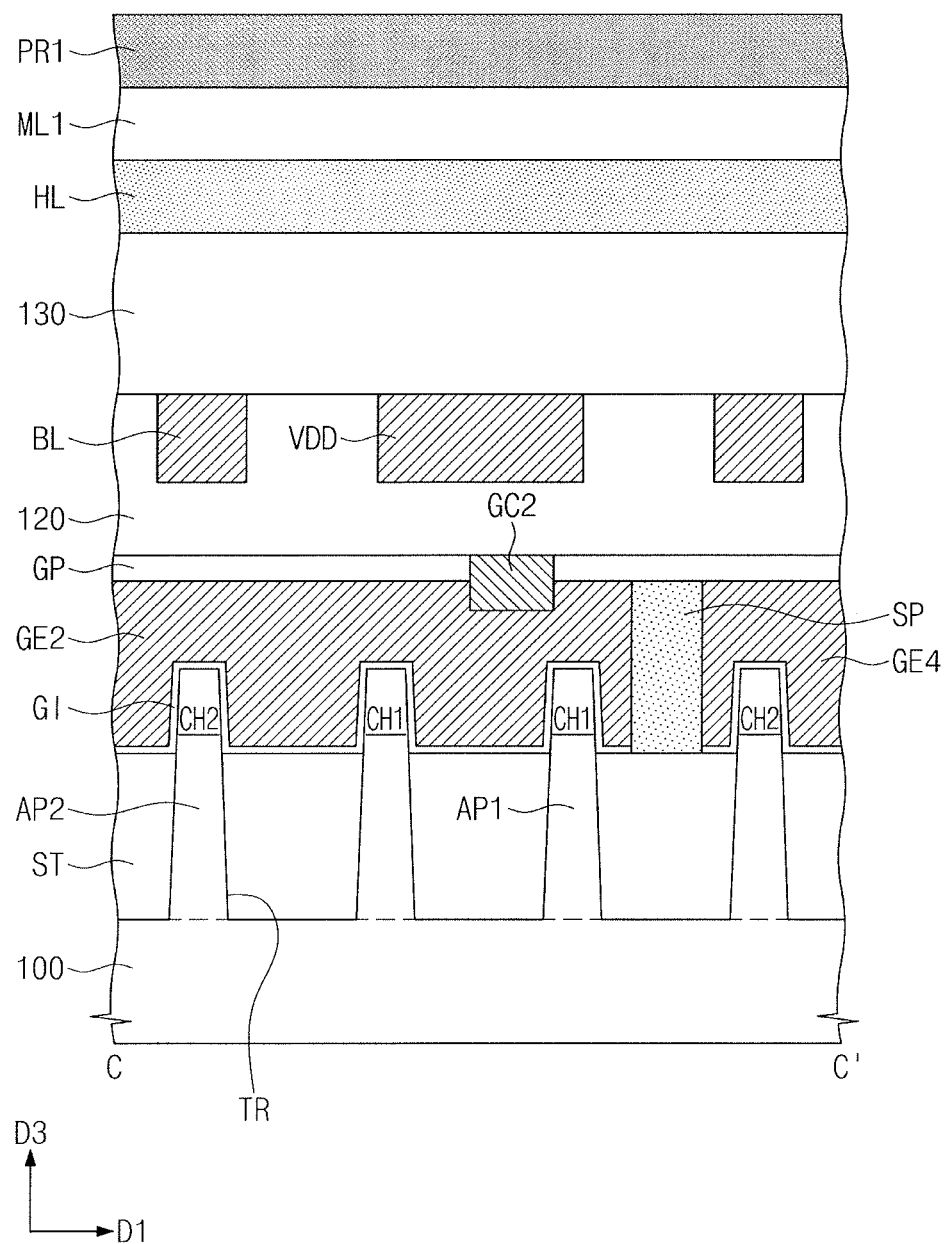
Figure 16D:
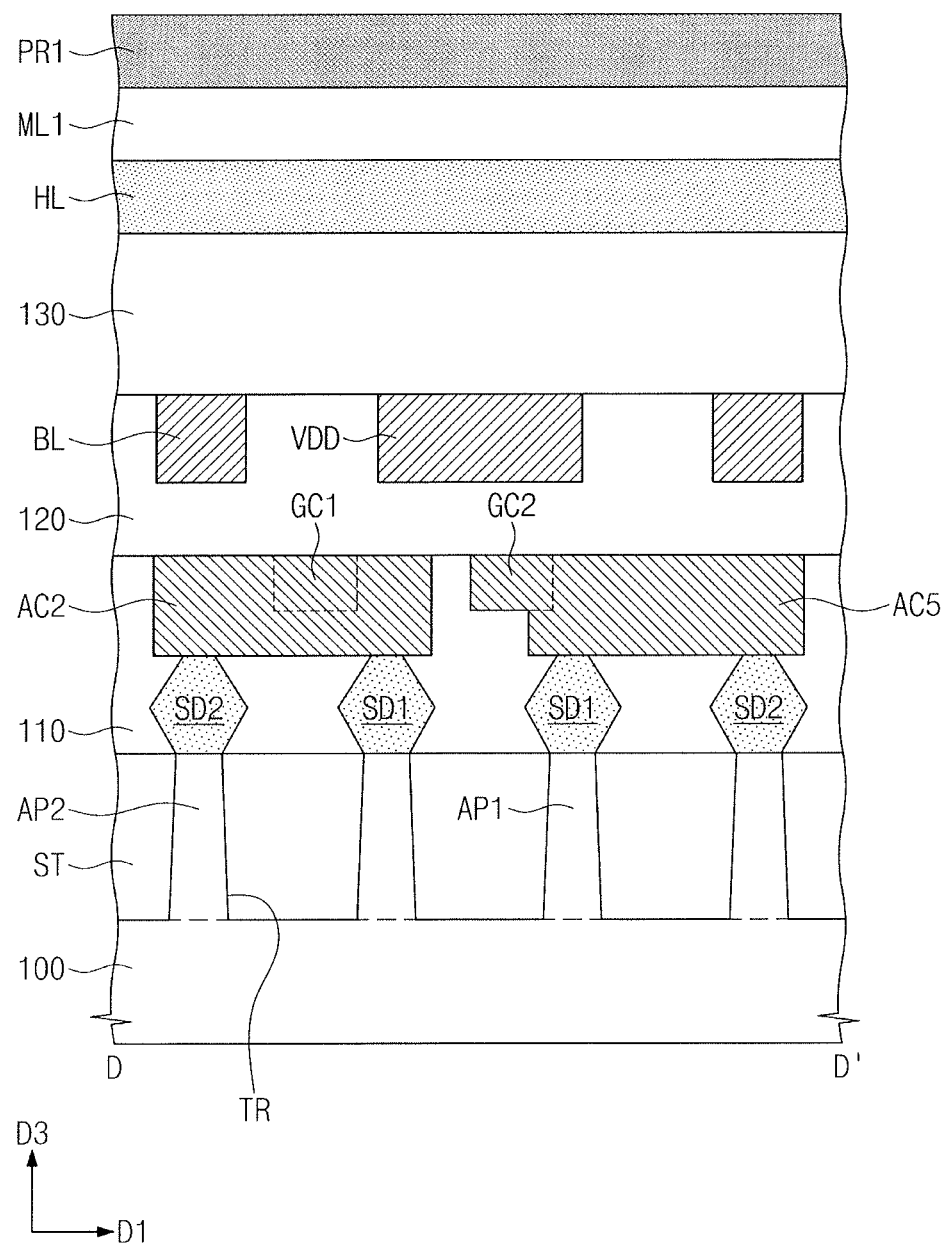
Figure 17:
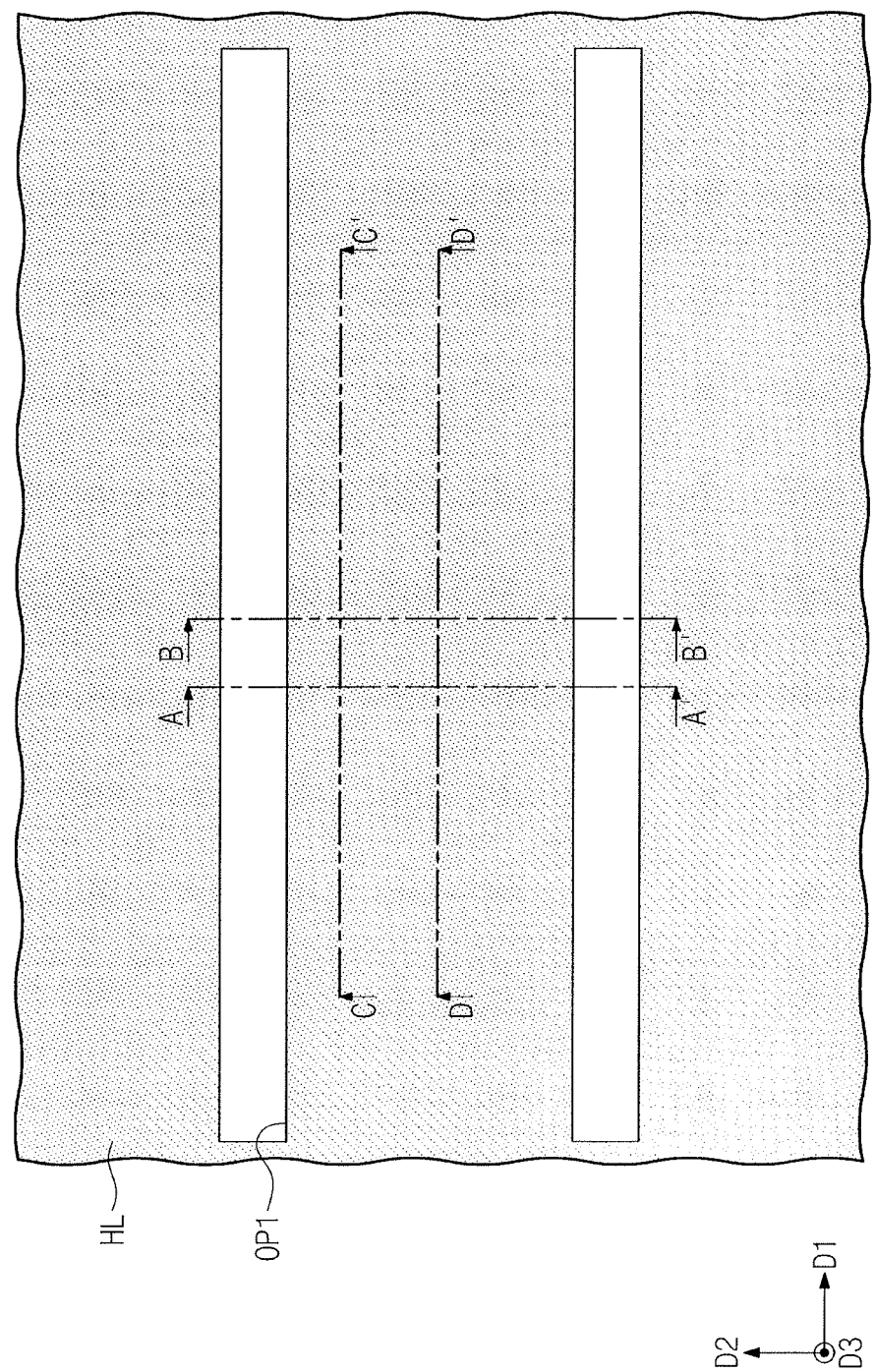
Figure 18A:
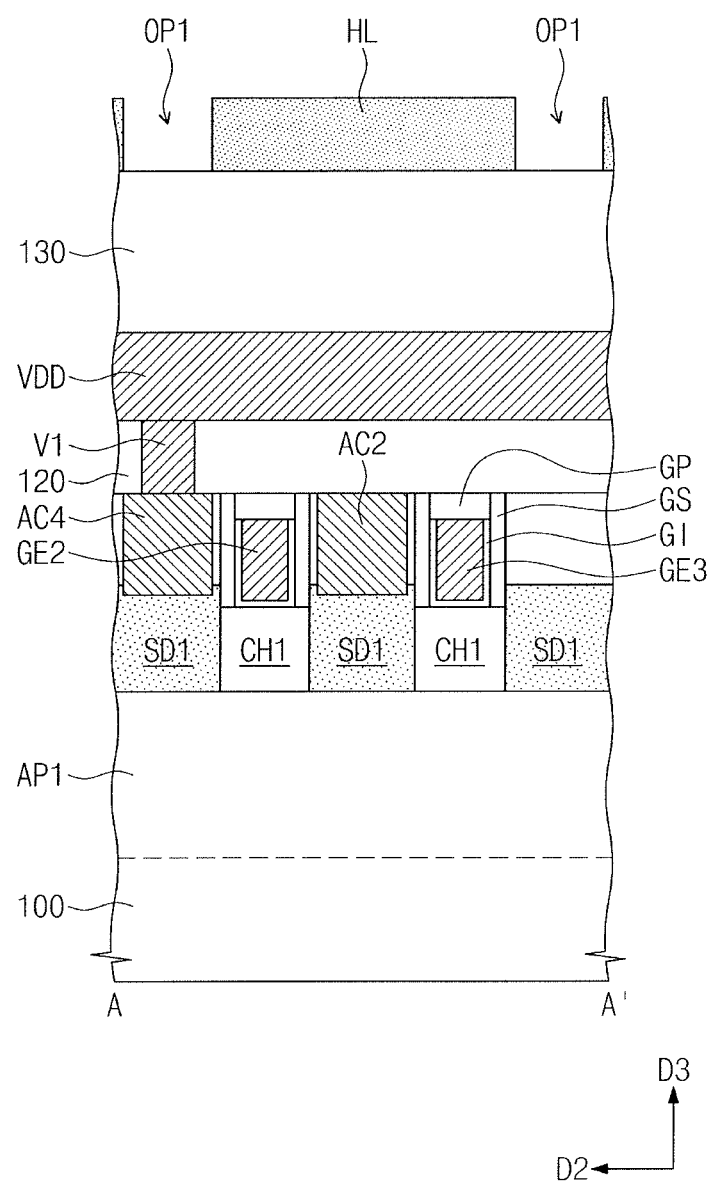
Figure 18B:
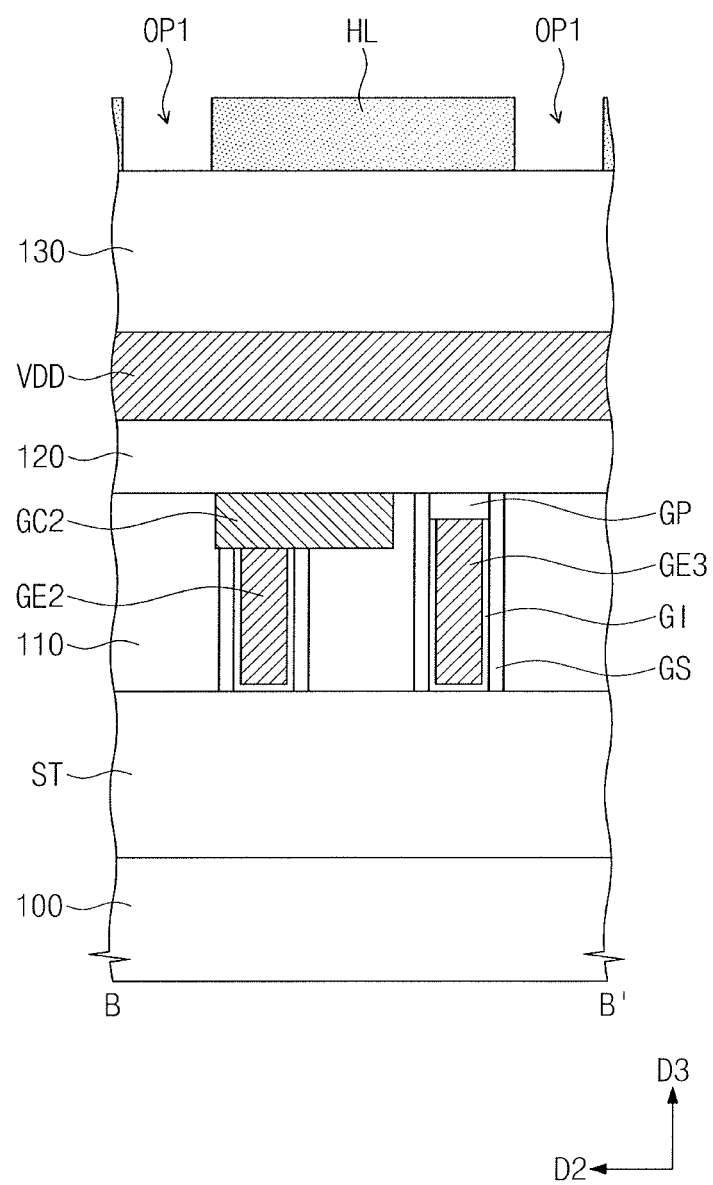
Figure 18C:
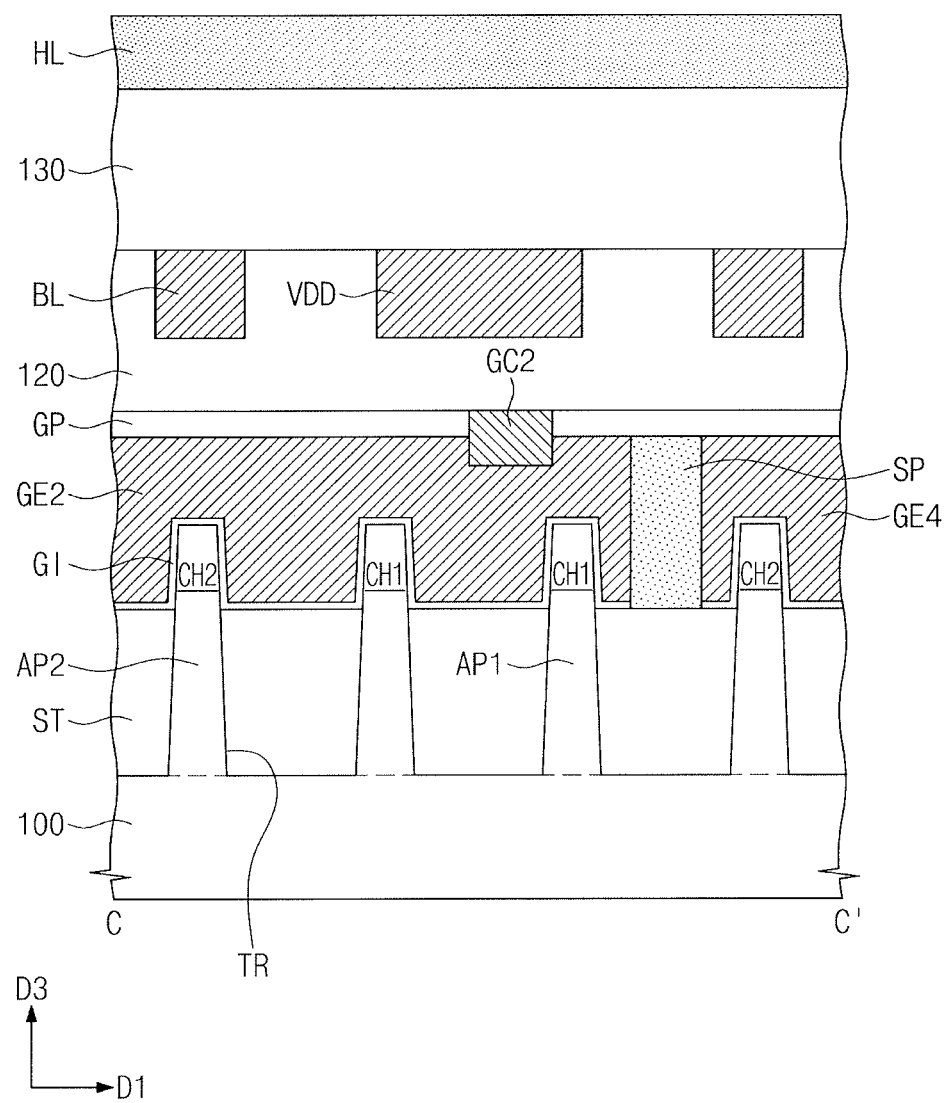
Figure 18D:
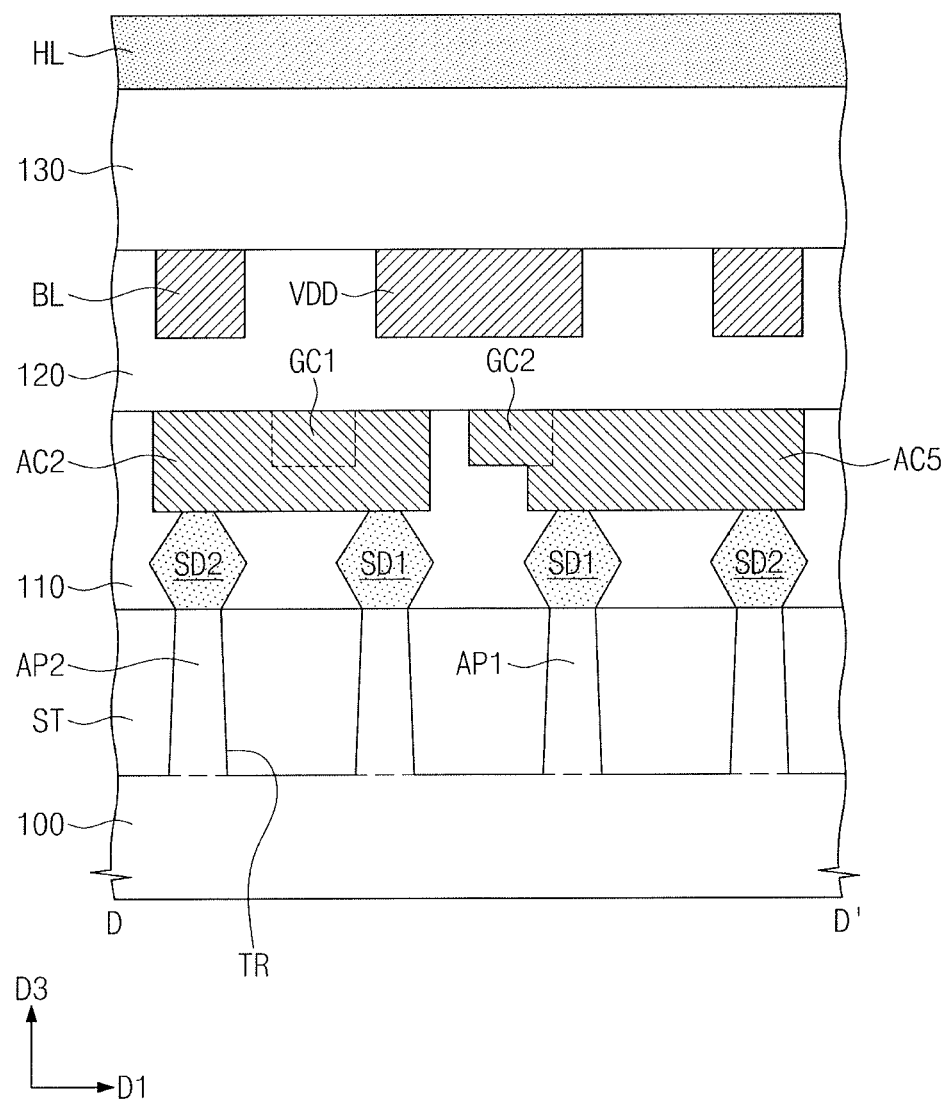
Figure 19:
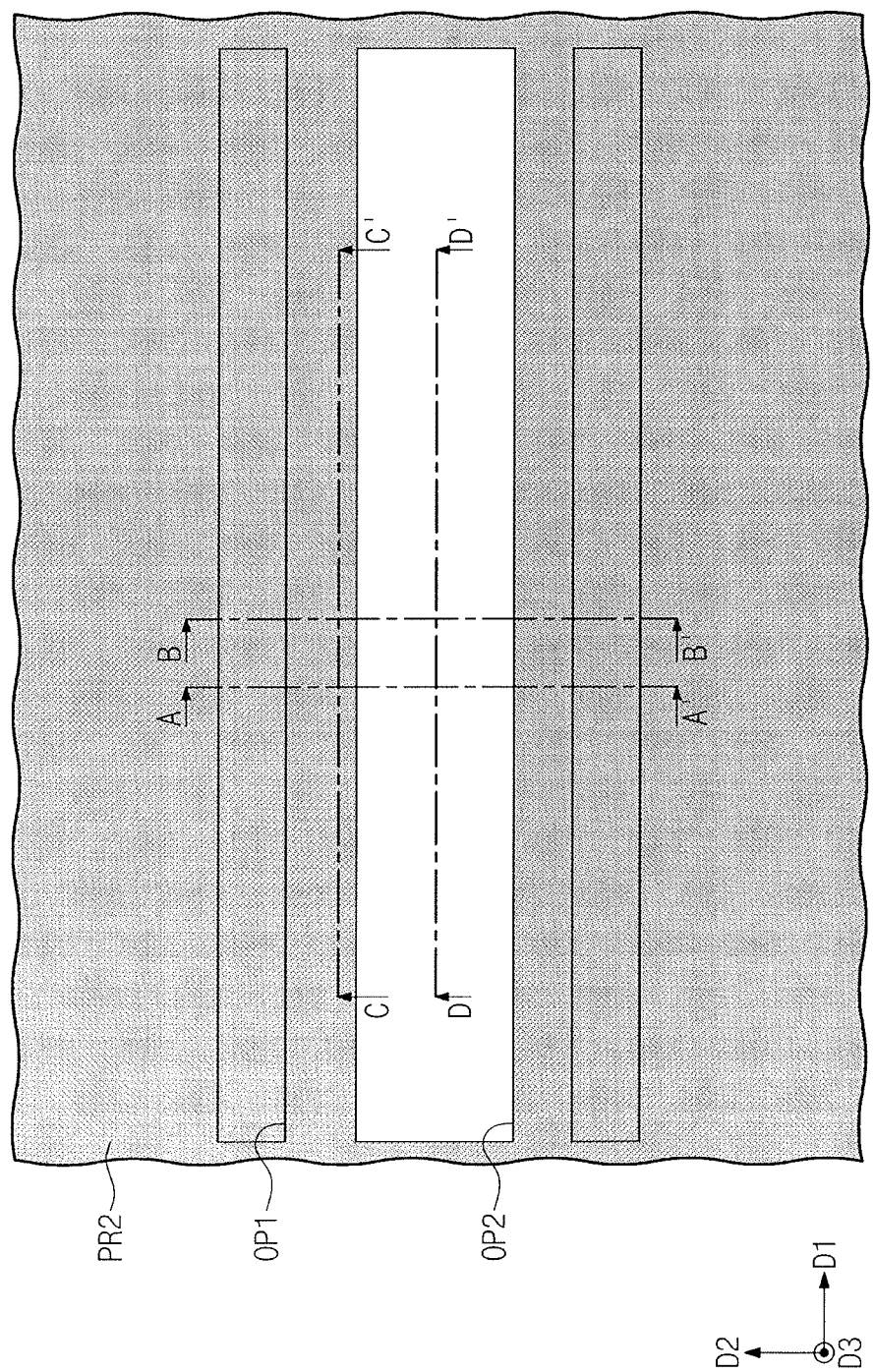
Figure 20A:
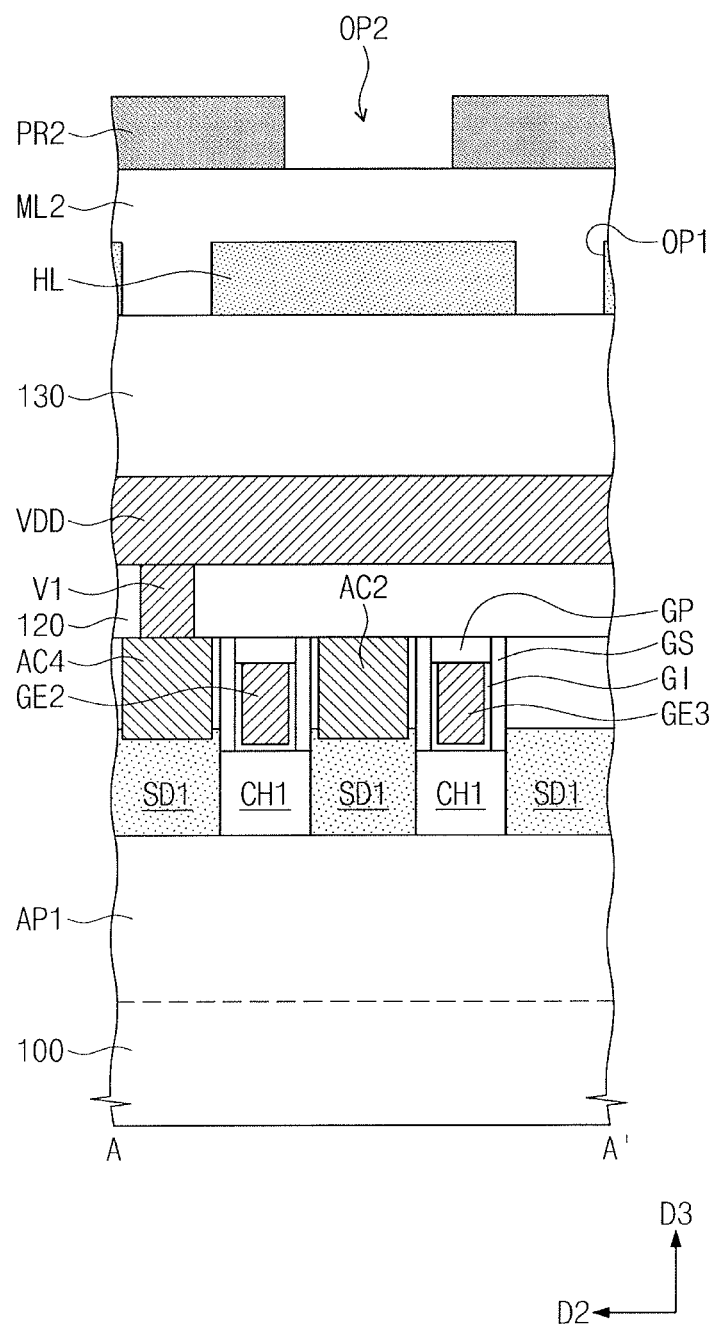
Figure 20B:
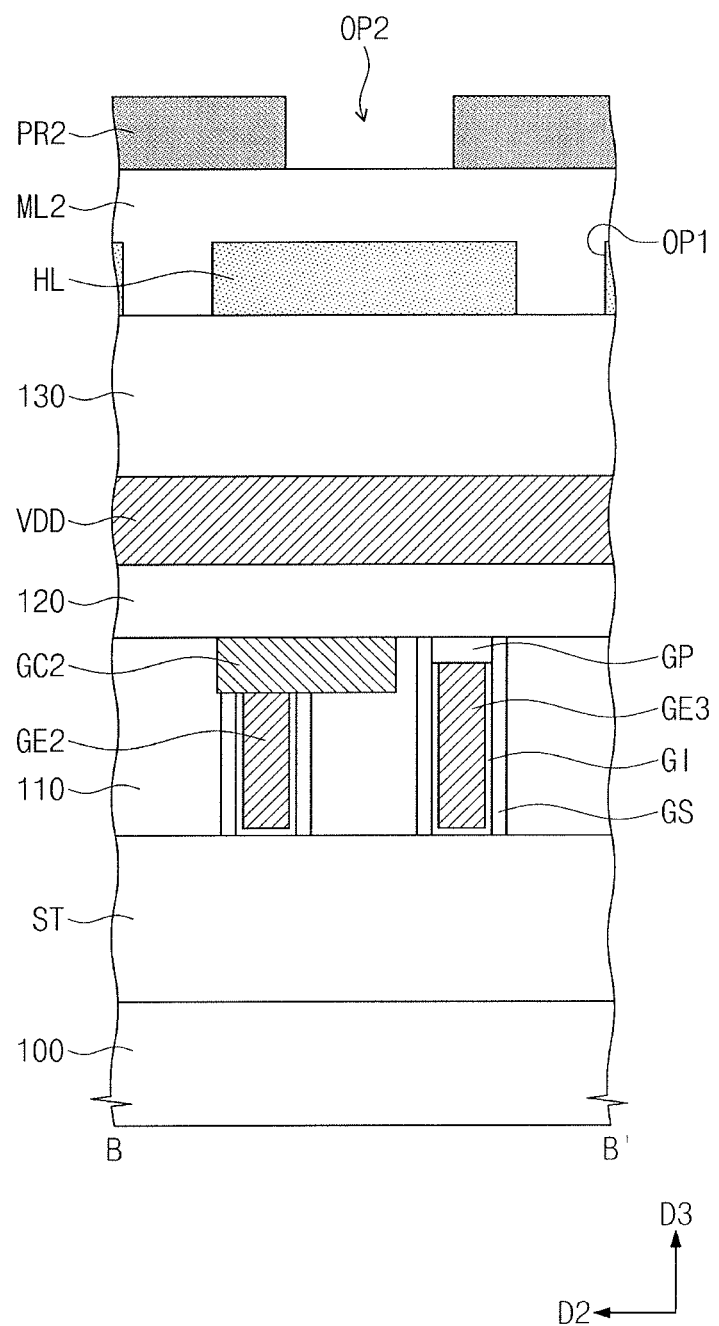
Figure 20C:
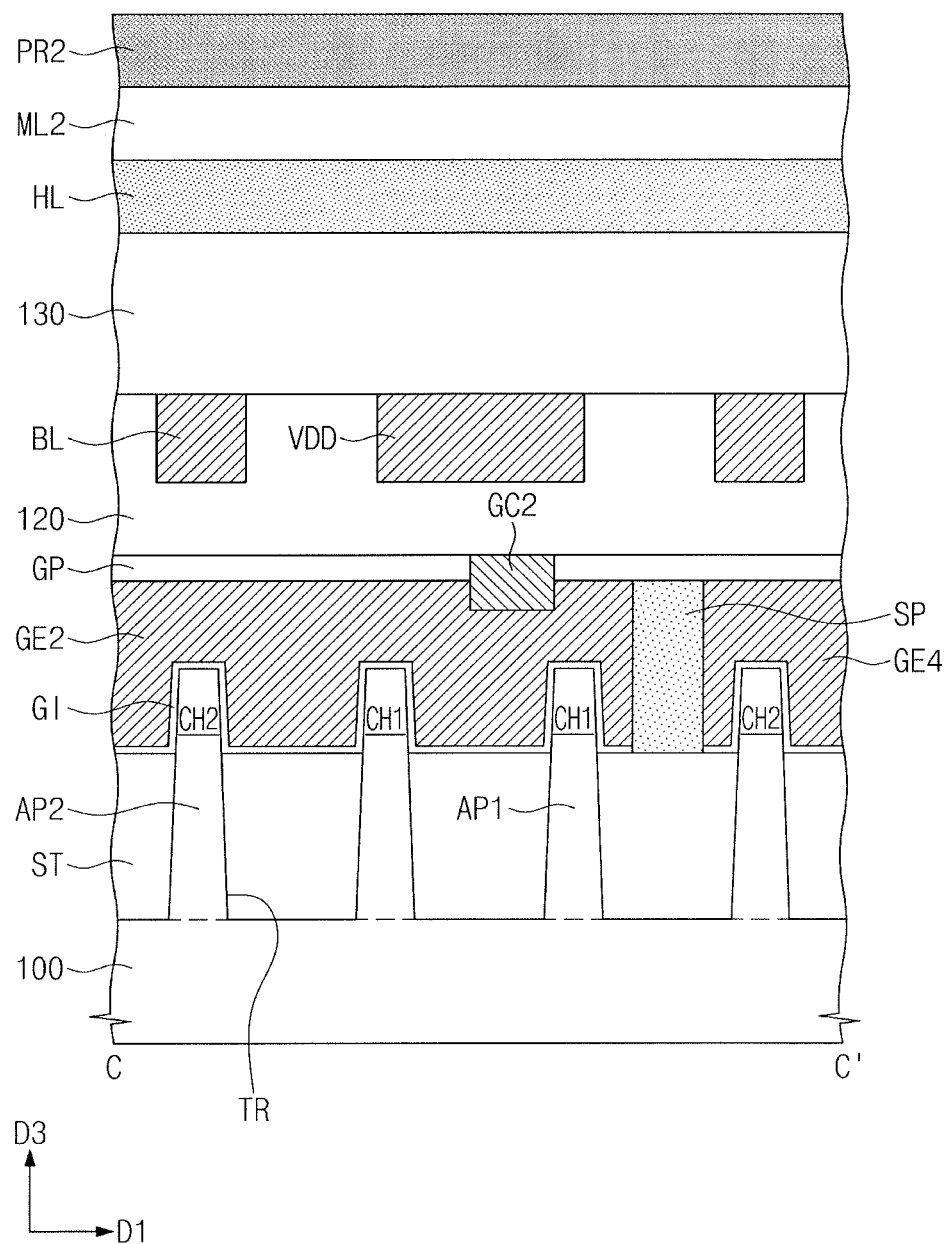
Figure 20D:
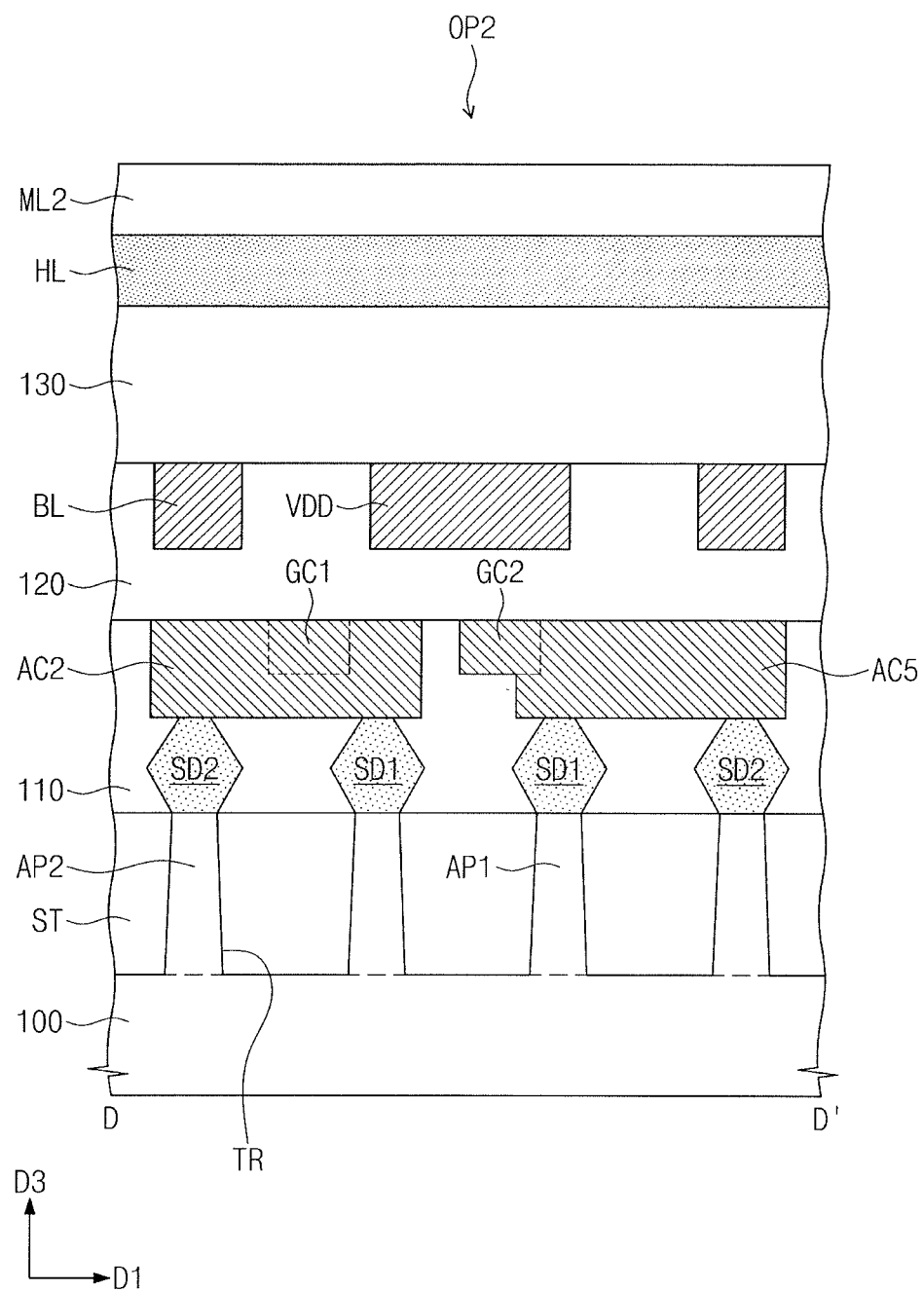
Figure 21:
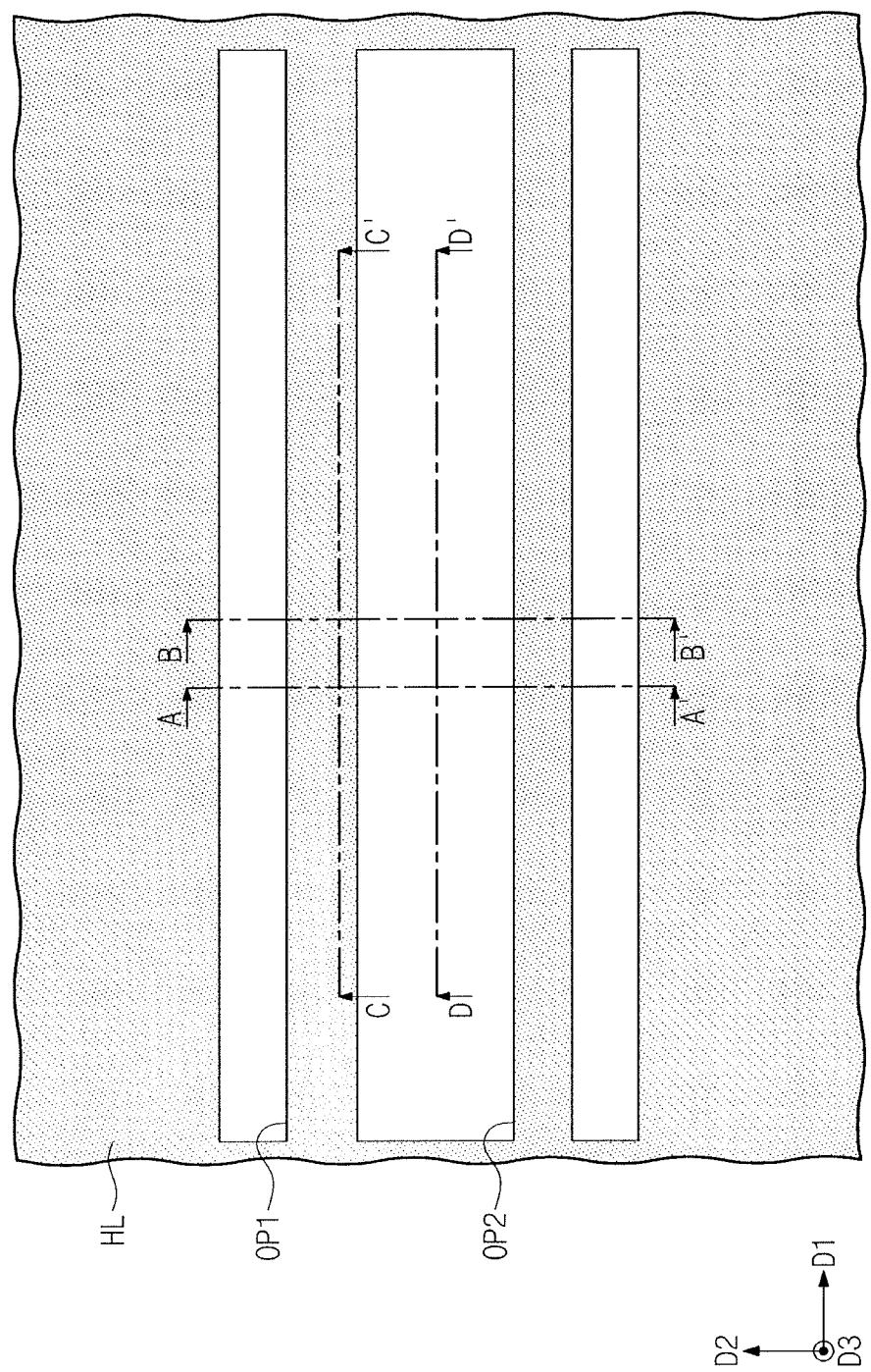
Figure 22A:
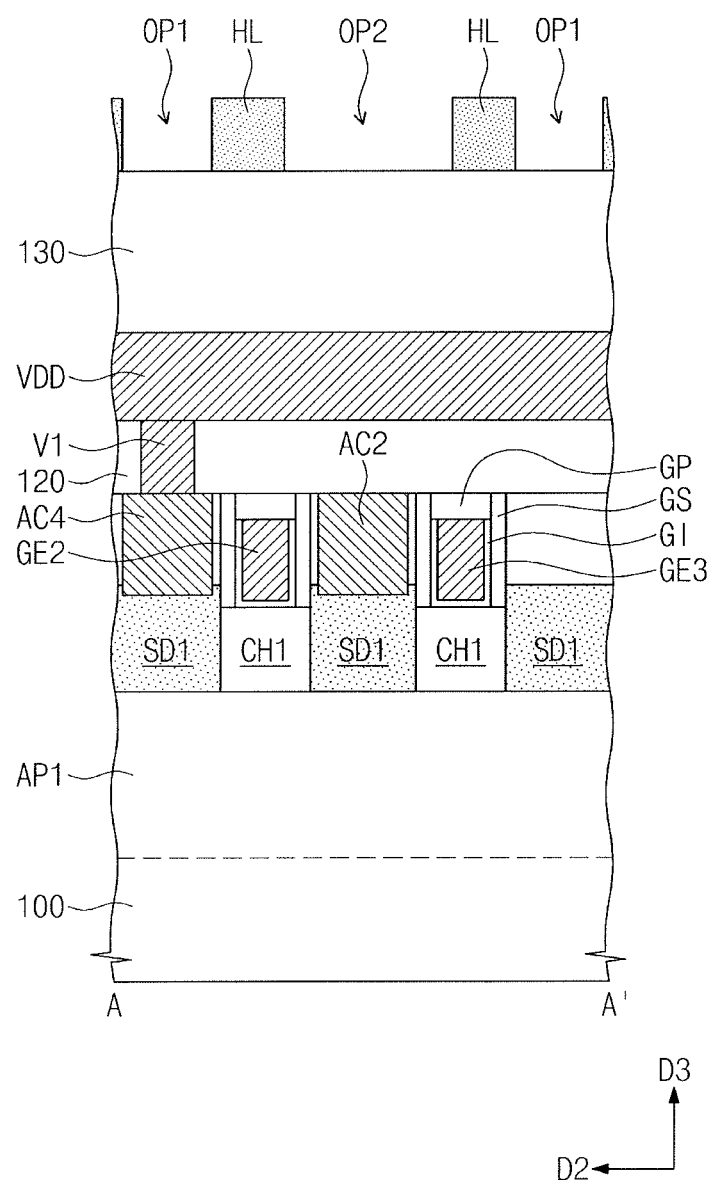
Figure 22B:
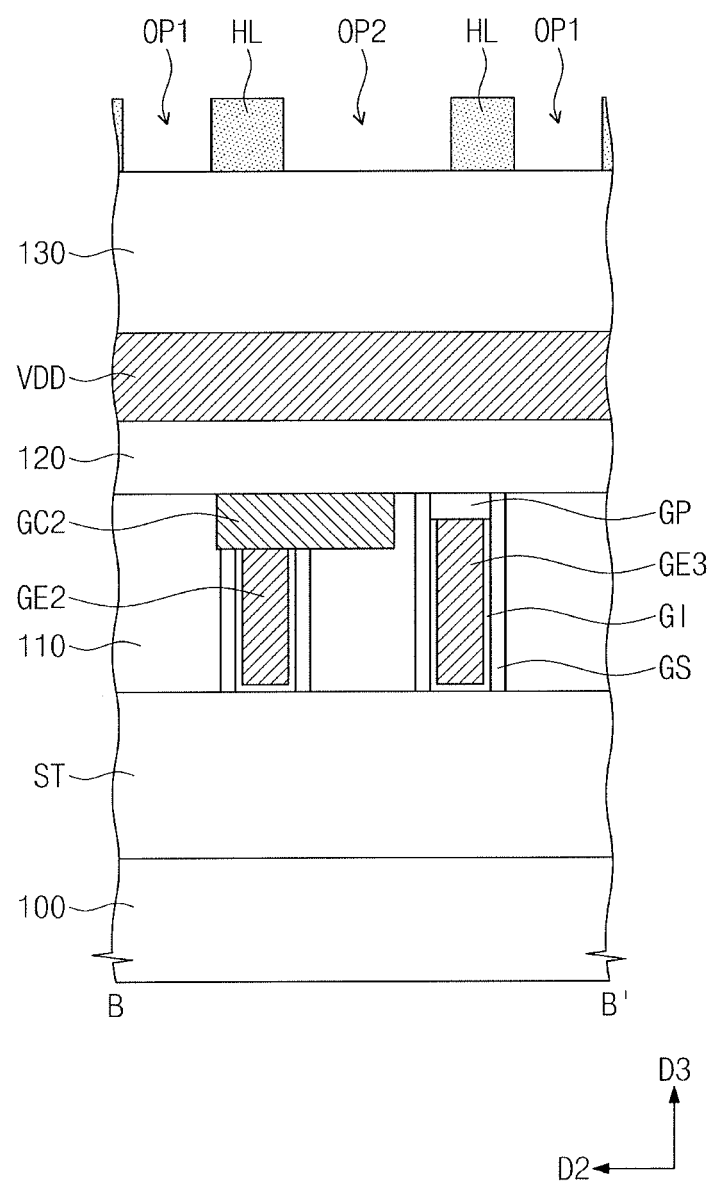
Figure 22C:
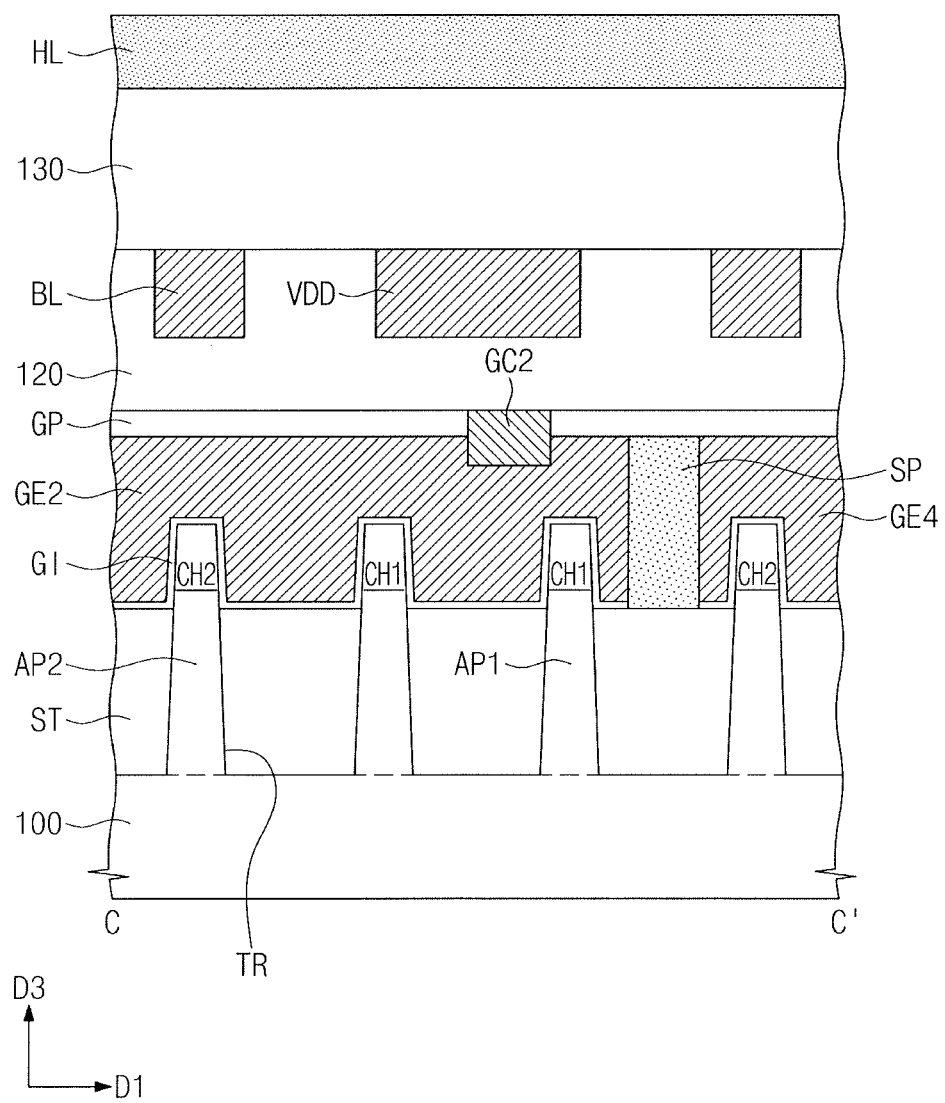
Figure 22D:
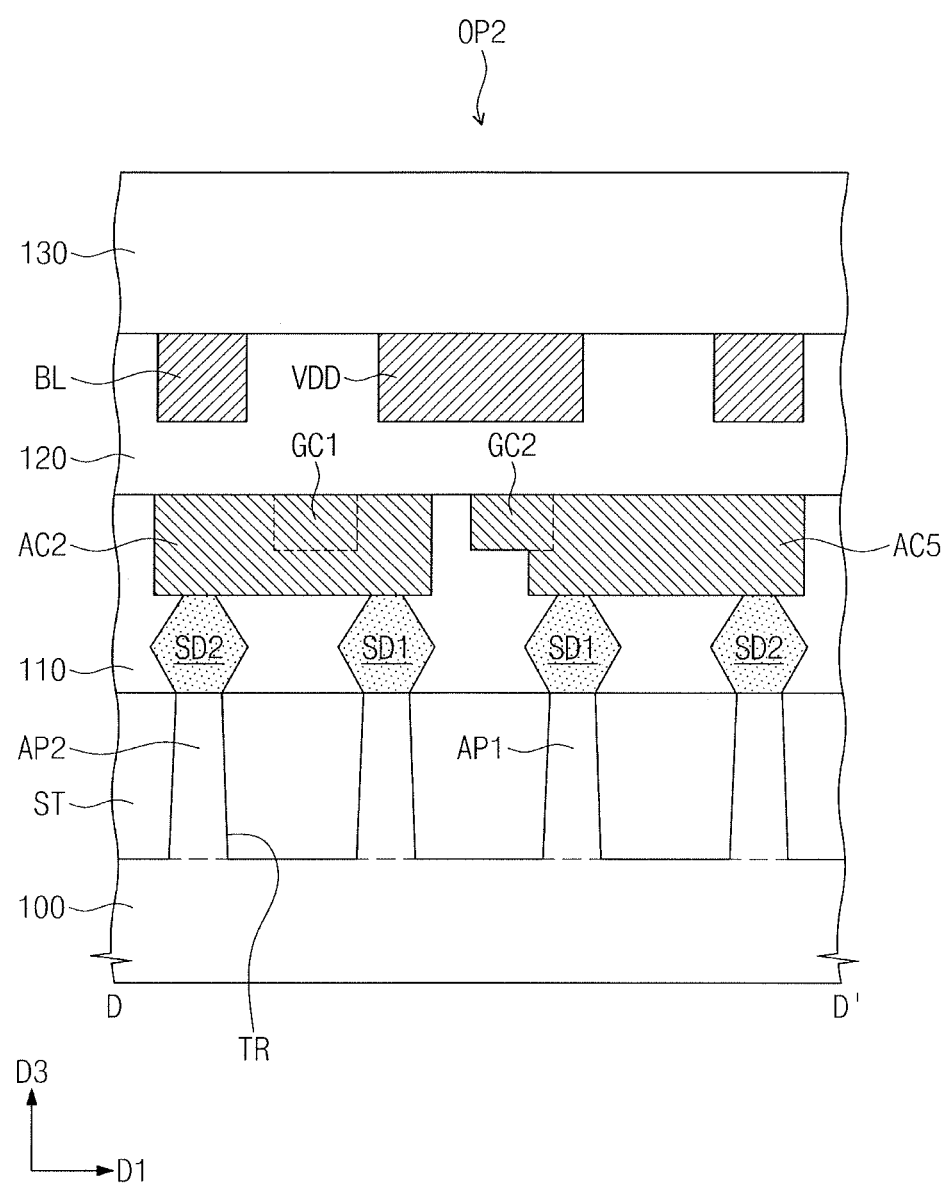
Figure 23:
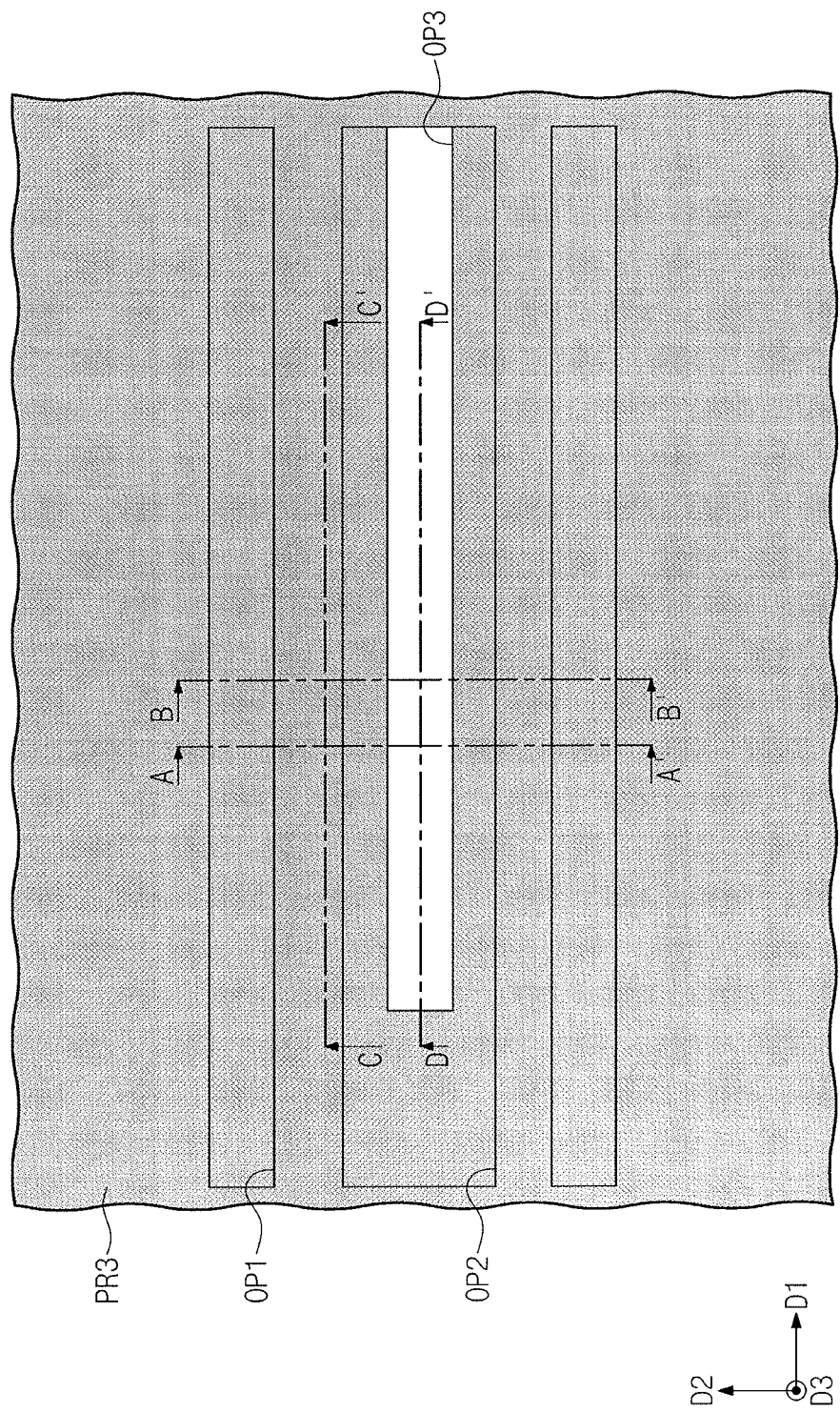
Figure 24A:
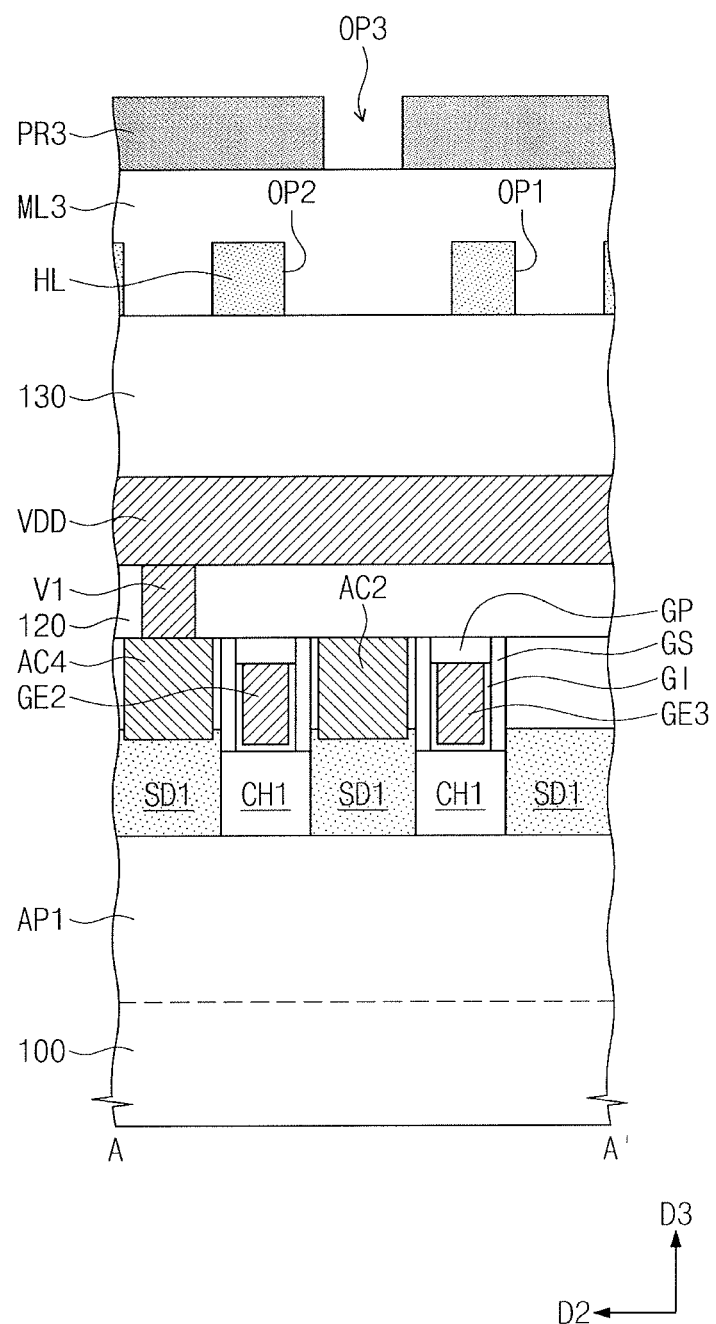
Figure 24B:
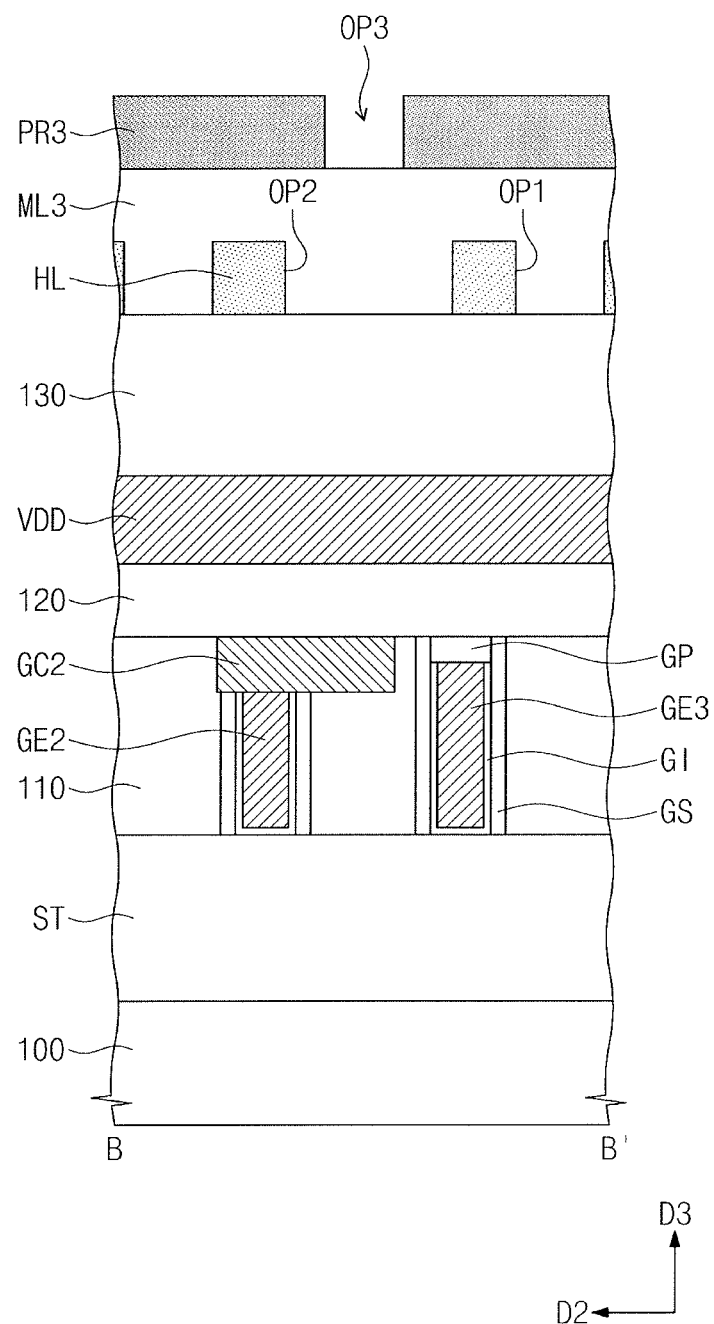
Figure 24C:
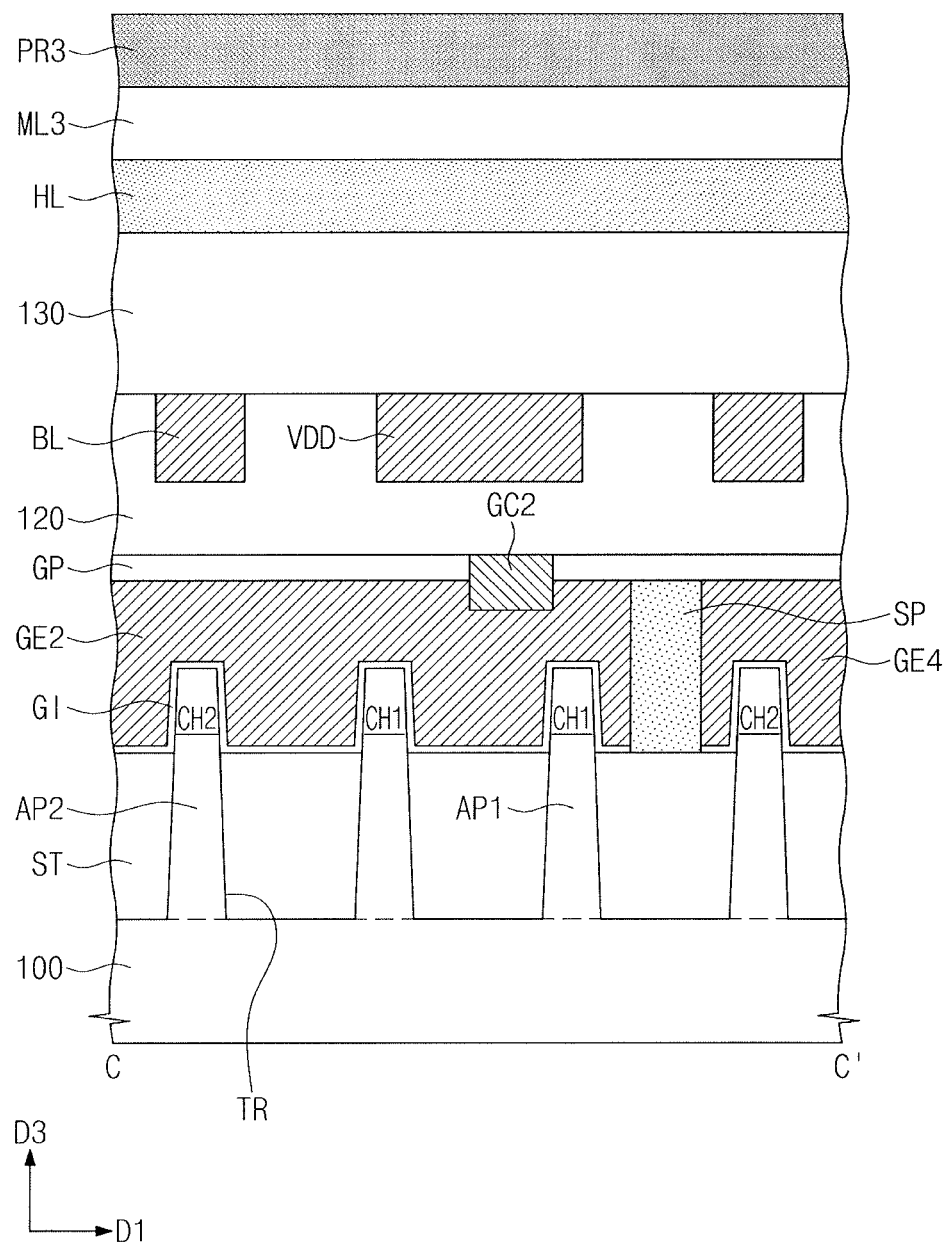
Figure 24D:
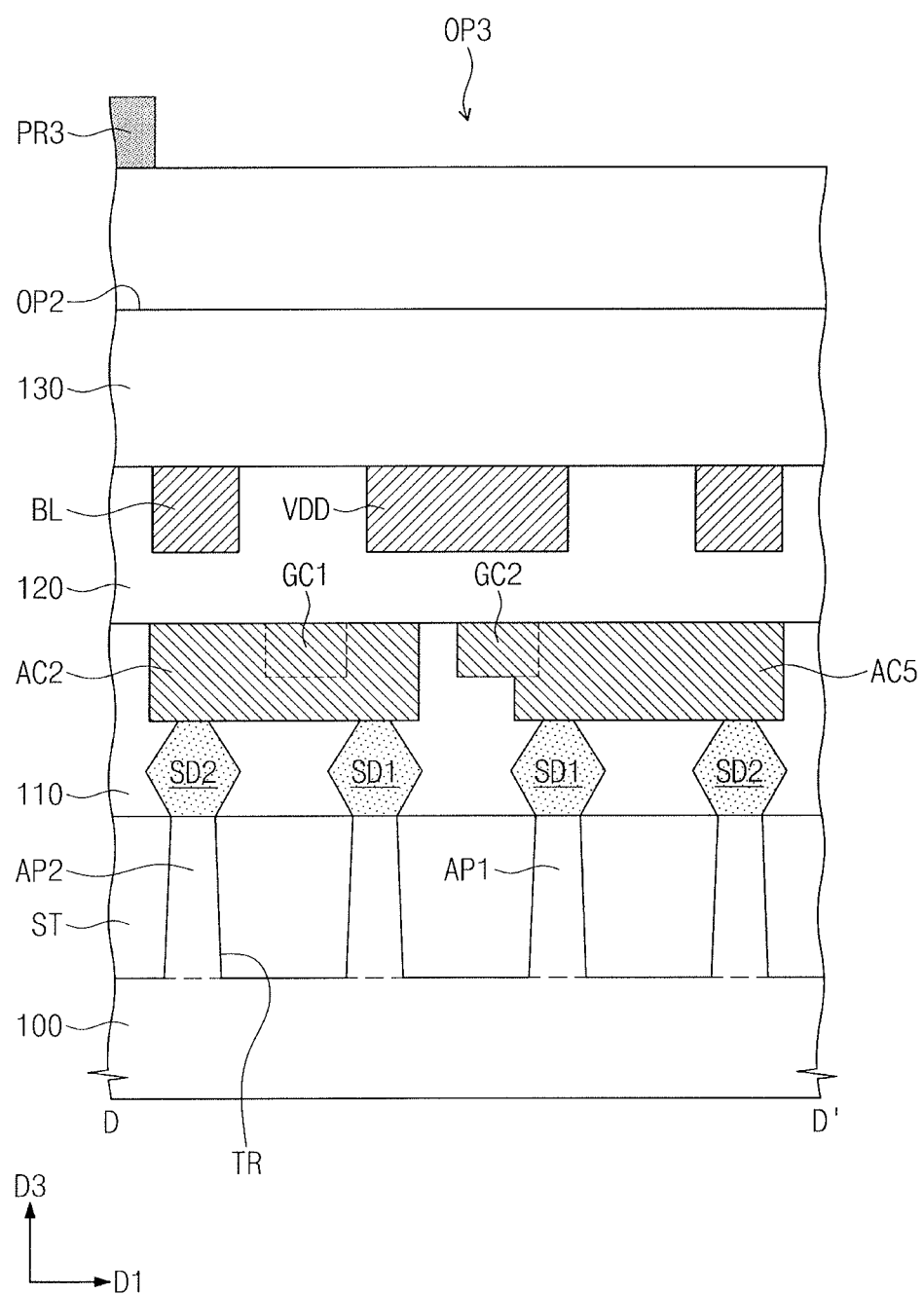
Figure 25:
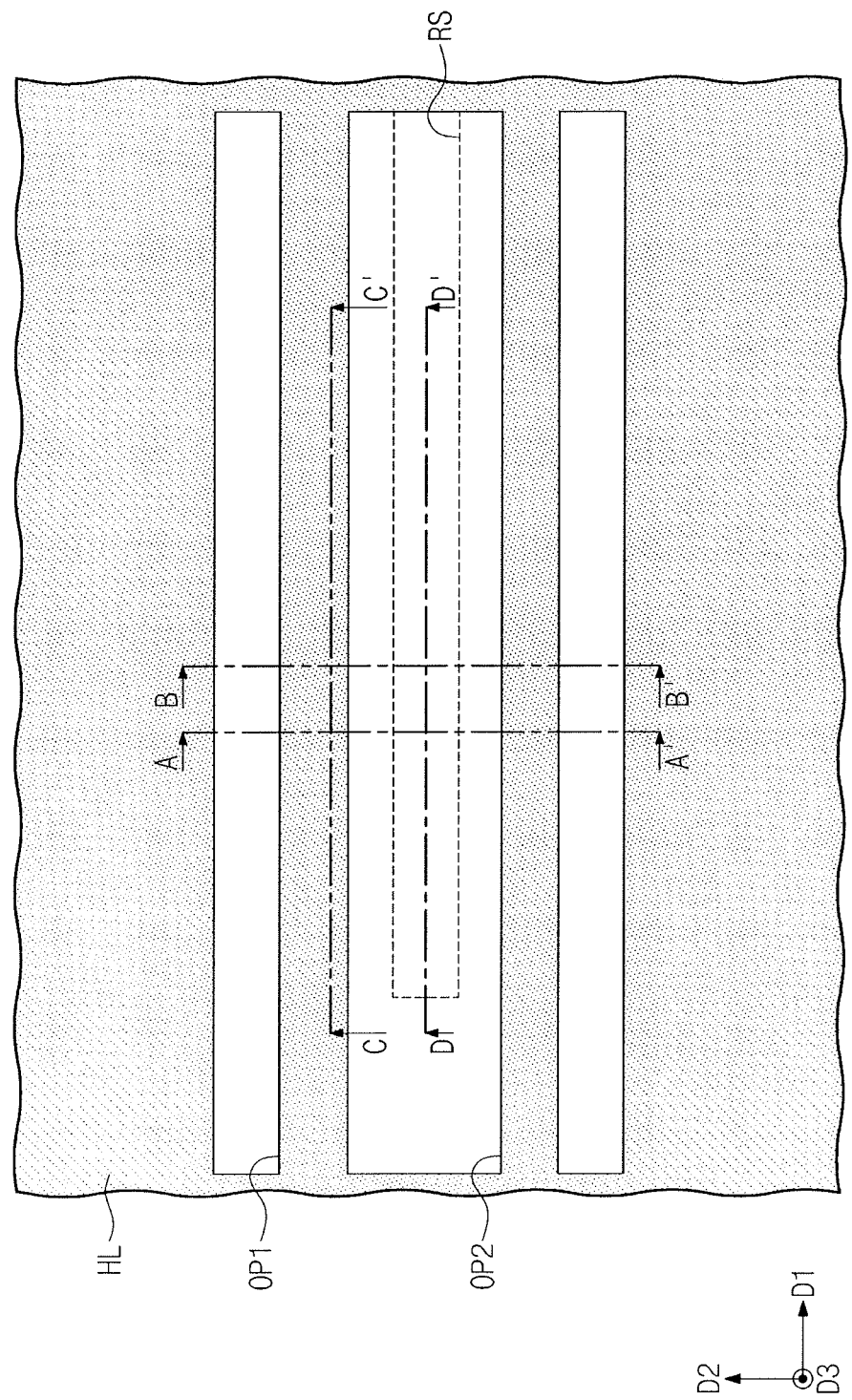
Figure 26A:
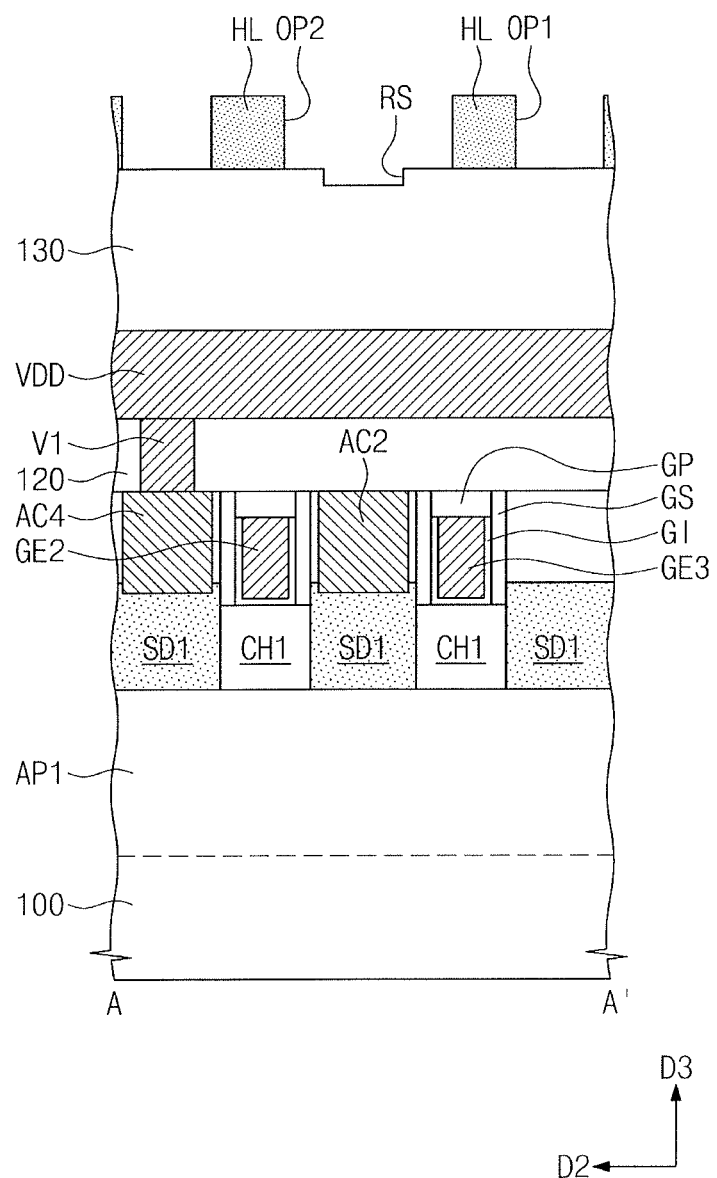
Figure 26B:
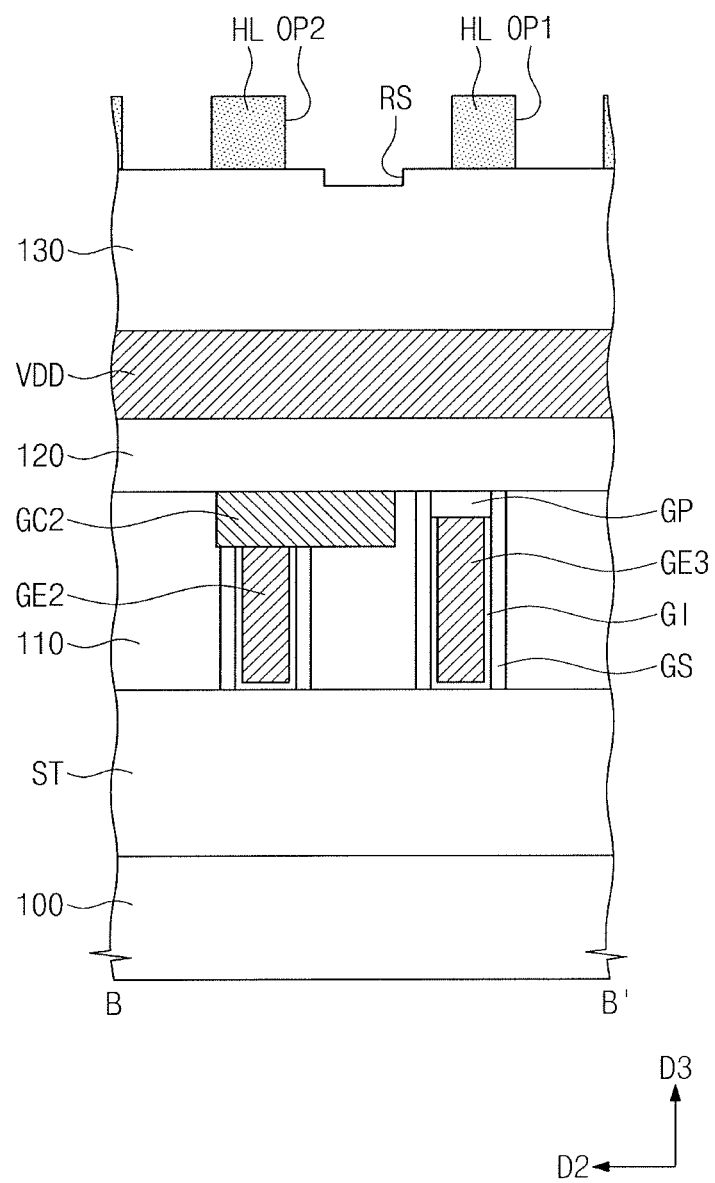
Figure 26C:
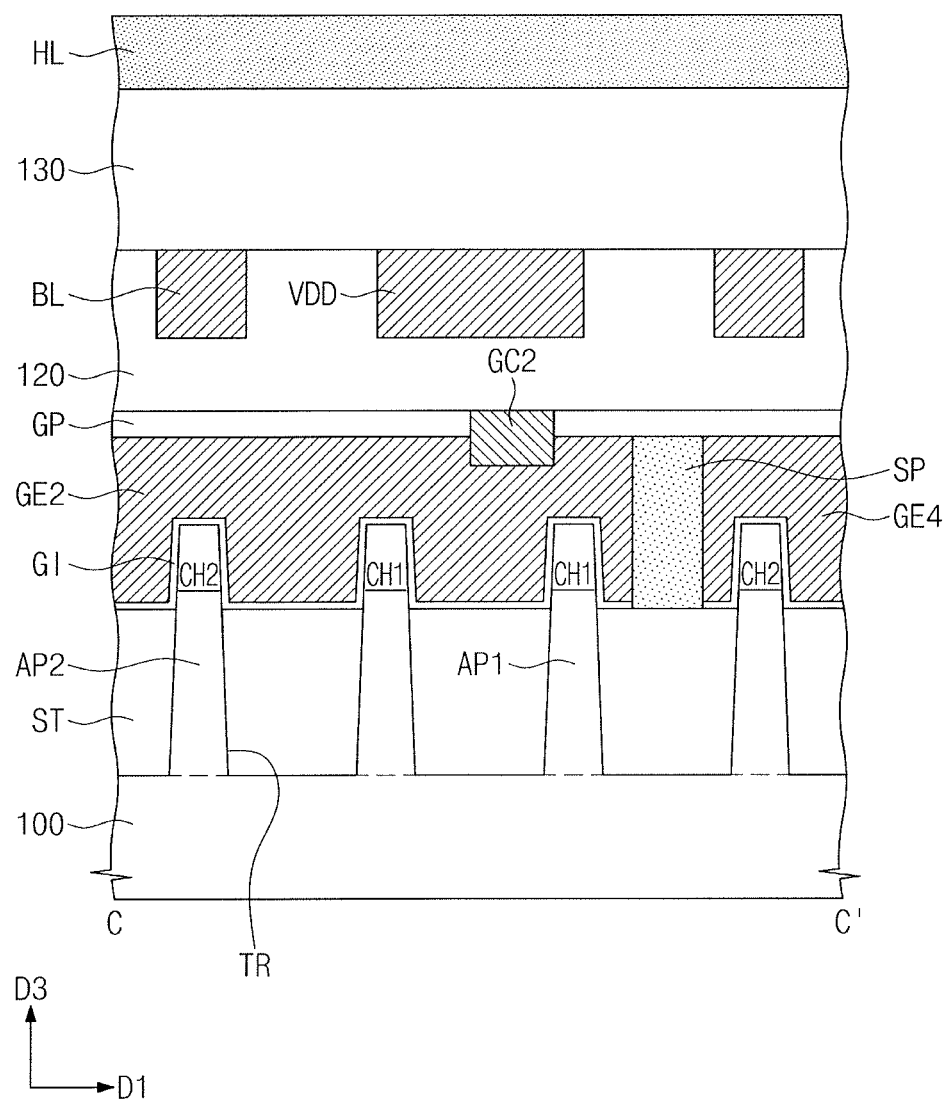
Figure 26D:
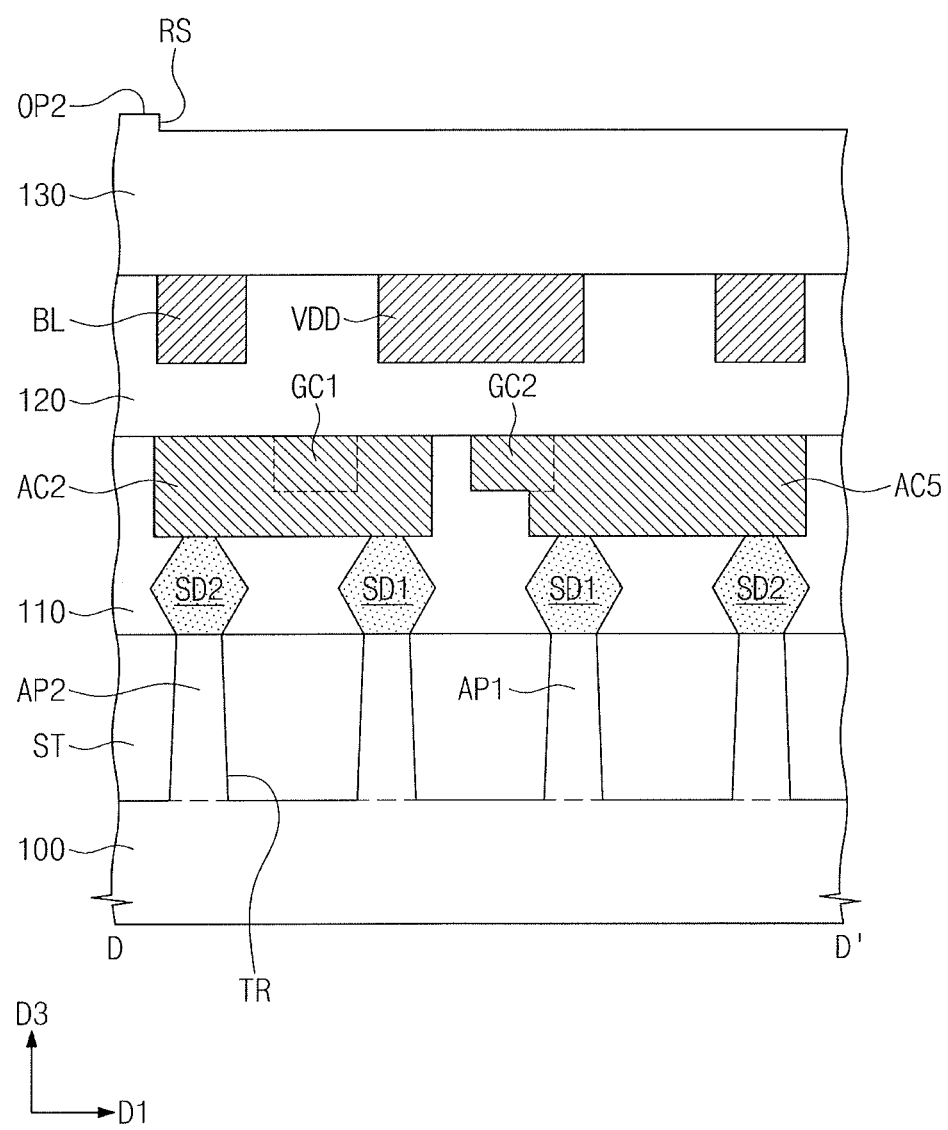

FIG. 12 is a plan view illustrating a layout according to another comparative example. Referring to FIG. 12, the fourth layout patterns LP4 may be omitted on the first region RG1. In other words, the fourth layout patterns LP4 may be disposed on only the second region RG2, while not in the first region RG1.

Uniformity of an image pattern density throughout the photomask may be an important process factor in the exposure and development processes described with reference to FIG. 9. If an image pattern does not exist on the first region RG1 of the fourth photomask like FIG. 12, the image patterns of the second region RG2 may be distorted on a substrate by a blank space of the first region RG1.

Referring again to FIG. 10, the second interconnection layout M2a according to the embodiments may include the fourth layout patterns LP4 uniformly disposed on the first and second regions RG1 and RG2. Thus, a blank space of an image pattern may be reduced or prevented on the first region RG1 of the fourth photomask. In other words, according to embodiments, the uniformity of the image pattern density of the fourth photomask may be improved to inhibit or prevent patterns from being distorted on a substrate.

FIGS. 13, 15, 17, 19, 21, 23 and 25 are plan views illustrating a method for manufacturing a semiconductor device, according to some embodiments. FIGS. 14A, 16A, 18A, 20A, 22A, 24A and 26A are cross-sectional views taken along lines A-A' of FIGS. 13, 15, 17, 19, 21, 23 and 25, respectively. FIGS. 14B, 16B, 18B, 20B, 22B, 24B and 26B are cross-sectional views taken along lines B-B' of FIGS. 13, 15, 17, 19, 21, 23 and 25, respectively. FIGS. 14C, 16C, 18C, 20C, 22C, 24C and 26C are cross-sectional views taken along lines C-C' of FIGS. 13, 15, 17, 19, 21, 23 and 25, respectively. FIGS. 14D, 16D, 18D, 20D, 22D, 24D and 26D are cross-sectional views taken along lines D-D' of FIGS. 13, 15, 17, 19, 21, 23 and 25, respectively.

Referring to FIGS. 13 and 14A to 14D, the memory transistors TU1, TD1, TU2, TD2, TA1 and TA2 may be formed on the first region RG1 of the substrate 100. The first interlayer insulating layer 110 may be formed to cover the memory transistors TU1, TD1, TU2, TD2, TA1 and TA2. The first to eighth active contacts AC1 to AC8 may be formed in the first interlayer insulating layer 110 so as to be connected to the first and second source/drain patterns SD1 and SD2. The first and second gate contacts GC1 and GC2 may be formed in the first interlayer insulating layer 110 so as to be connected to the third and second gate electrodes GE3 and GE2, respectively.

The second interlayer insulating layer 120 may be formed on the first interlayer insulating layer 110. The first interconnection lines M1 constituting the first interconnection layer may be formed in the second interlayer insulating layer 120. The first interconnection lines M1 may be formed by a damascene process that includes a process of forming first interconnection line holes in the second interlayer insulating layer 120 and a process of filling the first interconnection line holes with a conductive material.

The third interlayer insulating layer 130 may be formed on the second interlayer insulating layer 120. A hard mask layer HL may be formed on the third interlayer insulating layer 130. The hard mask layer HL may have an etch selectivity with respect to the third interlayer insulating layer 130. The hard mask layer HL may include an organic layer, an inorganic layer, or a double layer including the organic layer and the inorganic layer which are stacked. For example, the hard mask layer HL may include a silicon nitride layer.

Hereinafter, the components under the hard mask layer HL are omitted in the plan views of FIGS. 15, 17, 19, 21, 23 and 25 for the purpose of ease and convenience in illustration. Referring to FIGS. 15 and 16A to 16D, a first mold layer ML1 may be formed on the hard mask layer HL. For example, the first mold layer ML1 may include a spin-on-hardmask (SOH) layer, a spin-on-carbon (SOC) layer, or an amorphous carbon layer.

A first photoresist pattern PR1 having first openings OP1 may be formed on the first mold layer ML1. In more detail, the formation of the first photoresist pattern PR1 may include forming a first photoresist layer on the first mold layer ML1, and performing exposure and development processes on the first photoresist layer by using the first photomask described with reference to FIG. 10. Thus, the first openings OP1 of the first region RG1 are realized by the first layout patterns LP1 of the first region RG1.

Referring to FIGS. 17 and 18A to 18D, a first patterning process may be performed using the first photoresist pattern PR1 as an etch mask to form first openings OP1 in the hard mask layer HL. In more detail, the performing of the first patterning process may include patterning the first mold layer ML1 using the first photoresist pattern PR1 as an etch mask, and patterning the hard mask layer HL using the patterned first mold layer ML1 as an etch mask. Thus, planar shapes of the first openings OP1 formed by the first patterning process may be substantially the same as planar shapes of the first openings OP1 of the first photoresist pattern PR1 illustrated in FIG. 15. The first photoresist pattern PR1 and the first mold layer ML1 which remain after the first patterning process may be removed.

Referring to FIGS. 19 and 20A to 20D, a second mold layer ML2 may be formed to cover the hard mask layer HL. The second mold layer ML2 may include the same material as the first mold layer ML1 described above. A second photoresist pattern PR2 having a second opening OP2 may be formed on the second mold layer ML2. In more detail, the formation of the second photoresist pattern PR2 may include forming a second photoresist layer on the second mold layer ML2, and performing exposure and development processes on the second photoresist layer by using the second photomask described with reference to FIG. 10. Thus, the second opening OP2 of the first region RG1 is realized by the second layout pattern LP2 of the first region RG1.

Referring to FIGS. 21 and 22A to 22D, a second patterning process may be performed using the second photoresist pattern PR2 as an etch mask to additionally form a second opening OP2 in the hard mask layer HL. In more detail, the performing of the second patterning process may include patterning the second mold layer ML2 using the second photoresist pattern PR2 as an etch mask, and patterning the hard mask layer HL using the patterned second mold layer ML2 as an etch mask. Thus, a planar shape of the second opening OP2 formed by the second patterning process may be substantially the same as a planar shape of the second opening OP2 of the second photoresist pattern PR2 illustrated in FIG. 19. The second photoresist pattern PR2 and the second mold layer ML2 which remain after the second patterning process may be removed.

Referring to FIGS. 23 and 24A to 24D, a third mold layer ML3 may be formed to cover the hard mask layer HL. The third mold layer ML3 may include the same material as the first mold layer ML1 described above. A third photoresist pattern PR3 having a third opening OP3 may be formed on the third mold layer ML3. In more detail, the formation of the third photoresist pattern PR3 may include forming a third photoresist layer on the third mold layer ML3 and performing exposure and development processes on the third photoresist layer by using the fourth photomask described with reference to FIG. 10. Thus, the third opening OP3 of the first region RG1 is realized by the fourth layout pattern LP4 of the first region RG1.

As described above with reference to FIG. 10, the fourth layout pattern LP4 of the first region RG1 may overlap with the second layout pattern LP2 of the first region RG1. Thus, the third opening OP3 of the third photoresist pattern PR3 may vertically overlap with the second opening OP2 of the hard mask layer HL.

Alternatively, a photolithography process using the third photomask described with reference to FIG. 10 may be performed before the formation of the third mold layer ML3 and the third photoresist pattern PR3. Since the second interconnection lines M2 of the region 'M' of FIG. 1 do not include the second interconnection line M2 defined by the third layout pattern LP3 of FIG. 10, the photolithography process using the third photomask may be omitted.

Referring to FIGS. 25 and 26A to 26D, a third patterning process may be performed using the third photoresist pattern PR3 as an etch mask to form a recess region RS in an upper portion of the third interlayer insulating layer 130. The recess region RS may be formed in the second opening OP2 of the hard mask layer HL.

In more detail, in the third patterning process, an etching process may be performed on the third interlayer insulating layer 130 exposed in advance through the second opening OP2 of the hard mask layer HL. However, since the third interlayer insulating layer 130 has an etch selectivity with respect to the hard mask layer HL, the exposed region of the third interlayer insulating layer 130 may be lightly or slightly etched in the third patterning process. Thus, the recess region RS may be partially formed in the upper portion of the third interlayer insulating layer 130. A planar shape of the recess region RS formed by the third patterning process may be substantially the same as a planar shape of the third opening OP3 of the third photoresist pattern PR3. The third photoresist pattern PR3 and the third mold layer ML3 which remain after the third patterning process may be removed.

Referring again to FIGS. 4 and 5A to 5D, an upper portion of the third interlayer insulating layer 130 having the recess region RS may be etched using the hard mask layer HL having the first and second openings OP1 and OP2 as an etch mask. Thus, second interconnection line holes may be formed in the third interlayer insulating layer 130. The second interconnection line hole formed by etching the third interlayer insulating layer 130 through the second opening OP2 may have a recess region RS formed at a bottom thereof. The second interconnection lines M2 may be formed by filling the second interconnection line holes with a conductive material.

The word line WL may be formed by filling the second interconnection line hole formed through the second opening OP2 with the conductive material. The word line WL may include the body portion MP and the protrusion PP filling the recess region RS.

The semiconductor device and the method for manufacturing the same according to embodiments may reduce the area of the semiconductor device and may improve the integration density of the semiconductor device. In addition, it is possible to inhibit or prevent patterns from being distorted on a substrate. Embodiments may provide a method for manufacturing a semiconductor device, which is capable of reducing or minimizing a distortion problem of a pattern which may occur in exposure and development processes, and a semiconductor device manufactured thereby.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region and a second region;
memory transistors on the first region;
a first interconnection layer on the memory transistors and having first interconnection lines; and
a second interconnection layer on the first interconnection layer and having second interconnection lines,
wherein the second interconnection lines on the first region include:
a first line extending along a first direction and spaced from the second region by a first distance along the first direction, and
a second line extending along the first direction, spaced from the first line along a second direction intersecting the first direction, and having a width smaller along the second direction than a width of the first line,
wherein the first line includes a protrusion extending along a third direction, intersecting the first and second directions, toward the substrate, and
wherein the protrusion is spaced from the second region by a second distance along the first direction, the second distance being greater than the first distance.

2. The semiconductor device as claimed in claim 1, wherein:
the first line further includes a body portion on the protrusion, and
a sidewall of the first line has a stepped profile at a boundary between the protrusion and the body portion.

3. The semiconductor device as claimed in claim 1, wherein a width of the protrusion is substantially equal to the width of the second line.

4. The semiconductor device as claimed in claim 1, wherein a level of a bottom surface of the protrusion is higher than a level of top surfaces of the first interconnection lines.

5. The semiconductor device as claimed in claim 1, wherein a level of a bottom surface of the protrusion is lower than a level of a bottom surface of the second line.

6. The semiconductor device as claimed in claim 1, wherein the second interconnection lines further include a third line on the second region, wherein the third line is adjacent to an end of the first line and spaced apart from the protrusion by the second distance.

7. The semiconductor device as claimed in claim 6, wherein a distance between the third line and the end of the first line is smaller than a distance between the third line and an end of the protrusion.

8. The semiconductor device as claimed in claim 1, further comprising:
logic transistors on the second region.

9. The semiconductor device as claimed in claim 1, wherein the memory transistors include:
first and second access transistors;
first and second pull-up transistors; and
first and second pull-down transistors,
wherein the first interconnection lines include a bit line and a power line on the memory transistors, and
wherein the first line is a word line and the second line is a ground line.

10. A semiconductor device, comprising:
a substrate including a memory cell region and a logic cell region;
memory transistors on the memory cell region;
logic transistors on the logic cell region;
an interconnection layer including interconnection lines on the memory transistors and the logic transistors; and
an interlayer insulating layer on the memory transistors and the logic transistors,
wherein the interconnection lines include:
a word line on the memory transistors and extending in a first direction in an upper portion of the interlayer insulating layer; and
a conductive line on the logic transistors and extending in a second direction intersecting the first direction in the upper portion of the interlayer insulating layer,
wherein the word line includes a protrusion extending along a third direction, intersecting the first and second directions, toward the substrate, and
wherein a distance in the first direction between the conductive line and the word line is smaller than a distance in the first direction between the conductive line and the protrusion.

11. The semiconductor device as claimed in claim 10, wherein a level of a bottom surface of the protrusion is lower than a level of a bottom surface of the conductive line.

12. The semiconductor device as claimed in claim 10, wherein:
the word line further includes a body portion on the protrusion, and
a sidewall of the word line has a stepped profile at a boundary between the protrusion and the body portion.

13. The semiconductor device as claimed in claim 10, wherein a level of a bottom surface of the protrusion is higher than a level of a bottom surface of the interlayer insulating layer.

14. The semiconductor device as claimed in claim 10, wherein:
the interconnection lines further include a ground line on the memory transistors that extends in the first direction,
a width of the ground line is smaller than a width of the word line, and
a level of a bottom surface of the protrusion is lower than a level of a bottom surface of the ground line.

15. The semiconductor device as claimed in claim 10, wherein each of the memory and logic transistors includes:
an active pattern vertically protruding along the third direction from a device isolation layer on the substrate; and
a gate electrode intersecting the active pattern.

16. A semiconductor device, comprising:
a memory cell on a substrate;
an interlayer insulating layer on the memory cell; and
an interconnection layer including interconnection lines provided in an upper portion of the interlayer insulating layer,
wherein the memory cell includes:
first and second access transistors;
first and second pull-up transistors; and
first and second pull-down transistors,
wherein the interconnection lines include a first line and a second line extending along a first direction and spaced apart along a second direction intersecting the first direction, the second line having a width along the second direction smaller than a width of the first line,
wherein the first line includes a protrusion extending along a third direction, intersecting the first and second directions, toward the substrate,
wherein a level of a bottom surface of the protrusion is lower than a level of a bottom surface of the second line, and
wherein the level of the bottom surface of the protrusion is higher than a level of a bottom surface of the interlayer insulating layer.

17. The semiconductor device as claimed in claim 16, wherein:
the first line is electrically connected to gates of the first and second access transistors, and
the second line is electrically connected to source/drains of the first and second pull-down transistors.

18. The semiconductor device as claimed in claim 16, wherein:
the first line further includes a body portion on the protrusion,
a sidewall of the first line has a stepped profile at a boundary between the protrusion and the body portion, and
the body portion extends further in the first direction than the protrusion.

* * * * *